US006977549B2

(12) United States Patent
Tsuchi

(10) Patent No.: US 6,977,549 B2
(45) Date of Patent: Dec. 20, 2005

(54) DIFFERENTIAL CIRCUIT, AMPLIFIER CIRCUIT, DRIVER CIRCUIT AND DISPLAY DEVICE USING THOSE CIRCUITS

(75) Inventor: Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 390 days.

(21) Appl. No.: 10/370,602

(22) Filed: Feb. 24, 2003

(65) Prior Publication Data

US 2003/0160749 A1 Aug. 28, 2003

(30) Foreign Application Priority Data

Feb. 25, 2002 (JP) ............................ 2002-048381
Mar. 11, 2002 (JP) ............................ 2002-064912

(51) Int. Cl.[7] ................................................ H03F 3/45
(52) U.S. Cl. ...................... 330/257; 330/252; 330/253; 330/261; 330/288; 327/563
(58) Field of Search ............................... 330/252, 253, 330/257, 261, 288; 327/563, 594

(56) References Cited

U.S. PATENT DOCUMENTS 5,039,886 A * 8/1991 Nakamura et al. ............ 326/73
5,063,305 A * 11/1991 Minami et al. ............. 327/581
6,064,267 A * 5/2000 Lewyn ....................... 330/288
6,642,792 B2 * 11/2003 Takeuchi et al. ............ 330/257

FOREIGN PATENT DOCUMENTS

JP 50-97247 8/1975
JP 63-131707 6/1988
JP 2002-258821 9/2002

OTHER PUBLICATIONS

Japanese Office Action dated Mar. 29, 2005, with partial English translation.

* cited by examiner

*Primary Examiner*—Michael B. Shingleton
(74) *Attorney, Agent, or Firm*—McGinn IP Law Group, PLLC

(57) ABSTRACT

A differential circuit and an amplifier circuit for reducing an amplitude difference deviation, performing a full-range drive, and consuming less power are disclosed. The circuit includes a first pair of p-type transistors and a second pair of n-type transistors. A first current source and a first switch are connected in parallel between the sources of the first pair of transistors, which are tied together, and a power supply VDD. A second current source and a second switch are connected in parallel between the sources of the second pair of transistors, which are tied together, and a power supply VSS. The circuit further includes connection changeover means that performs the changeover of first and second pairs between a differential pair that receives differential input voltages and a current mirror pair that is the load of the differential pair. When one of the two pairs is the differential pair, the other is the current mirror pair. In a differential amplifier circuit, there is provided an added transistor connected in parallel to a transistor, which is one transistor of a differential pair transistors, whose control terminal is a non-inverting input terminal. The added transistor has a control terminal for receiving a control voltage which is set so that, when an input voltage applied to the non-inverting input terminal is in a range in which the transistor whose control terminal is the non-inverting input terminal is turned off, the added transistor is turned on.

36 Claims, 34 Drawing Sheets

FIG . 2

| | CONNECTION CHANGEOVER 1 | CONNECTION CHANGEOVER 2 |
|---|---|---|
| SWITCH 111, 112, 113, 116, 117 | ON | OFF |
| SWITCH 114, 115, 118, 119, 120 | OFF | ON |

VinP−VinM=Vgs103−Vgs104>0

VinP−VinM=Vgs101−Vgs102>0

FIG . 6

| | CONNECTION CHANGEOVER 1 | CONNECTION CHANGEOVER 2 |
|---|---|---|
| SWITCH 111, 112, 113, 116, 117 | ON | OFF |
| SWITCH 114, 115, 118, 119, 120 | OFF | ON |
| AMPLIFICATION STAGE 510 | ACTIVATED | STOPPED |
| AMPLIFICATION STAGE 520 | STOPPED | ACTIVATED |

MAXIMUM VALUE OF AMPLITUDE DIFFERENCE DEVIATION $= 2 \times |\Delta VL1 - \Delta VL2|$

※1) TIME SUFFICIENT FOR RESETTING OUTPUT OF DIFFERENTIAL STAGE

MAXIMUM VALUE OF AMPLITUDE DIFFERENCE DEVIATION $= 2 \times (\Delta VL1 + \Delta VL2)$ (VDD−BP>|Vth223|)

FIG. 24

| INPUT VOLTAGE LEVEL | HIGH VOLTAGE | | LOW VOLTAGE | |
|---|---|---|---|---|
| 1 DATA DRIVE PERIOD | FIRST DRIVE PERIOD | SECOND DRIVE PERIOD | FIRST DRIVE PERIOD | SECOND DRIVE PERIOD |
| SWITCH511,531,532 | OFF | ON | ON | OFF |
| SWITCH521,541,542 | ON | OFF | OFF | ON |

FIG . 25

| INPUT VOLTAGE LEVEL | HIGH VOLTAGE | | LOW VOLTAGE | |
|---|---|---|---|---|
| 1 DATA DRIVE PERIOD | FIRST DRIVE PERIOD | SECOND DRIVE PERIOD | FIRST DRIVE PERIOD | SECOND DRIVE PERIOD |
| SWITCH 511,531 | OFF | ON | ON | OFF |
| SWITCH 532 | OFF | ON | OFF | OFF |
| SWITCH 521,541 | ON | OFF | OFF | ON |
| SWITCH 542 | OFF | OFF | OFF | ON |

FIG . 31

| INPUT VOLTAGE LEVEL | HIGH VOLTAGE | | LOW VOLTAGE | |
|---|---|---|---|---|
| 1 DATA DRIVE PERIOD | FIRST DRIVE PERIOD | SECOND DRIVE PERIOD | FIRST DRIVE PERIOD | SECOND DRIVE PERIOD |
| SWITCH511,531,551,552,553 | OFF | ON | ON | OFF |
| SWITCH521,541,561,562,563 | ON | OFF | OFF | ON |

FIG . 32

| INPUT VOLTAGE LEVEL | HIGH VOLTAGE | | LOW VOLTAGE | |
|---|---|---|---|---|
| 1 DATA DRIVE PERIOD | FIRST DRIVE PERIOD | SECOND DRIVE PERIOD | FIRST DRIVE PERIOD | SECOND DRIVE PERIOD |
| SWITCH 511,531 | OFF | ON | ON | OFF |
| SWITCH 551,552,553 | OFF | ON | OFF | OFF |
| SWITCH 521,541 | ON | OFF | OFF | ON |
| SWITCH 561,562,563 | OFF | OFF | OFF | ON |

DIFFERENTIAL CIRCUIT, AMPLIFIER CIRCUIT, DRIVER CIRCUIT AND DISPLAY DEVICE USING THOSE CIRCUITS

FIELD OF THE INVENTION

The present invention relates to a differential circuit, an amplifier circuit, a driver circuit and a display device using the circuit.

BACKGROUND OF THE INVENTION

A driver circuit is known that performs drive by changing over between a charging amplifier and a discharging amplifier for the full range drive on the high-potential side and the low-potential side. However, this type of driver circuit, if used in the driver circuit of a liquid crystal display device, would generate an output deviation in the output of each of the two amplifiers because of variations in the transistor characteristic. This increases the variation (termed as amplitude difference deviation) among outputs as to the voltage amplitude difference between the positive and negative polarities for the same grayscale level, sometimes resulting in degraded image quality. The amplitude difference deviation, one of performance characteristic of a multiple-output liquid crystal driver circuit, means a deviation in the outputs of the voltage amplitude difference in the positive polarity and the negative polarity at the same grayscale level. The smaller the amplitude difference deviation between the outputs is, the better the image quality is. The following describes a conventional driver circuit with the configuration in which drive is performed by changing over the two amplifiers, that is, a charging amplifier and a discharging amplifier.

FIG. 15 is a diagram showing an example of the circuit configuration of a conventional driver circuit with two amplifier circuits: a charging amplifier and a discharging amplifier. That is, FIG. 15 shows a driver circuit composed of a voltage follower circuit 910 and a voltage follower circuit 920.

The voltage follower circuit 910 comprises n-channel transistors 913 and 914 and p-channel transistors 911 and 912. The n-channel transistors 913 and 914, have their sources coupled together and connected to the low-potential power supply (ground potential) VSS via a constant-current source 915 and a switch 951, and have gates for differentially receiving the input terminal voltage Vin and output terminal voltage Vout respectively to compose a differential pair. The p-channel transistors 911 and 912 have their sources connected to the high-potential power supply VDD, have their gates connected each other, and have their drains connected respectively to the drains of the n-channel transistors 913 and 914. The drain and the gate of the p-channel transistor 912 are connected each other. The p-channel transistors 911 and 912 compose a current mirror circuit and function as the active load of the differential pair. The voltage follower circuit 910 further comprises a p-channel transistor 916. The gate of the p-channel transistor 916 is connected to the connection point (output end of differential pair) between the drain of the p-channel transistor 911 and the drain of the n-channel transistor 913, and the source is connected to the high-potential power supply VDD via a switch 952. A constant-current source 917 and a switch 953 are connected in series between the connection point, which are between the drain of the p-channel transistor 916 and the output terminal, and the low-potential power supply VSS.

The voltage follower circuit 920 comprises p-channel transistors 923 and 924 and n-channel transistors 921 and 922. The p-channel transistors 923 and 924, have their sources coupled together and connected to the high-potential power supply VDD via a constant-current source 925 and a switch 961, and have gates for differentially receiving the input terminal voltage Vin and output terminal voltage Vout respectively to compose differential pair. The n-channel transistors 921 and 922 have their sources connected to the low-potential power supply VSS, have their gates connected each other, and have their drains connected respectively to the drains of the p-channel transistors 923 and 924. The drain and the gate of the n-channel transistor 922 are connected each other. The n-channel transistors 921 and 922 compose a current mirror circuit and function as the active load of the differential pair. The voltage follower circuit 920 further comprises an n-channel transistor 926 which has a gate connected to a connection node at which the drain of the n-channel transistor 921 and the drain of the p-channel transistor 923 are connected, and a source connected to the low-potential power supply VSS via a switch 962. A constant-current source 927 and a switch 963 are connected in series between a connection node at which the drain of the n-channel transistor 926 and the output terminal are connected, and the high-potential power supply VDD.

Each of the circuits 910 and 920 composes a voltage follower circuit, wherein the input terminal voltage Vin is supplied to the non-inverting input terminal (gates of transistors 913 and 923) of the differential circuit and the output terminal voltage Vout is supplied to the inverting input terminal (gates of transistors 914 and 924) of the differential circuit.

The switches 951, 952, and 953 and the switches 961, 962, and 963 in the voltage follower circuits 910 and 920 are switches controlling the operation of the voltage follower circuits 910 and 920.

In the voltage follower circuit 910, although the output terminal Vout is discharged by the current source 917 at a constant discharging rate, the output terminal Vout may be charged speedily by the p-channel transistor 916.

On the other hand, in the voltage follower circuit 920, although the output terminal Vout is charged by the current source 927 at a constant discharging rate, the output terminal Vout may be discharged speedily by the n-channel transistor 926.

Therefore, to drive the load connected to the output terminal of the driver circuit to a high potential level with respect to the reference level, the switches 951, 952, and 953 are turned on to activate (operate) the voltage follower circuit 910. To drive the load to the low potential level with respect to the reference level, the switches 961, 962, and 963 are turned on to activate (operate) the voltage follower circuit 920 to perform high-speed drive.

In addition, because the voltage follower circuits 910 and 920 do not operate at the input voltage Vin that turns off the transistors 913 and 923, each of these circuits does not perform full-range drive (all region drive within power supply voltage range) by it self. Therefore, the two voltage follower circuits 910 and 920 are changed over for drive in order to perform full range drive.

However, the two voltage follower circuits 910 and 920 each have an output offset generated by variations in the device characteristic ascribable to fabrication process of the device.

A major cause of the output offset is generated in many cases by the variations in the characteristic of the paired transistors in the differential pair, or in the current mirror circuit included in the differential circuit which composes the voltage follower circuit.

Because variations in the transistor characteristic are generated arbitrarily, the output offsets of the two voltage follower circuits 910 and 920 are generated individually. Therefore, the problem is that, when the two-voltage follower circuits 910 and 920 are changed over to perform drive, the offset of the driver circuit in FIG. 15 varies greatly.

In particular, for a grayscale level voltage amplifier circuit in a liquid crystal device, it is important to keep constant the grayscale level voltage interval, determined according to the characteristic of liquid crystal, for performing a grayscale level display. It is therefore required for the amplifier circuit (driver circuit) that the output offset not be changed depending upon the grayscale level, that is, the deviation in the output offset among grayscale levels be sufficiently small.

However, when the driver circuit shown in FIG. 15 is used as the amplifier circuit for amplifying the grayscale level voltage of a liquid crystal display device, the problem is that, when the two voltage follower circuits 910 and 920 are changed over for drive, the output offset varies greatly with the result that the grayscale level voltage interval cannot be kept constant.

The problem described above is described more in detail with reference to FIG. 16. FIG. 16 is a diagram showing, with respect to the reference level, the expected values and the output values, including the offset, of a high level VL1 on a high-potential side and a low level VL2 on a low-potential side when they are driven by the driver circuit shown in FIG. 15. It is assumed that the high level VL1 is driven by the voltage follower circuit 910, and the low level VL2 by the voltage follower circuit 920, with the offsets being ±ΔVL1 and +ΔVL2, respectively. Whether or not the grayscale level voltage interval is kept constant is determined by whether or not the amplitude difference deviation in two grayscale levels is sufficiently small.

FIG. 16 shows that, for the amplitude difference deviation of two voltage levels VL1 and VL2, the maximum amplitude difference is $$\{(VL1+\Delta VL1)-(VL2-\Delta VL2)\} \quad (1)$$

and the minimum amplitude difference is $$\{(VL1-\Delta VL1)-(VL2+\Delta VL2)\} \quad (2).$$

Therefore, as the maximum value of the amplitude difference deviation which is given by the difference between the difference between expression (1) and expression (2), we have a following expression (3):

$$\{2\times(\Delta VL1+\Delta VL2)\} \quad (3)$$

That is, the amplitude difference deviation, which will be generated when the driver circuit in FIG. 15 is driven by changing over the two voltage follower circuits 910 and 920, may take a value that is twice the sum of the offset absolute values of the voltage follower circuits.

As mentioned in the above, the voltage follower circuits 910 and 920 shown in FIG. 15 do not operate at an input terminal voltage Vin that turns off the transistors 913 and 923 respectively. That is, the voltage-follower circuit 910 cannot drive a voltage in the vicinity of the low-potential power supply VSS, while the voltage follower circuit 920 cannot drive a voltage in the vicinity of the high-potential power supply VDD.

A full-range drive (the voltage is driven in all regions of power supply voltage range) is possible in the driver circuit in FIG. 15 by changing over between the voltage-follower circuits 910 and 920. However, a high-speed drive cannot be performed in the vicinity of the low-potential power supply VSS because the charge operation is performed by the current source 927, nor in the vicinity of the high-potential power supply VDD because the discharge operation is performed by the current source 917.

That is, the driver circuit shown in FIG. 15 cannot speedily drive a voltage within the power supply voltage range in an arbitrary order. In the configuration described above in which two conventional voltage follower circuits with different polarities are combined, a voltage in the vicinity of the power supply voltage (charge in the vicinity of VSS, discharge in the vicinity of VDD) cannot be driven speedily even if the two circuits are changed over for drive. Therefore, a voltage cannot be speedily driven in an arbitrary order.

FIG. 34 shows the configuration disclosed in Japanese Patent Publication Kokai JP-A-63-131707. This conventional circuit has the following configuration. In parallel to one transistor 1016 of paired transistors composing a differential pair used in the output stage of the amplifier, another MOS transistor 1034 is provided. A predetermined bias voltage BIAS2 is applied to the gate terminal of this MOS transistor 1034 to prevent the ionization of collision in the differential pair. The sources of the NMOS transistors 1014 and 1016, which form the differential pair, are coupled together and are connected to a current source 1020, the drain of the NMOS transistor 1014, which is one of transistors of the differential pair, is connected to the drain of a PMOS transistor 1010 in the output side of a current mirror circuit, and the drain of the NMOS transistor 1016 is connected to the drain of a PMOS transistor 1012 (the drain and the gate, which are connected, are connected to the gate of the PMOS transistor 1010) in the input side of the current mirror circuit. The drain of a transistor 1022, whose gate is connected to the connection point between the drain of the transistor 1010 and the drain of the transistor 1014, is connected to an output terminal, and the source of a transistor 1026, whose gate receives the output of an OP (Operational) amplifier 1040, is connected to the output terminal. The source of a transistor 1024, whose gate receives the output of the OP amplifier 1040, is connected to the gate of the transistor 1014. The transistors 1024 and 1026 form a source-follower. The input terminal voltage Vin is sent to a non-inverting input terminal (+) of the OP amplifier 1040, while the output terminal voltage Vout is sent to an inverting input terminal (−).

As the input terminal voltage Vin decreases, the output terminal voltage Vout also decreases. At this time, to prevent the ionization by collision from being caused by a high drain-gate voltage generated because the transistors 1014 and 1016 are turned off, the transistor 1034 is provided in parallel to the transistor 1016 whose gate is connected to the output terminal. This configuration allows the current to flow through the transistors 1012, 1034, 1020, and 1018 even if the transistors 1014 and 1016 are off to keep the drain-source voltage of the transistors 1014 and 1016 within a predetermined range.

The circuit shown in FIG. 34, which is configured by adding a transistor to the inverting input terminal side where the output voltage of the differential pair is received, is completely different from the circuit according to the present invention in the configuration and effect as will be described later. For example, the additional transistor 1034, if provided in the input side in the circuit shown in FIG. 34, would affect the operation of the amplifier. This requires the additional transistor 1034 to be provided in the inverting input terminal side (side connected to the output terminal voltage).

SUMMARY OF THE DISCLOSURE

Accordingly, it is an object of the present invention to provide a differential circuit and an amplifier circuit capable of performing full range drive and reducing power consumption while reducing an amplitude difference deviation.

Another object of the present invention is to provide a good quality display device by using the above-described circuit in the data line drive circuit of a display device.

Another object of the present invention is to provide a circuit that extends the input voltage range by increasing the output voltage at least to a predetermined level when the input voltage of the differential stage is low.

It is a still another object of the present invention is to provide a circuit that extends the input voltage range by decreasing the output voltage at least to a predetermined level when the input voltage of the differential stage is high.

A further object of the present invention is to provide a circuit and a display device that, in a driver circuit that outputs multiple-level voltages, drive any level voltage within the power voltage range speedily and in an arbitrary order.

A further object of the present invention is to provide a circuit and a display device that solve the above problems and consume less power in a simple circuit configuration.

At least one of the above and other objects is attained by a differential circuit in accordance with the present invention comprising:

a first pair of transistors, conductivity thereof being a first-type;

a second pair of transistors, conductivity thereof being a second-type, outputs of said first pair of transistors connected respectively to outputs of said second pair of transistors;

a first current source and a first switch, connected in parallel between commonly connected tails of said first pair of transistors and a first power supply;

a second current source and a second switch, connected in parallel between commonly connected tails of said second pair of transistors and a second power supply; and connection changeover means for changing over the first and second pairs of transistors between a differential pair driven by a current source and having a pair of inputs for receiving differential input voltages and a current mirror circuit having a pair of inputs coupled together, one transistor of said current mirror circuit being diode-connected, said current mirror circuit functioning as a load of said differential pair, wherein, when one pair of said first and second pairs of transistors is the differential pair, the other pair is the current mirror circuit.

A differential circuit in accordance with another aspect of the present invention comprises: a first pair of transistors, conductivity thereof being a first-type;

a second pair of transistors, conductivity thereof being a second-type, drains of said first pair of transistors connected to drains of said second type of transistors respectively;

a first current source and a first switch, connected in parallel between commonly coupled sources of said first pair of transistors, and a first power supply; and a second current source and a second switch, connected in parallel between commonly coupled sources of said second pair of transistors, and a second power supply;

wherein said differential circuit takes either a first connection configuration in which said first pair of transistors compose a differential pair, having commonly coupled sources connected to said first power supply via said first current source and gates for receiving differential input voltages and in which said second pair of transistors compose a current mirror circuit, wherein said second pair of transistors have gates connected each other, and commonly coupled sources connected to said second power supply via said second switch, and a gate and a drain of one of said second pair of transistors are coupled together, or a second connection configuration in which said second pair of transistors compose a differential pair, having commonly coupled sources connected to said second power supply via said second current source and gates for receiving differential input voltages and in which said first pair of transistors compose a current mirror circuit, wherein said first pair of transistors have gates connected each other, and commonly coupled sources connected to said first power supply via said first switch, and a gate and a drain of one of said first pair of transistors are coupled together;

said differential circuit further comprising connection changeover means for controlling changeover from said first connection configuration to said second connection configuration and from said second connection configuration to said first connection configuration.

In the differential circuit in accordance with the present invention, the first transistor pair is a p-channel transistor pair, the second transistor pair is an n-channel transistor pair, the first power supply is a high-potential power supply, and the second power supply is a low-potential power supply, and the connection changeover means controls changeover so that the n-channel transistor pair is the differential pair and the p-channel transistor pair is the current mirror circuit at high-potential voltage drive time and so that the p-channel transistor pair is the differential pair and the n-channel transistor pair is the current mirror circuit at low-potential voltage drive time.

An amplifier circuit, in accordance with another aspect of the present invention, comprises the differential circuit in accordance with the present invention described above; a charging amplification stage that charges an output terminal in response to an output signal from the differential circuit; and a discharging amplification stage that discharges the output terminal in response to the output signal from the differential circuit, wherein the output terminal is fed back to the inverting input terminal of differential input terminals of the differential circuit.

An amplifier circuit in accordance with another aspect of the present invention comprises the differential circuit in accordance with the present invention, wherein the differential circuit differentially receives an input terminal voltage and an output terminal voltage; a charging circuit that charges the output terminal based on an output signal of the differential circuit; a follower-type discharging circuit comprising first bias control means for controlling an output bias voltage in response to the input terminal voltage; and a follower transistor that is connected between the output terminal and a second power supply, which is a low-potential power supply, and that receives a bias voltage output from the first bias control means, wherein the follower-type discharging circuit discharges the output terminal by a follower operation of an active device according to a voltage difference between the input terminal voltage and the output terminal voltage; a discharging circuit that discharges the output terminal based on the output signal of the differential circuit; and a follower-type charging circuit comprising second bias control means for controlling an output bias voltage in response to the input terminal voltage; and a follower transistor connected between a first power supply, which is a high-potential power supply, and the output terminal, and that receives a bias voltage of the second bias control means, wherein the follower-type charging circuit charges the output terminal by a follower operation of an active device according to a voltage difference between the input terminal voltage and the output terminal voltage.

A display device in accordance with another aspect of the present invention that solves at least one of the above problems or other problems comprises an amplifier circuit as the driver circuit of data lines, wherein the amplifier circuit comprises the differential circuit according to the present invention that receives an input terminal voltage and an output terminal voltage; and amplification stages that control the charging and discharging of the output terminal.

At least one of the above and other objects is attained by a differential amplifier circuit in accordance with one aspect of the present invention, including: a differential pair, comprising a pair of transistors, said differential pair having a non-inverting input terminal and an inverting input terminal for differentially receiving input signal voltages; and an amplification stage, receiving an output from said differential pair and having an output terminal for outputting an output signal, said differential amplifier circuit further comprising:

a transistor connected in parallel to one of said pair of transistors composing said differential pair, said transistor having a control terminal for receiving a control voltage, said one of said pair of transistors having a control terminal connected to said non-inverting input terminal.

In accordance with the present invention, a voltage value of the control voltage is set in such a way that, when the transistor whose control terminal is connected to the non-inverting input terminal is turned off by a signal voltage received by the non-inverting input terminal, the transistor whose control terminal receives the control voltage is turned on. The control voltage is a value satisfying that a difference between a power supply voltage of a side, to which a constant current source driving the differential pair is connected, and the control voltage is higher than a threshold voltage value that turns on the transistor that receives the control voltage. In accordance with the present invention, the transistor that receives the control voltage has the same type of conductivity as that of the pair transistors forming the differential pair.

In accordance with the present invention, the output signal of the output stage is supplied to the inverting input terminal. In accordance with the present invention, the output stage comprises a circuit, which receives a voltage at a connection point between an output of the transistor, whose control terminal is connected to the non-inverting input terminal, and a load of the differential pair as an output of the differential pair and then charges or discharges the output terminal based on the voltage at the connection point for outputting a voltage in reversed phase with the voltage at the connection point from the output terminal.

A driver circuit in accordance with another aspect of the present invention comprises: a first differential amplifier circuit comprising:

a first differential circuit including a first differential pair, driven by a first constant-current source connected to a low-potential power supply and having a non-inverting input terminal and an inverting input terminal for differentially receiving input signal voltages; and a first amplification stage receiving an output from said first differential circuit to output an output signal from an output terminal, said first differential circuit further including a transistor, of first-type conductivity, which is connected in parallel to a transistor of first-type conductivity having a control terminal forming the non-inverting input terminal of said first differential circuit, and whose control terminal receives a first control voltage; and a second differential amplifier circuit comprising:

a second differential circuit including a second differential pair driven by a second constant-current source connected to a high-potential power supply and having a non-inverting input terminal and an inverting input terminal for differentially receiving input signal voltages; and a second amplification stage receiving an output from said second differential circuit to output an output signal from an output terminal, said second differential circuit further including a transistor, of second type conductivity, which is connected in parallel to a transistor of second type conductivity having a control terminal forming the non-inverting input terminal of said second differential circuit, and whose control terminal receives a second control voltage;

wherein the non-inverting input terminals of said first differential circuit and said second differential circuit are connected to a common input terminal, the output terminals of said first amplification stage and said second amplification stage are connected to a common output terminal, and the inverting input terminals of said first differential circuit and said second differential circuit are connected to said common output terminal;

wherein, when one of said first differential circuit and second differential circuit and one of said first amplification stage and said second amplification stage are active respectively, another differential circuit and another amplification stage are inactive; and wherein, for a voltage range in which the transistor of said first or second differential pair whose control terminal is connected to said non-inverting input terminal is turned off by an input voltage sent to said common input terminal, the first or second control voltage is set in such a way that said transistor whose control terminal receives said first or second control voltage is turned on, respectively.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 is a diagram showing connection changeover control in the first embodiment of the present invention.

FIG. 6 is a diagram showing connection changeover control in the third embodiment of the present invention.

FIG. 24 is a diagram showing an example of on/off control of the switches in the seventh embodiment of the present invention.

FIG. 25 is a diagram showing another example of on/off control of the switches in the seventh embodiment of the present invention.

FIG. 31 is a diagram showing an example of on/off control of the switches in the eighth embodiment of the present invention.

FIG. 32 is a diagram showing another example of on/off control of the switches in the eighth embodiment of the-present invention.

PREFERRED EMBODIMENTS OF THE INVENTION

Figure 1:
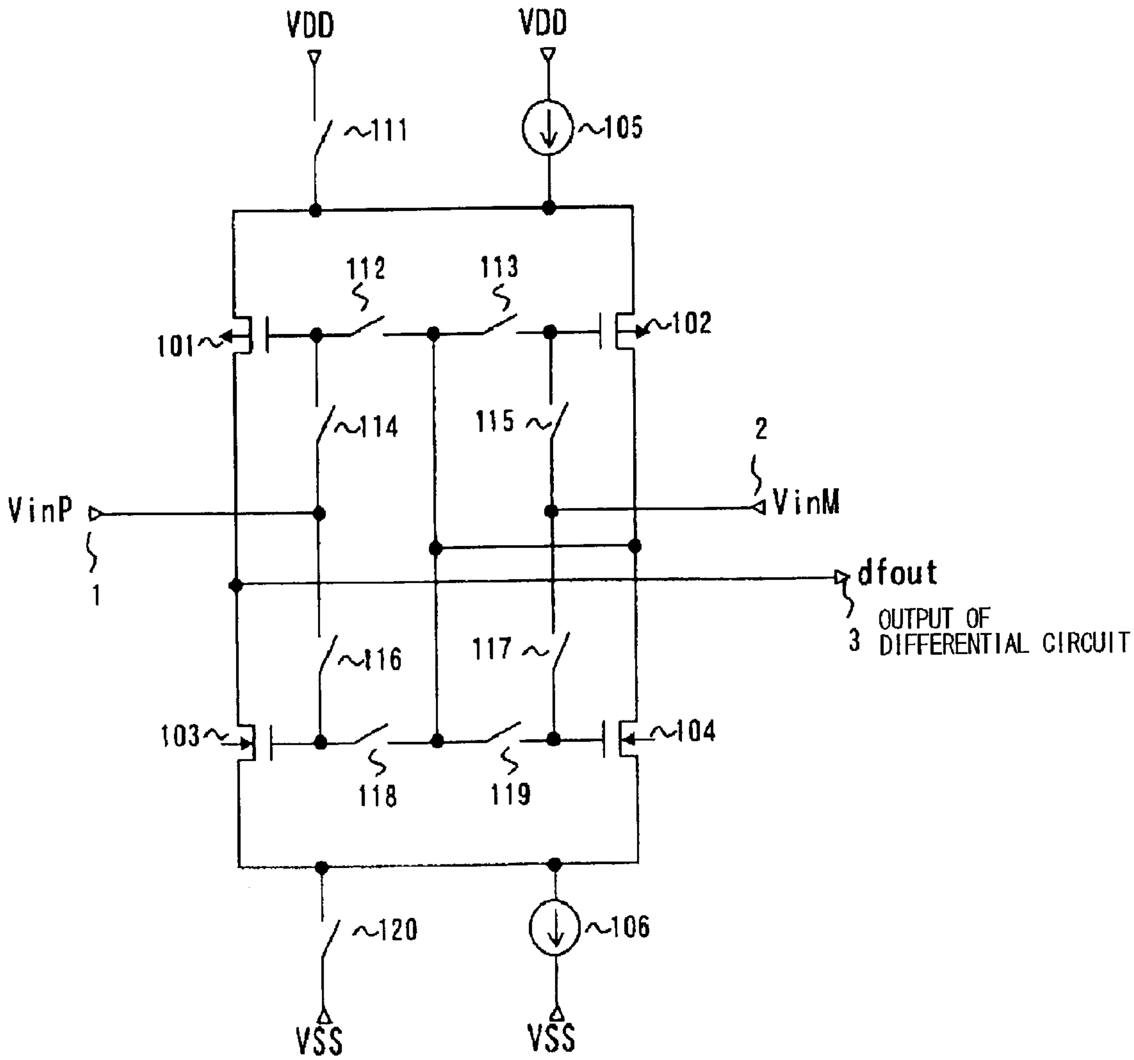
FIG. 1 is a diagram showing the configuration of a first embodiment of the present invention.

Some embodiments of the present invention will be described. A differential circuit in accordance with the present invention comprises a first pair of transistors (101 and 102); a second pair of transistors (103, 104), conductivity thereof being different from that of the first pair, wherein outputs of the first pair of transistors (101 and 102) are connected to outputs pair of the second pair of transistors (103 and 104), a current source (105) and a switch (111) are connected in parallel between a commonly coupled tails of the first pair of transistors (101, 102) and a first power supply (VDD), and a current source (106) and a switch (120) are connected in parallel between commonly coupled tails of the second transistor pair (103 and 104) and a second power supply (VSS); and means (112–119) for changing over the first and second pairs of transistors between a differential pair that receives differential input voltages from an input pair and a current mirror circuit in which inputs of the pair are connected, one transistor of which is diode-connected, and which functions as a load of the differential pair, wherein, when one of the first and second transistor pairs is the differential circuit, the other transistor pair is the current mirror circuit.

Not only may the above circuit configuration be fabricated on CMOS process technology but also be applied to a bipolar transistor. For an amplifier circuit used as the driver circuit of a liquid crystal display device, the MOS transistor may also be composed of a polysilicon thin film transistor (Poly-Si TFT). A poly-Si TFT has high field effect mobility, and the peripheral circuit may be integrated on a substrate. In the differential circuit with the configuration described above, the output pair of the transistor is a drain pair when the transistor is a MOS transistor, and a collector pair when the transistor is a bipolar transistor. The input pair of the transistor pair is a gate pair when the transistor is a MOS transistor, and a base pair when the transistor is a bipolar transistor. In addition, in case of MOS transistors, the common tail of the transistor pair is the sources of the transistor pair which are tied together; in case of bipolar transistors, the common tail of the transistor pair is the emitters of the transistor pair which are tied together.

In accordance with one preferred embodiment of the present invention, the differential circuit comprises a pair of n-channel transistors and a pair of p-channel transistors, which are changed over by connection changeover means between the differential pair and the current mirror pair, wherein, when one of the pairs is the differential pair, the other is the current mirror pair. The transistor pair of each conductivity (polarity), either n-channel or p-channel, is composed of the same-polarity transistors whose sources are tied together, and the current source and the switch are connected in parallel between the common connection node and the power supply. In an amplifier circuit using the differential circuit described above, the changeover performed by the connection changeover means is controlled so that the n-channel transistor pair is the differential pair at high-potential voltage drive time and so that the p-channel transistor pair is the differential pair at low-potential voltage drive time.

According to the differential circuit of the present invention, even if a changeover is made between the differential circuit composed of an n-channel differential pair and the differential circuit composed of a p-channel differential pair, the variations in VinP and VinM (positive side, negative side) caused by variations in device characteristic may be set in the same direction in the stable state. This allows the direction of output offsets caused by variations in the device characteristic to be set in the same direction to reduce the amplitude difference deviation. This differential circuit also makes a full-range output possible and consumes less power. The amplitude difference deviation, one of performance indexes of a multiple-output liquid crystal display device, means a deviation in the output of the voltage amplitude differences between the positive polarity and negative polarity in the same grayscale level. The smaller the amplitude difference deviation is, the higher the image quality is.

A differential circuit in accordance with the present invention preferably comprises p-channel-type first and second transistors (101 and 102) whose sources are tied together; and n-channel-type third and fourth transistors (103 and 104) whose drains are connected to drains of the p-channel-type transistor pair and whose sources are tied together. A first switch (111) and a first current source (105) are connected in parallel between the sources of the first and second transistors (101 and 102), which are tied together, and a first power supply (VDD), and a second switch (120) and a second current source (106) connected in parallel between the sources of the third and fourth transistors (103 and 104), which are tied together, and a second power supply (VSS). The circuit further comprises third and fourth switches (112 and 113) connected in series between gates of the first and second transistors (101 and 102); and fifth and sixth switches (118 and 119) connected in series between gates of the third and fourth transistors (103 and 104). The circuit further comprises a seventh switch (114) inserted between a connection node, at which the gate of the first transistor (101) and the third switch (112) are connected in common, and a first input terminal (1). The circuit further comprises an eighth switch (115) inserted between a connection node, at which the gate of the second transistor (102) and the fourth switch (113) are connected in common, and a second input terminal (2). The circuit further comprises a ninth switch (116) inserted between a connection node, at which the gate of the third transistor (103) and the fifth switch (118) are connected in common, and the first input terminal (1). The circuit further comprises a tenth switch (117) inserted between a connection node, at which the gate of the fourth transistor (104) and the sixth switch (119) are connected in common, and the second input terminal (2). A connection node connecting the third switch and the fourth switch (112 and 113) is connected to a connection node connecting the fifth switch and the sixth switch (118 and 119) and the common connection node thereof is connected to a connection node connecting the drain of the second transistor and the drain of the fourth transistor (102 and 104). A connection node connecting the drain of the first transistor and the drain of the third transistor (101 and 103) is connected to an output terminal.

In the differential circuit in accordance with the present invention, a changeover is made between a first connection state and a second connection state wherein the first, third, fourth, ninth, and tenth switches (111, 112, 113, 116, and 117) are conductive(in an on state) and the second, fifth, sixth, seventh, and eighth switches (120, 118, 119, 114, and 115) are nonconductive(in an off state) in the first connection state and wherein the first, third, fourth, ninth, and tenth switches (111, 112, 113, 116, and 117) are nonconductive and the second, fifth, sixth, seventh, and eighth switches (120, 118, 119, 114, and 115) are conductive.

Figure 4:
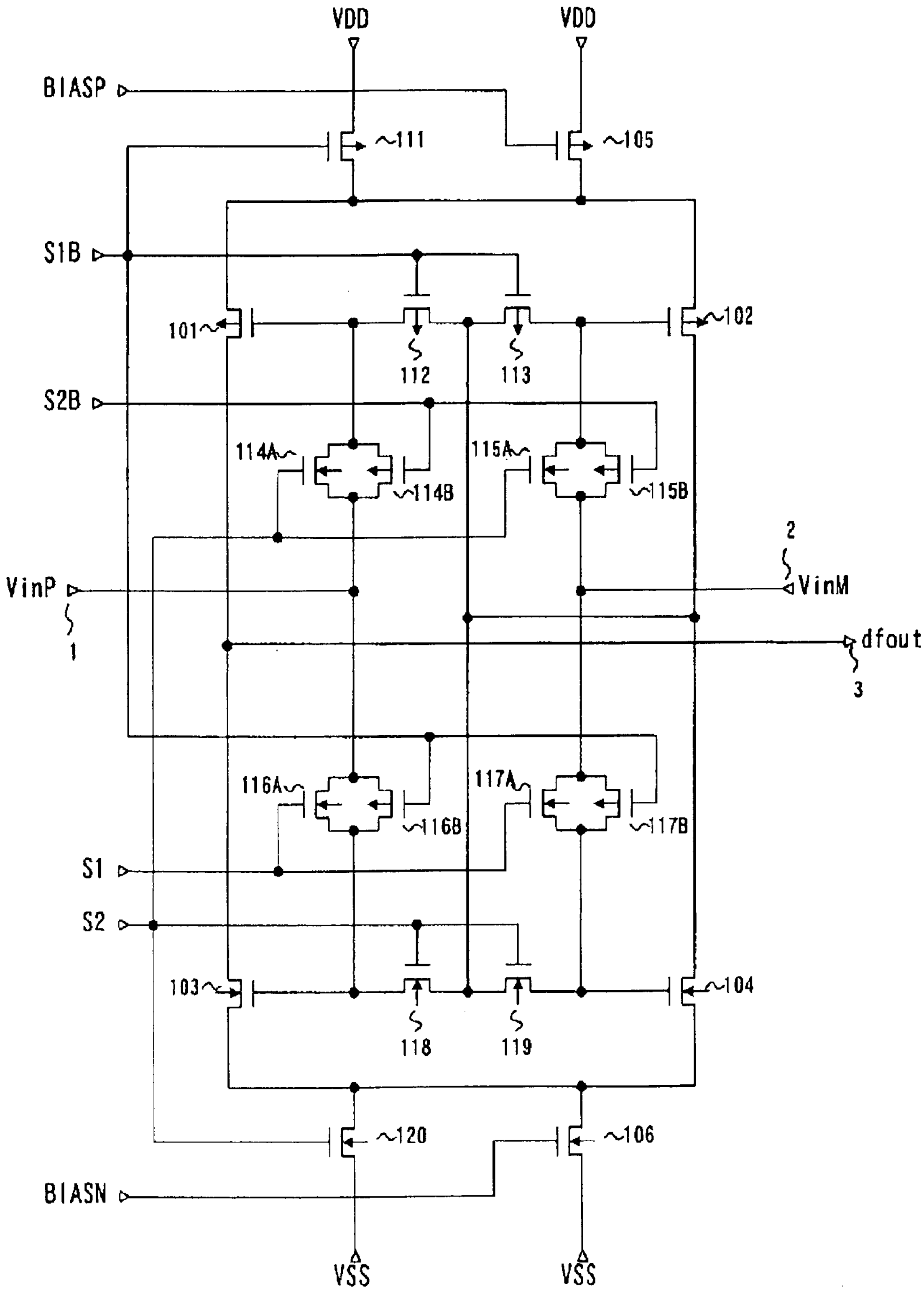
FIG. 4 is a diagram showing the configuration of a second embodiment of the present invention.

Referring to FIG. 4, in the differential circuit in accordance with the present invention, the first, third, and fourth switches (111, 112, and 113) are compose by transistors of first-type conductivity that receives an inverted signal (S1B) of a first control signal at the gate, the second, fifth, and sixth switches (120, 118, and 119) are a transistor of second type conductivity that receives a second control signal (S2) at the gate, the seventh and eighth switches (114 and 115) are a CMOS transfer gate that receives the second control signal (S2) and an inverted signal thereof (S2B) at the gate, and the ninth and tenth switches (116 and 117) are a CMOS transfer gate that receives the first control signal (S1) and an inverted signal thereof (S1B) at the gate.

Figure 5:
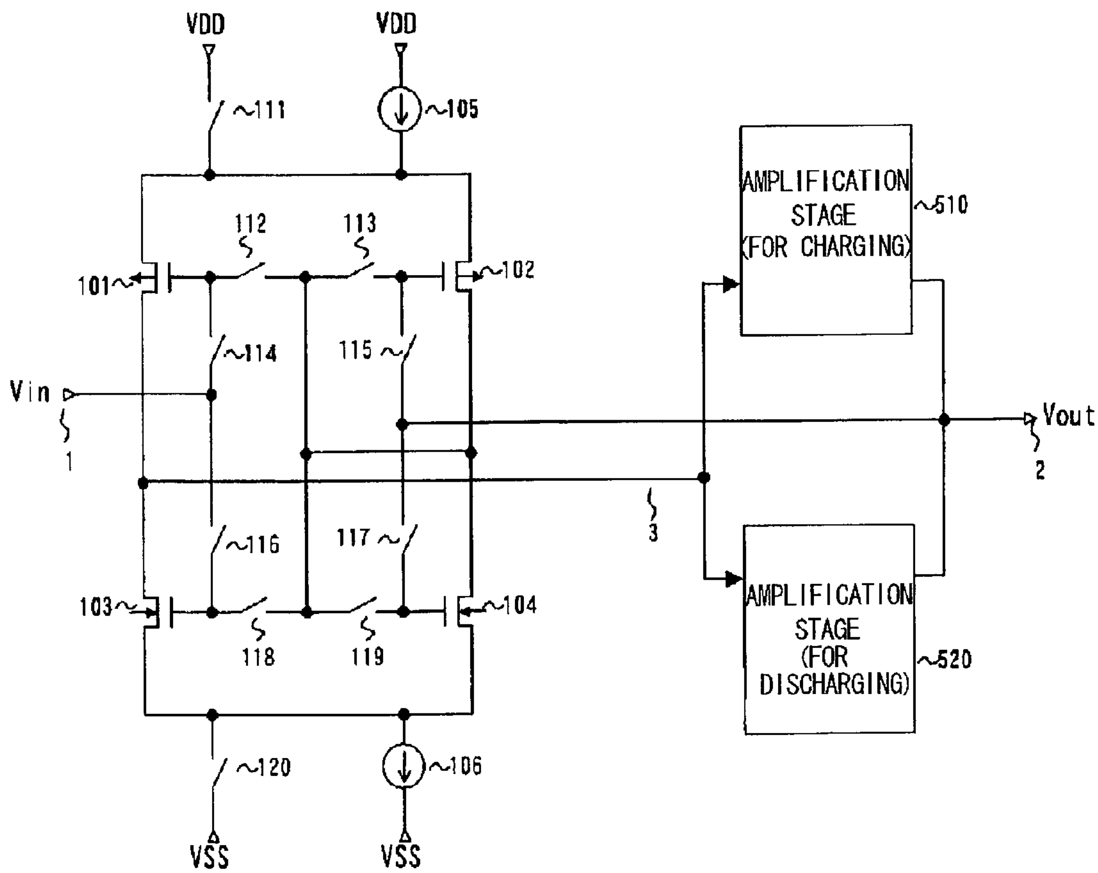
FIG. 5 is a diagram showing the configuration of a third embodiment of the present invention.

Referring to FIG. 5, an amplifier circuit (driver circuit) in accordance with the present invention comprises a charging amplification stage (510) that charges an output terminal (2) based on an output (3) from the differential circuit; and a discharging amplification stage (520) that discharges the output terminal (2) based on the output (3) from the differential circuit, wherein the output terminal voltage Vout is fed back to inverting input terminal of the differential circuit.

Figure 8:
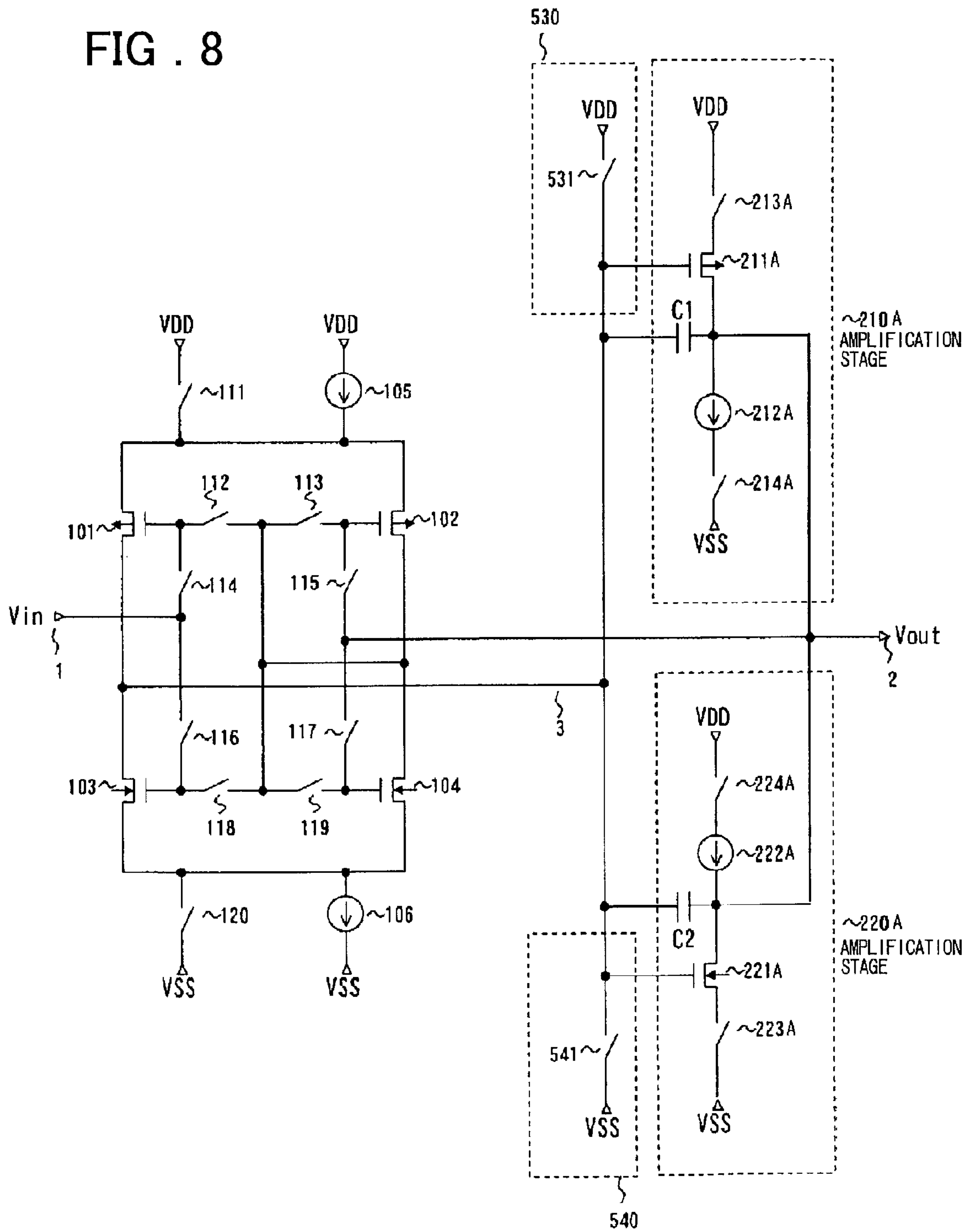
FIG. 8 is a diagram showing the configuration of a fourth embodiment of the present invention.

Referring to FIG. 8, in one preferred embodiment of the amplifier circuit (driver circuit) of the present invention, the charging amplification stage (210A) comprises a fifth transistor (211A) which receives an output signal (3) of the differential circuit at a gate thereof and whose drain is connected to the output terminal (2); a switch (213A) inserted between the source of the fifth transistor and a high-potential power supply (VDD); and a switch (214A) and a current source (212A) connected in series between the drain of the fifth transistor (211) and a low-potential power supply (VSS). The discharging amplification stage (220A) comprises a sixth transistor (221A) which receives the output signal (3) of the differential circuit at a gate thereof and whose drain is connected to the output terminal (2); a switch (223A) inserted between the source of the sixth transistor (221A) and a low-potential power supply (VSS); and a switch (224A) and a current source (222A) connected in series between the drain of the sixth transistor (221A) and a high-potential power supply VDD. A reset switch (531) is connected between the high-potential power supply (VDD) and the gate of the transistor (211A). A reset switch (541) is connected also between the low-potential power supply (VSS) and the gate of the transistor (221A). While the reset switch (531) is turned on, the gate voltage (output signal of differential circuit) of the transistor (211A) is reset to the high-potential power supply voltage VDD, the transistor (211A) is turned off and, during that period, the charging amplification stage (210A) is deactivated. While the reset switch (541) is turned on, the gate voltage (output signal of differential circuit) of the transistor (221A) is reset to the low-potential power supply voltage VSS, the transistor (221A) is turned off and, during that period, the discharging amplification stage (220A) is deactivated.

Figure 10:
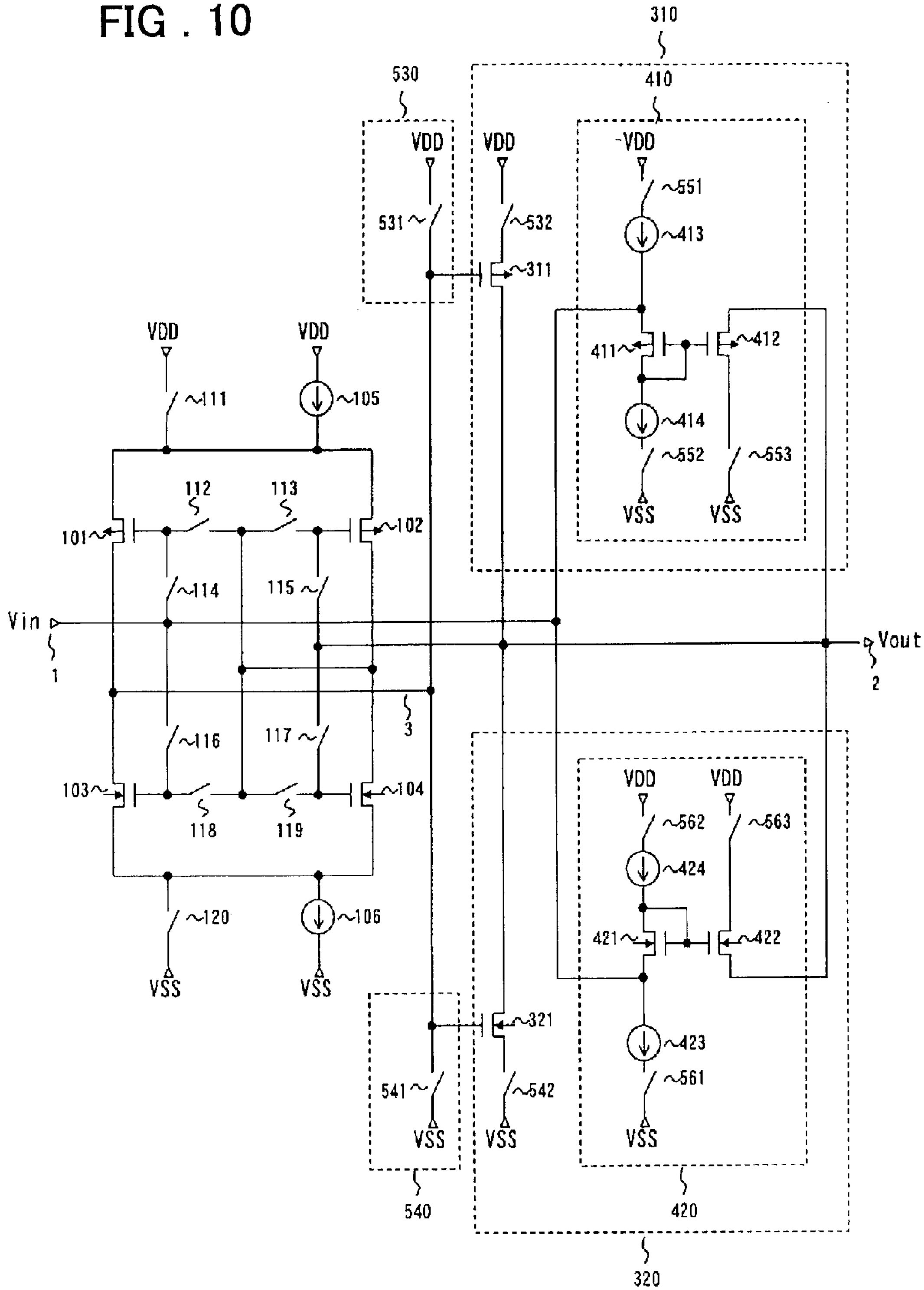
FIG. 10 is a diagram showing the configuration of a fifth embodiment of the present invention.

Referring to FIG. 10, an amplifier circuit (driver circuit) in accordance with one preferred embodiment of the present invention comprises a differential circuit which differentially receives an input terminal voltage and an output terminal voltage; a charging circuit (311) that charges the output terminal based on an output of the differential circuit; a follower-type discharging circuit (410) comprising first bias control means (transistor 411, current source 414) for controlling an output bias voltage in response to the input terminal voltage; and a follower transistor (412) that is connected between the output terminal and a low-potential power supply (VSS) and that receives a bias voltage output from the first bias control means wherein the follower-type discharging circuit discharges the output terminal by a follower operation of an active device according to a voltage difference between the input terminal voltage and the output terminal voltage; a discharging circuit (321) that discharges the output terminal based on the output of the differential circuit; and a follower-type charging circuit (420) comprising second bias control means (421, current source 424) for controlling an output bias voltage in response to the input terminal voltage; and a follower transistor (422) connected between a high-potential power supply and the output terminal and that receives a bias voltage of the second bias control means, wherein the follower-type charging circuit charges the output terminal by a follower operation of an active device according to a voltage difference between the input terminal voltage and the output terminal voltage.

More specifically, an amplifier circuit (driver circuit) in accordance with one preferred embodiment of the present invention comprises, as shown in FIG. 10, comprises a differential circuit. The amplifier circuit further comprises a charging circuit that is connected between a high-potential power supply VDD and the output terminal (2) and that includes a seventh transistor (311) which receives an output signal (3) of the differential circuit at a gate thereof; and a follower-type discharging circuit (410) comprising an eighth transistor (412) connected between the output terminal (2) and a low-potential power supply (VSS); and a diode-connected ninth transistor (411) which is inserted between the input terminal (1) and the low-potential power supply (VSS), which is driven by a constant-current source (414), and whose gate is connected to a gate of the follower-structured transistor (412). The amplifier circuit further comprises a discharging circuit that is connected between the low-potential power supply (VSS) and the output terminal (2) and that includes a tenth transistor (321) that receives the output signal (3) of the differential circuit at a gate thereof; and a follower-type charging circuit (420) comprising a follower-structured eleventh transistor (422) connected between the output terminal (2) and a high-potential power supply (VDD); and a diode-connected twelfth transistor (421) which is inserted between the high-potential power supply and the input terminal (1), which is driven by a constant-current source (424), and whose gate is connected to a gate of the follower-structured eleventh transistor (422). The amplifier circuit further comprises control means that deactivates at least one of the charging circuit (311) and the discharging circuit (321) and, at the same time, activates and deactivates the follower-type discharging circuit (410) and the follower-type charging circuit (420).

The amplifier circuit further comprises a switch (532) inserted between the seventh transistor (311) and the high-potential power supply (VDD); a switch (553) inserted between the follower-structured eighth transistor (412) and the low-potential power supply; a switch (552) connected in series with the constant-current source (414) between the ninth transistor (411) and the low-potential power supply; and a switch (551) and a constant-current source (413) connected between the ninth transistor (411) and the high-potential power supply. The amplifier circuit further comprises a switch (542) inserted between the tenth transistor (321) and the low-potential power supply (VSS); a switch (563) inserted between the follower-structured eleventh transistor (422) and the high-potential power supply (VDD); a switch (562) connected in series with the constant-current source (424) between the twelfth transistor (421) and the high-potential power supply (VDD); and a switch (561) and a constant-current source (423) connected between the twelfth transistor (421) and the low-potential power supply (VSS). The amplifier circuit further comprises a switch (531) between the gate of the seventh transistor (311) and the high-potential power supply (VDD) to reset the output signal (3) of the differential circuit. The amplifier circuit further comprises a switch (541) between the gate of the tenth transistor (321) and the low-potential power supply (VSS) to reset the output signal (3) of the differential circuit.

Figure 14:
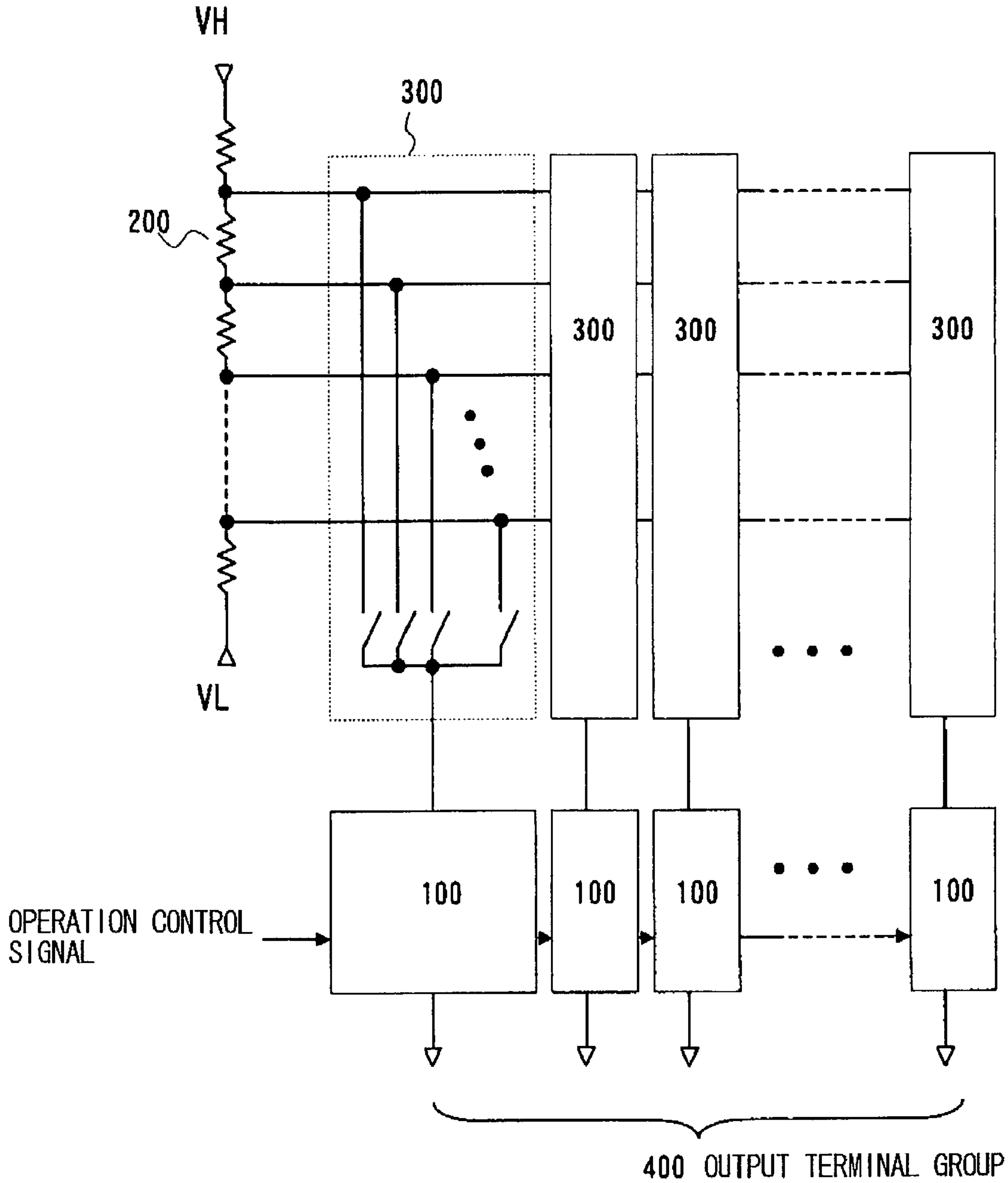
FIG. 14 is a diagram showing the configuration of the sixth embodiment of the present invention.

Referring to FIG. 14, a display circuit in accordance with the present invention comprises the amplifier circuits, each comprising charging and discharging amplification stages, as output circuits (100) that, for example, drive data lines.

Further embodiments of the present invention will be described. In an amplifier circuit in accordance with the present invention, there is provided an additional transistor which is connected in parallel to a transistor provided in the non-inverting input terminal side of a differential pair, to which a control voltage is applied, and which is of the same type of conductivity as that of the differential pair. The control voltage is set in such a way that the added transistor is turned on by an input voltage at the non-inverting input terminal that turns off the differential pair.

Figure 19:
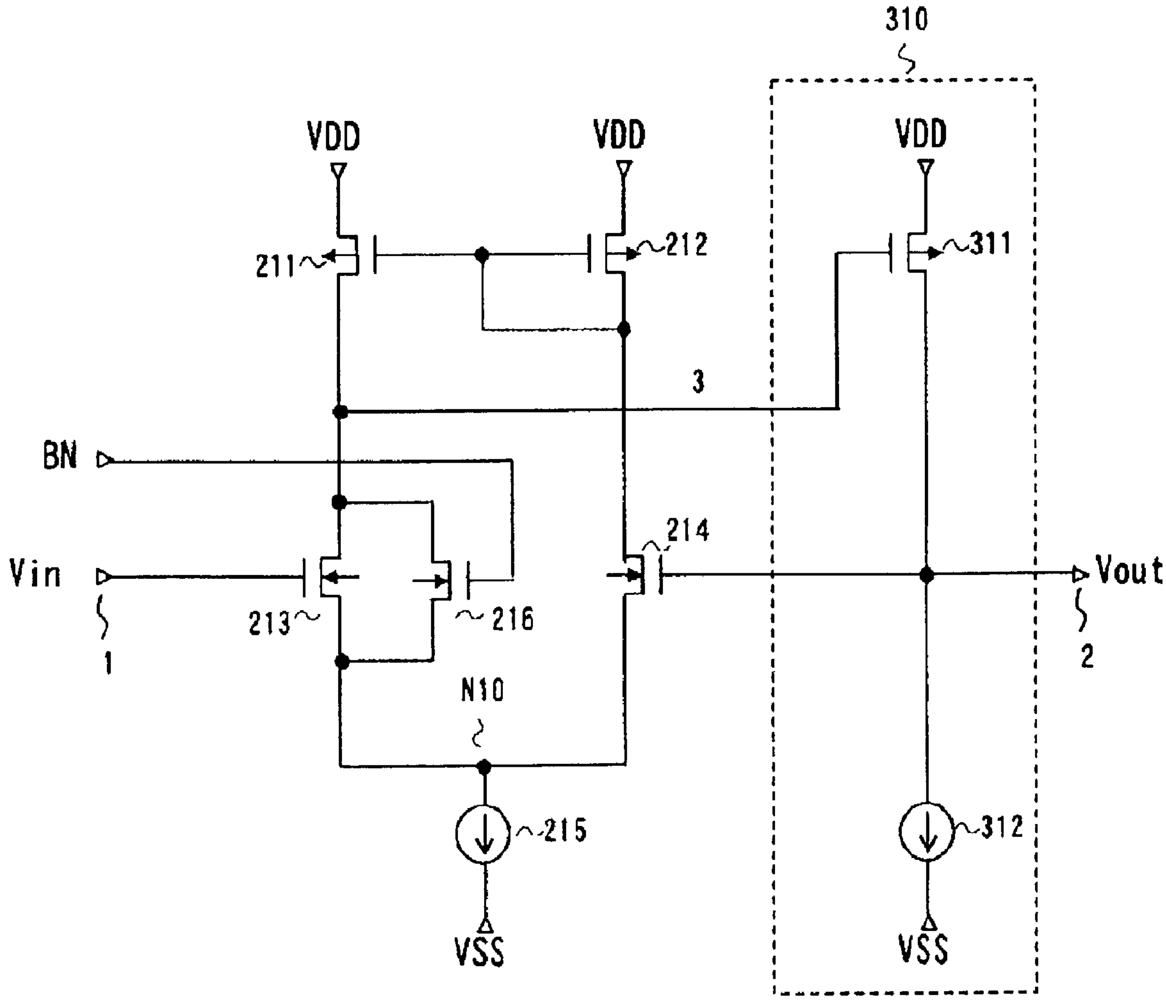
FIG. 19 is a diagram showing the configuration of a fifth embodiment of the present invention.

Referring to FIG. 19 (or FIG. 21), a differential amplifier circuit in accordance with a preferred embodiment of the present invention, comprises a differential pair (213 and 214) (or (223 and 224))that differentially receives input signal voltages from a non-inverting input terminal and an inverting input terminal; and an amplification stage (310) (or 320) that receives an output from the differential pair and outputs an output signal from an output terminal, the differential amplifier circuit additionally including a transistor (216) (or 226) which is connected in parallel to one transistor (213) (or 223) of a differential pair, a control terminal of which is connected to the non-inverting input terminal (1), and whose control terminal receives a control voltage (BN) (or BP). The control voltage (BN) (or BP) is set in such a way that, when the transistor (213) (or 223) whose control terminal is connected to the non-inverting input terminal is turned off by an input signal voltage supplied to the non-inverting input terminal, the transistor (216) (or 226) whose control terminal receives the control voltage is turned on.

In the amplifier circuit in accordance with an embodiment of the present invention, the control voltage (BN) (or BP) is a value satisfying that a difference between a power supply voltage (VSS) (or VDD) of a side, to which a constant current source driving the differential pair is connected, and the control voltage is higher than a threshold (Vt) voltage value that turns on the transistor that receives the control voltage. The output signal of the output stage (310) (or 320) is supplied to the inverting input terminal. The transistor (216) (or 226) that receives the control voltage has the same type of conductivity as the pair transistors forming the differential pair.

Figure 34:
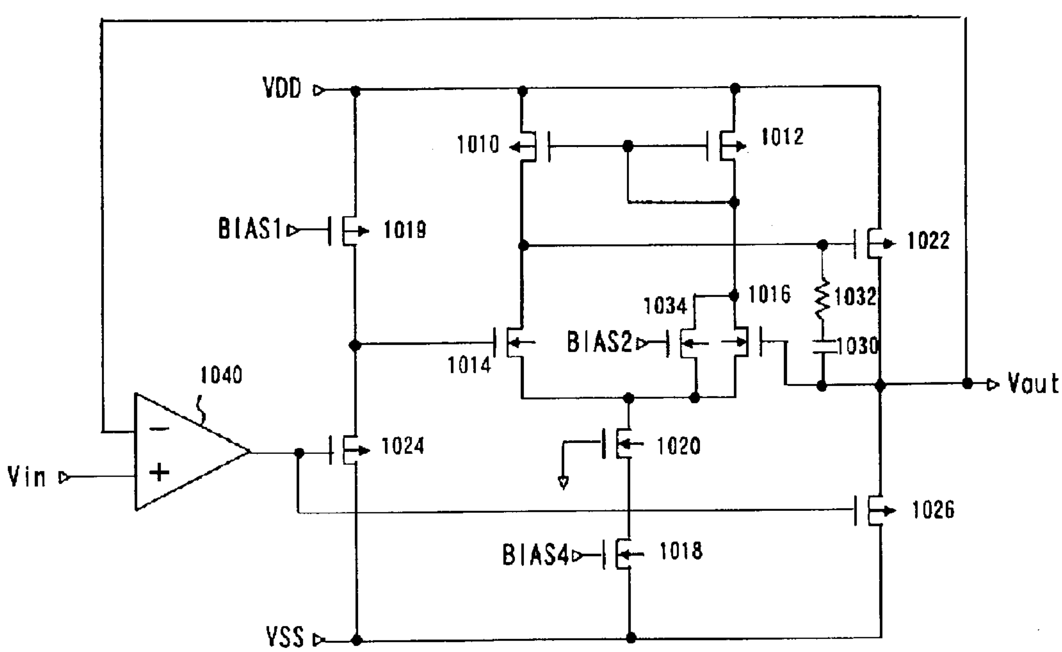
FIG. 34 is a diagram showing another example of a conventional amplifier circuit.

The following describes the difference between the configuration of the amplifier circuit in accordance with the present invention and the configuration shown in FIG. 34. In the configuration shown in FIG. 34, a transistor 1034, provided in parallel to a transistor 1014, prevents the amplifier from decreasing its level to a level equal to or lower than a predetermined level and thus affecting the operation. As a result, the circuit shown in FIG. 34 does not satisfy the object of the conventional technology. Therefore, to satisfy the object of the conventional technology, the additional transistor 1034 must be added to one of transistors of the differential pair that receives the output terminal voltage Vout at the gate. Thus, the circuit shown in FIG. 34, which is different from the present invention in the object and the configuration, gives completely different operation effect.

A driver circuit in accordance with the present invention combines voltage follower circuits, each having a differential pair and an amplification stage and including a first differential circuit and a second differential circuit (210 and 310, and 220 and 320), each having a polarity different from the other, and changes over between two voltage-follower circuits in one output period.

The drive method is that one output period is divided into at least two periods and, at high-potential voltage drive time, a discharging voltage follower circuit is activated and then a charging voltage follower circuit is activated. At low-potential voltage drive time, a charging voltage follower circuit is activated and then a discharging voltage follower circuit is activated. This makes it possible to drive any voltage in any order.

Figure 23:
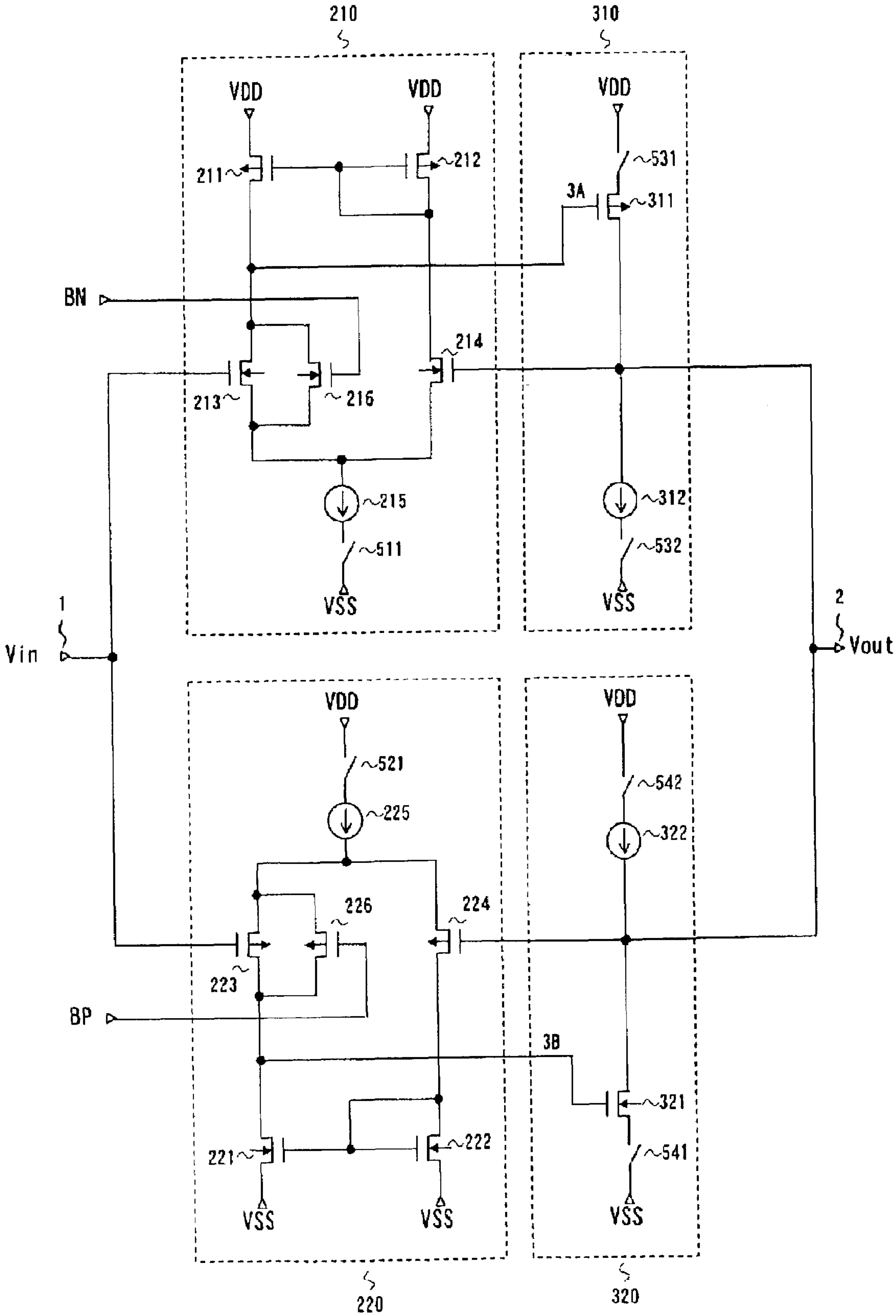
FIG. 23 is a diagram showing the configuration of a seventh embodiment of the present invention.

More specifically, a driver circuit in one embodiment of the present invention includes, as shown in FIG. 23, a first differential circuit comprising; first and second transistors (213 and 214) of first type conductivity, composing a first differential pair; a first switch (511) and a first current source (215) which are connected in series between a low-potential power supply (VSS) and the first differential pair; a third transistor (216) of first type conductivity, which is connected in parallel to the first transistor (213) having a control terminal forming a non-inverting input terminal of the first differential pair and which has a control terminal for receiving a first control voltage (BN); and a load circuit (211 and 212) connected between an output pair of the first differential pair and a high-potential power supply (VDD). The driver circuit further comprises a second differential circuit comprising a fourth and fifth transistors (223 and 224) of second type conductivity composing a second differential pair; a second switch (521) and a second current source (225) connected in series between a high-potential power supply (VDD) and the second differential pair; a sixth transistor (226) of second type conductivity, which is connected in parallel to the fourth transistor (223), having a control terminal forming a non-inverting input terminal of the second differential pair, which has a control terminal for receiving a second control voltage (BP); and a load circuit (221 and 222) connected between an output pair of the second differential pair and the low-potential power supply. The non-inverting input terminals of the first differential pair and the second differential pair are connected to a common input terminal (1), and the inverting input terminals of the first differential pair and the second differential pair are connected to a common output terminal (2). The first or second control voltage (BN or BP) is set in such a way that, for a voltage range in which the transistor (213 or 223) of the first or second differential pair, whose control terminal is a non-inverting input terminal, is turned off by an input voltage sent to the non-inverting input terminal of the first or the second differential pair, the third or sixth transistor (216 or 226) added to the first or second differential pair is turned on, respectively. The driver circuit may further comprise a first amplification stage (310) including a charge circuit including a seventh transistor (311) of second type conductivity that is connected in series with a third switch (531) between the high-potential power supply (VDD) and the output terminal and that receives an output signal of the first differential circuit at a control terminal thereof and a discharge circuit including a fifth switch (532) and a third constant-current source (312) connected between the output terminal and the low-potential power supply; and a second amplification stage (320) comprising a discharge circuit including a eighth transistor (321) of first-type conductivity that is connected in series with a fourth switch (541) between the low-potential power supply (VSS) and the output terminal and that receives an output signal of the second differential circuit at a control terminal thereof and a charge circuit including a sixth switch (542) and a fourth constant-current source (322) connected between the output terminal and the high-potential power supply (VDD).

In accordance with this embodiment, wherein one output period is divided into at least two periods, the driver circuit further comprises control means for, at high-potential voltage drive time, turning off the first, third, and fifth switches (511, 531, and 532) and turning on the second, fourth, and sixth switches. (521, 541, and 542) in a first drive period and turning on the first, third, and fifth switches and turning off the second, fourth, and sixth switches in a second drive period, and for, at low-potential voltage drive time, turning on the first, third, and fifth switches and turning off the second, fourth, and sixth switches in a first drive period and turning off the first, third, and fifth switches and turning on the second, fourth, and sixth switches in a second drive period. A circuit for generating control signals for controlling the changeover of the switches may be provided external to the driver circuit or may be provided on the same substrate (on-chip) as that of the driver circuit.

In accordance with a modification of this embodiment wherein one output period is divided into at least two periods, the driver circuit further comprises control means for, at high-potential voltage drive time, turning off the first, third, fifth, and sixth switches (511, 531, 532, and 542) and turning on the second and fourth switches (521 and 541) in a first drive period and turning on the first, third, and fifth switches (511, 531, and 532) and turning off the second, fourth, and sixth switches (521, 541, and 542) in a second drive period, and for, at low-potential voltage drive time, turning on the first and third switches (511 and 531) and turning off the second, fourth, fifth, and sixth switches (521, 541, 532, and 542) in a first drive period and turning off the first, third, and fifth switches and turning on the second, fourth, and sixth switches in a second drive period.

Figure 30:
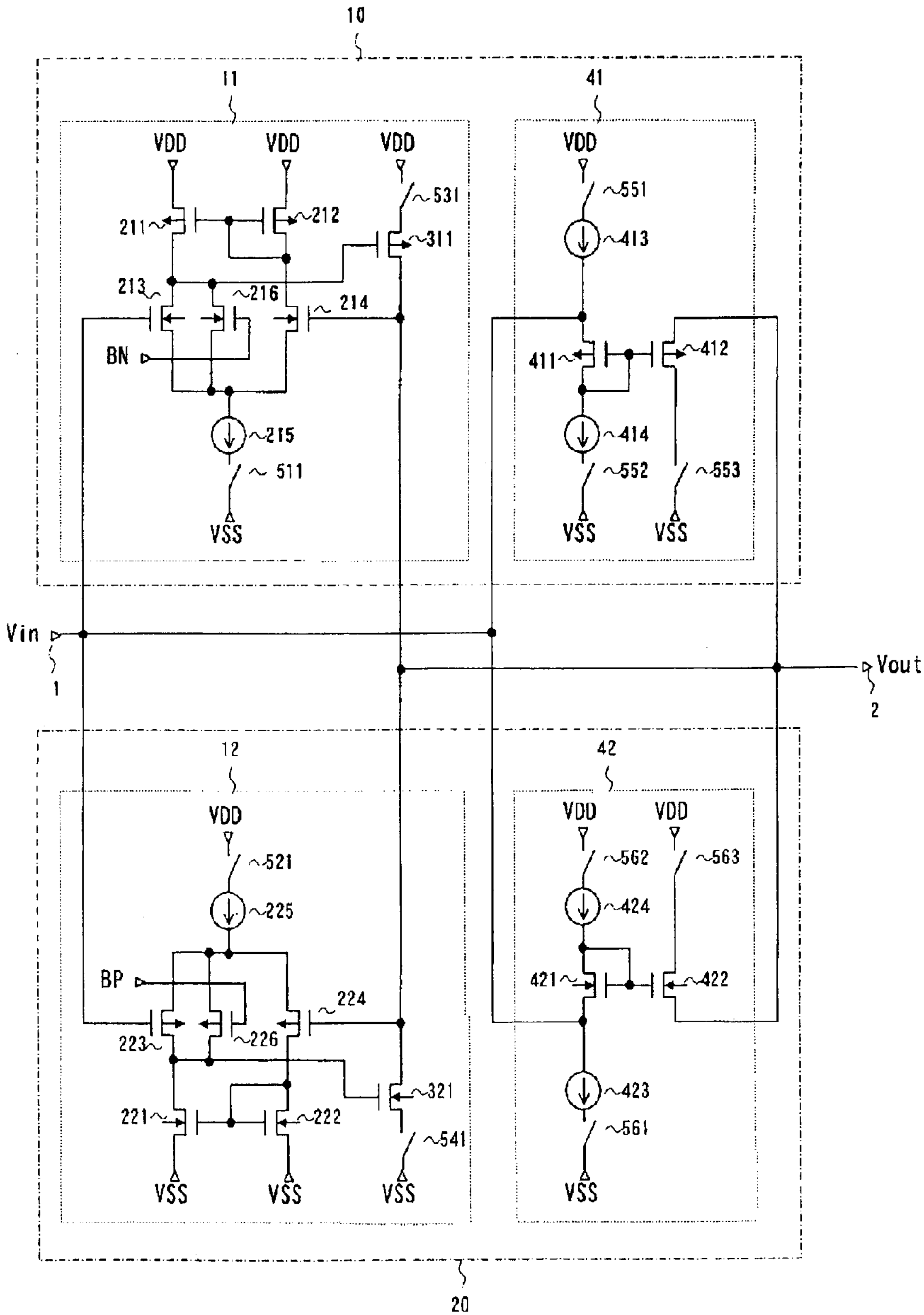
FIG. 30 is a diagram showing the configuration of an eighth embodiment of the present invention.

In accordance with another embodiment of a driver circuit of the present invention comprises, as shown in FIG. 30, a first differential circuit comprising first and second transistors (213 and 214) of first-type conductivity, composing a first differential pair; a first switch (511) and a first current source (215) connected in series between a low-potential power supply (VSS) and the first differential pair; a third transistor (216) of first-type conductivity, which is connected in parallel to the first transistor having a control terminal forming a non-inverting input terminal of the first differential pair, and which(the third transistor(216)) has a control terminal for receiving a first control voltage (BN); and a load circuit (211 and 212) of the first differential pair. The driver circuit further comprises a second differential circuit comprising fourth and fifth transistors (223 and 224) of second-type conductivity, composing a second differential pair; a second switch (521) and a second current source (225) connected in series between a high-potential power supply (VDD) and the second differential pair; a sixth transistor (226) of second-type conductivity, which is connected in parallel to the fourth transistor of second-type conductivity having a control terminal forming a non-inverting input terminal of the second differential pair, and which (the sixth transistor (226)) has a control terminal for receiving a second control voltage(BP); and a load circuit (221 and 222) of the second differential pair.

The non-inverting input terminals of the first differential pair and the second differential pair are connected to a common input terminal (1), and the inverting input terminals of the first differential pair and the second differential pair are connected to a common output terminal (2). The first or second control voltage (BN, BP) is set in such a way that, for a voltage range in which the first or fourth transistor (213 or 223) of the first or second differential pair, whose control terminal is a non-inverting input terminal, is turned off by an input voltage sent to the non-inverting input terminal, the third or sixth transistor (216 or 226) added to the first or second differential pair is turned on, respectively.

The driver circuit further comprises a charge circuit including a seventh transistor (311), of second-type conductivity, that is connected in series with a third switch (531) between the high-potential power supply (VDD) and the output terminal (2) and that receives an output signal of the first differential circuit at a control terminal thereof; and a discharge circuit including an eighth transistor (321) of second type conductivity that is connected in series with a fourth switch (541) between the low-potential power supply (VSS) and the output terminal (2) and that receives an output signal of the second differential circuit at a control terminal thereof. The driver circuit further comprises a follower-type discharge circuit including a follower-structured ninth transistor (412) of second type conductivity connected between the output terminal (2) and the low-potential power supply (VSS) and a diode-connected second-conductive-type tenth transistor (411) which is inserted between the input terminal (1) and the low-potential power supply (VSS), which is driven by a fifth constant-current source (414), and whose control terminal is connected to a control terminal of the follower-structured ninth transistor (412). The driver circuit further comprises a follower-type charge circuit including a follower-structured first-conductive-type eleventh transistor (422) connected between the output terminal (2) and the high-potential power supply (VDD) and a diode-connected second-conductive-type twelfth transistor (421) which is inserted between the high-potential power supply (VDD) and the input terminal (1), which is driven by a sixth constant-current source (424), and whose control terminal is connected to a control terminal of the follower-structured eleventh transistor (422).

In accordance with the present invention, the driver circuit further comprises a seventh switch (553) inserted between the follower-structured ninth transistor (412) and the low-potential power supply; an eighth switch (552) that is connected in series with the fifth constant-current source (414) between the tenth transistor (411) and the low-potential power supply; a ninth switch (551) and a seventh constant-current source (413) connected in series between the tenth transistor (411) and the high-potential power supply; a tenth switch (563) inserted between the follower-structured eleventh transistor (422) and the high-potential power supply; an eleventh switch (562) connected in series with the sixth constant-current source (424) between the twelfth transistor (421) and the high-potential power supply; and a twelfth switch (561) and an eighth constant-current source (423) connected in series between the twelfth transistor and low-potential power supply.

The driver circuit further comprises control means for, at high-potential voltage drive time and when one output period is divided into at least two periods, turning off the first, third, seventh, eighth, and ninth switches (511, 531, 553, 552, and 551) and turning on the second, fourth, tenth, eleventh, and twelfth switches (521, 541, 563, 562, and 561) in a first drive period and turning on the first, third, seventh, eighth, and ninth switches and turning off the second, fourth, tenth, eleventh, and twelfth switches in a second drive period, and for, at low-potential voltage drive time, turning on the first, third, seventh, eighth, and ninth switches and turning off the second, fourth, tenth, eleventh, and twelfth switches in a first drive period and turning off the first, third, seventh, eighth, and ninth switches and turning on the second, fourth, tenth, eleventh, and twelfth switches in a second drive period.

The driver circuit further comprises control means for, at high-potential voltage drive time and when one output period is divided into at least two periods, turning off the first, third, seventh, eighth, ninth, tenth, eleventh, and twelfth switches (511, 531, 553, 552, 551, 563, 562, and 561) and turning on the second and fourth switches (521 and 541) in a first drive period and turning on the first, third, seventh, eighth, and ninth switches (511, 531, 553, 552, and 551) and turning off the second, fourth, tenth, eleventh, and twelfth switches (521, 541, 563, 562, and 561) in a second drive period, and for, at low-potential voltage drive time, turning on the first and third switches and turning off the second, fourth, seventh, eighth, ninth, tenth, eleventh, and twelfth switches in a first drive period and turning off the first, third, seventh, eighth, and ninth switches and turning on the second, fourth, tenth, eleventh, and twelfth switches in a second drive period.

A display device in accordance with the present invention comprises a driver circuit composed of the two voltage-follower circuits described above as a driver circuit that drives the data lines of a liquid crystal or EL (Electro Luminance) display device.

Some examples of the present invention will be described with reference to the drawings to describe more in detail the embodiments of the present invention described above. FIG. 1 is a diagram showing the configuration of a first embodiment of the present invention.

Referring to FIG. 1, a differential circuit in this embodiment comprises a pair of p-channel transistors 101 and 102 and a pair of n-channel transistors 103 and 104. The sources of the paired p-channel transistors 101 and 102 are coupled together and, between the commonly coupled sources of the paired p-channel transistors and the high-potential power supply VDD, there are provided a switch 111 and a constant-current source 105 which are connected in parallel. Switches 112 and 113 are connected in series between the gates of the paired p-channel transistors 101 and 102. The drains of the p-channel transistor pair 101 and 102 are connected to the drains of the paired n-channel transistors 103 and 104.

The sources of the n-channel transistors 103 and 104 are coupled together and, between the commonly coupled sources of the paired n-channel transistors and the low-potential power supply VSS, there are provided a switch 120 and a constant-current source 106 which are connected in parallel. Switches 118 and 119 are connected in series between the gates of the n-channel transistors 103 and 104. In addition, there are provided switches 114 and 116 which are connected in series between the connection node connecting the switch 112 and the gate of the p-channel transistor 101, and the connection node connecting the switch 118 and the gate of the n-channel transistor 103 there are provided switches 115 and 117 which are connected in series between the connection node connecting the switch 113 and the gate of the p-channel transistor 102, and the connection node connecting the switch 119 and the gate of the n-channel transistor 104. The connection node connecting the switches 113 and 112 is connected to the connection node connecting the switches 118 and 119 and to the connection node connecting the drain of the p-channel transistor 102 and the drain of the n-channel transistor 104. Differential input terminals VinP and VinM are connected to the connection node connecting the switch 114 and switch 116 and to the connection node connecting the switches 115 and 117, respectively. The connection node connecting the drain of the p-channel transistor 101 and the drain of the n-channel transistor 103 is connected to an output terminal dfout.

As described above, the differential circuit in this embodiment comprises a pair of p-channel transistors 101 and 102, a pair of n-channel transistors 103 and 104, and connection changeover means (switches 111–120). One of the transistor pairs composes a differential pair that differentially receives two input voltages VinP and VinM, and the other transistor pair composes a current mirror circuit acting as an active load with the input terminal and output terminal thereof connected to outputs of the differential pair. The connection changeover means changes over the conductivity type (polarity) of the differential pair and the current mirror circuit. Each of the p-channel transistor pair and the n-channel transistor pair may be changed over by the connection changeover means to the differential pair or to the current mirror pair. When one of them is the differential pair, the other is the current mirror circuit.

FIG. 2 is a diagram showing how the switches shown in FIG. 1, which act as the connection changeover means, are controlled in the differential circuit in this embodiment. FIG. 2 shows two connections states (connection changeover 1, connection changeover 2) created by the connection changeover means.

In a connection changeover state 1, the switches 111, 112, 113, 116, and 117 are turned on and switches 114, 115, 118, 119, and 120 are turned off.

In this case, the paired n-channel transistors 103 and 104, whose sources are tied together and are connected to the current source 106 which drives n-channel transistors 103 and 104, becomes the differential pair that differentially receives two differential input voltages VinP and VinM supplied to the gates thereof. The paired p-channel transistors 101 and 102, in which the gates are connected and the drain and the gate of the transistor 102 are connected (the diode-connected transistor 102 becomes the current input side of the current mirror), becomes the current mirror circuit that acts as a load with the input end and the output end connected to the output pair of the differential pair. The current flowing through the differential circuit is controlled by the current source 106.

On the other hand, in a connection changeover state 2, the switches 111, 112, 113, 116, and 117 are turned off and switches 114, 115, 118, 119, and 120 are turned on. In this case, the paired p-channel transistors 101 and 102 becomes the differential pair that differentially receives two differential input voltages VinP and VinM. The paired n-channel transistors 103 and 104 becomes the current mirror circuit that acts as the load with the input end and the output end connected to the output pair of the differential pair. The current flowing through the differential circuit is controlled by the current source 105.

The output signal of the differential circuit is obtained from the common connection point between the drain of the transistor 101 and the drain of the transistor 103. This is common to the connection changeover state 1 and the connection changeover state 2.

Because the differential circuit becomes inactive to the differential input voltage that turns off at least one of transistors of the differential pair, it is desirable that connection changeover states 1 and 2 be controlled so that the differential circuit does not become inactive in the stable state. More specifically, in the connection changeover 1 state where the paired n-channel transistors 103 and 104 becomes the differential pair, the connection changeover should be controlled so that, with the lower limit voltage set higher than the low-potential power supply VSS by the threshold voltage of the paired n-channel transistors 103 and 104, the circuit becomes operable at the differential input voltages (VinP and VinM) on the higher-potential side. In the connection changeover state 2 where the paired p-channel transistors 101 and 102 becomes the differential pair, the connection changeover should be controlled so that, with the higher limit voltage set lower than the high-potential power supply VDD by the threshold voltage of the p-channel transistor 101 and 102, the circuit becomes operable at the differential input voltages (VinP and VinM) on the lower-potential side. In addition, when providing a connection changeover voltage Vm, the changeover should be controlled, with Vm set to a voltage between the higher limit and the lower limit, in such a way that the connection changeover 1 state becomes active at the differential input voltage on the high-potential side equal to or higher than Vm and that the connection changeover 2 state becomes active at the differential input voltage on the low-potential side that is lower than Vm.

Figure 3A:
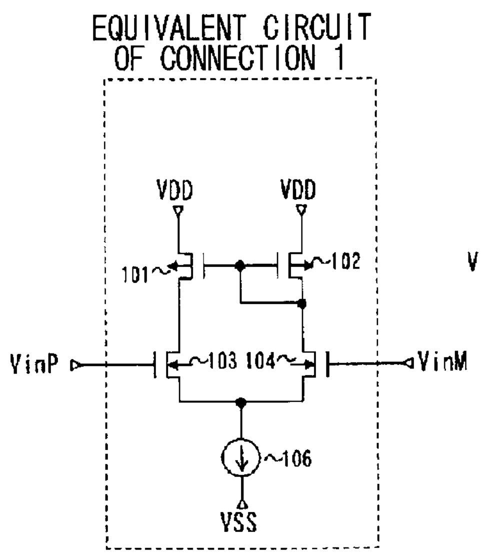
FIGS. 3A, 3B, 3C and 3D are diagrams showing the connection and operation of circuits in connection changeover states 1 and 2 in the first embodiment of the present invention.
Figure 3B:
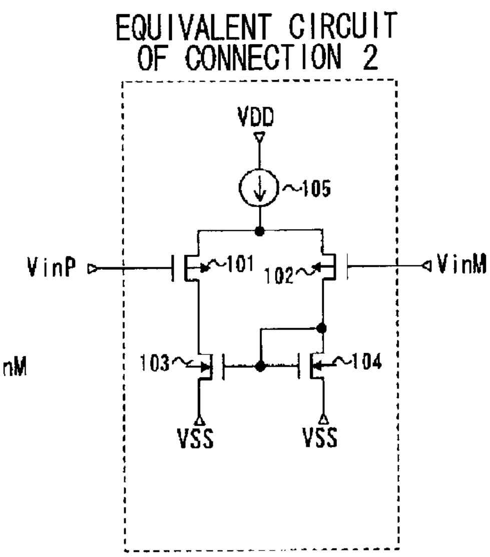

FIG. 3A and FIG. 3B show the equivalent circuits of the circuit shown in FIG. 1 that are in the connection changeover states 1 and 2 in FIG. 2 (The output terminal of the differential circuit is omitted). The operation of the differential circuit of the present invention will be described below. It is assumed that the transistor characteristic of the paired transistor 101 and 102 and those of the paired transistor 103 and 104 are the same for the same polarity. It is also assumed that the input voltage VinP is a predetermined voltage at which the differential pair is operable and that the input voltage VinM is a voltage that may be varied easily. In this case, the current mirror circuit in FIG. 3A and FIG. 3B causes an equal drain current to flow to the differential pair transistors and, because the state becomes stable when the gate-source voltage of the transistors of the differential pair are at an equal level, VinP=VinM in the stable state.

Next, a case will be described in which there are variations in the characteristic of the transistor pairs with the same polarity in one embodiment of the present invention because of a problem in the fabrication process. In the example below, the characteristic of the n-channel transistor 103 vary from the standard characteristic.

Figure 3C:
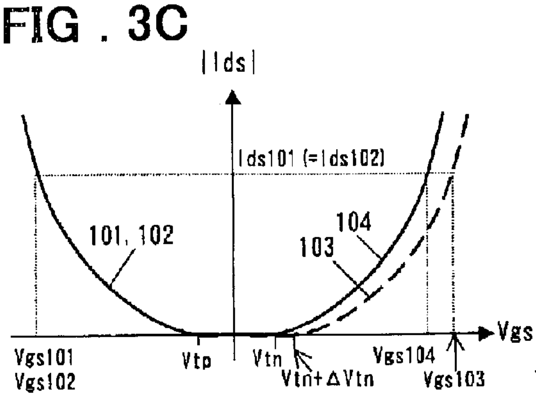
Figure 3D:
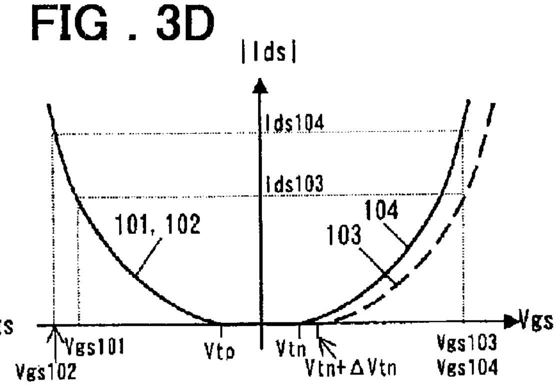

FIG. 3C and FIG. 3D are diagrams showing the drain current characteristic (Ids–Vgs characteristic) in the on-operation region for the gate-source voltage of the transistor 101, 102, 103, and 104 that form the differential pair and the current mirror circuit. In FIG. 3C and FIG. 3D, the solid line indicates the standard characteristic and the dotted line indicates the characteristic of the n-channel transistor 103 that vary from the standard characteristic in the threshold voltage increasing direction.

In the connection changeover state 1, the p-channel transistors 101 and 102 that compose the current mirror circuit supply an equal amount of drain current Ids101 and Ids102

(Ids101=Ids102) to the n-channel transistors 103 and 104 that compose the differential pair, as shown in FIG. 3A and FIG. 3C.

The gate-source voltages of the nMOS differential transistor pair 103 and 104 are determined by the drain current Ids101 and Ids102, respectively. In the example shown in FIG. 3C, the stable state is entered when the input voltage VinM is received that makes the gate-source voltage Vgs 103 of the transistor 103 larger than the gate-source voltage Vgs 104 of the transistor 104.

In this case, the difference between the gate-source voltages of the n-channel transistors 103 and 104 is the voltage difference between the input voltages VinP and VinM with the relation given below.

$$VinP-VinM=Vgs\mathbf{103}-Vgs\mathbf{104}>0 \quad (4)$$

On the other hand, in the connection changeover state 2, the n-channel transistors 103 and 104 that form the current mirror circuit supply an unequal amount of drain current Ids103 and Ids104 to the p-channel transistors 101 and 102 that form the differential pair, as shown in FIG. 3(B) and FIG. 3(D). The gate-source voltages of the pMOS differential pair transistors 101 and 102 (each negative value) are determined by the drain currents Ids103 and Ids104, respectively. In the example shown in FIG. 3D, the stable state is entered when the input voltage VinM is received that makes the gate-source voltage Vgs 102 of the transistor 102 larger than the gate-source voltage Vgs 101 of the transistor 101. In this case, the difference between the gate-source voltages of the p-channel transistors 101 and 102 is the voltage difference between the input voltages VinP and VinM with the relation given below.

$$VinP-VinM=Vgs\mathbf{101}-Vgs\mathbf{102}>0 \quad (5)$$

As described above, the voltage difference (VinP−VinM) of the input voltages VinP and VinM is positive in the stable state of both the connection changeover states 1 and 2.

This indicates that the direction of variations in (VinP−VinM) in the connection changeover states 1 and 2 matches the direction of variations in the transistor characteristic of the n-channel transistor 103, meaning that the deviation of variations in (VinP−VinM) caused by connection changeover may be reduced.

In particular, by setting the transistor size of the transistors 101, 102, 103 and 104 of each polarity so that the slope (absolute value of ΔIds/ΔVgs) of the characteristic curve of Ids−Vgs for the same amount of drain current becomes sufficiently equal, that is, by designing the circuit so that the Ids−Vgs characteristic between polarities become almost asymmetric, the amount of variations in (VinP−VinM) in the connection changeover states 1 and 2 may also be set sufficiently equal.

In the above description, the threshold voltage of the n-channel transistor 103 varies in the increasing direction (Vtn+ΔVtn) in the example. Even if the characteristic of any of the devices of the transistors 101, 102, 103, and 104 vary from the standard characteristic, the directions of variations in (VinP−VinM) in the connection changeover states 1 and 2 are the same. Even if a changeover is made, the deviation of variations in (VinP−VinM) may be reduced.

That is, even if the characteristic of one of four transistors included in the differential pair and the current mirror circuit of the differential circuit according to the present invention vary from the standard characteristic, the directions of variations in (VinP−VinM) in the connection changeover states 1 and 2 are the same and, even if a connection changeover is made, the deviation of variations in (VinP−VinM) may be reduced.

Figure 15:
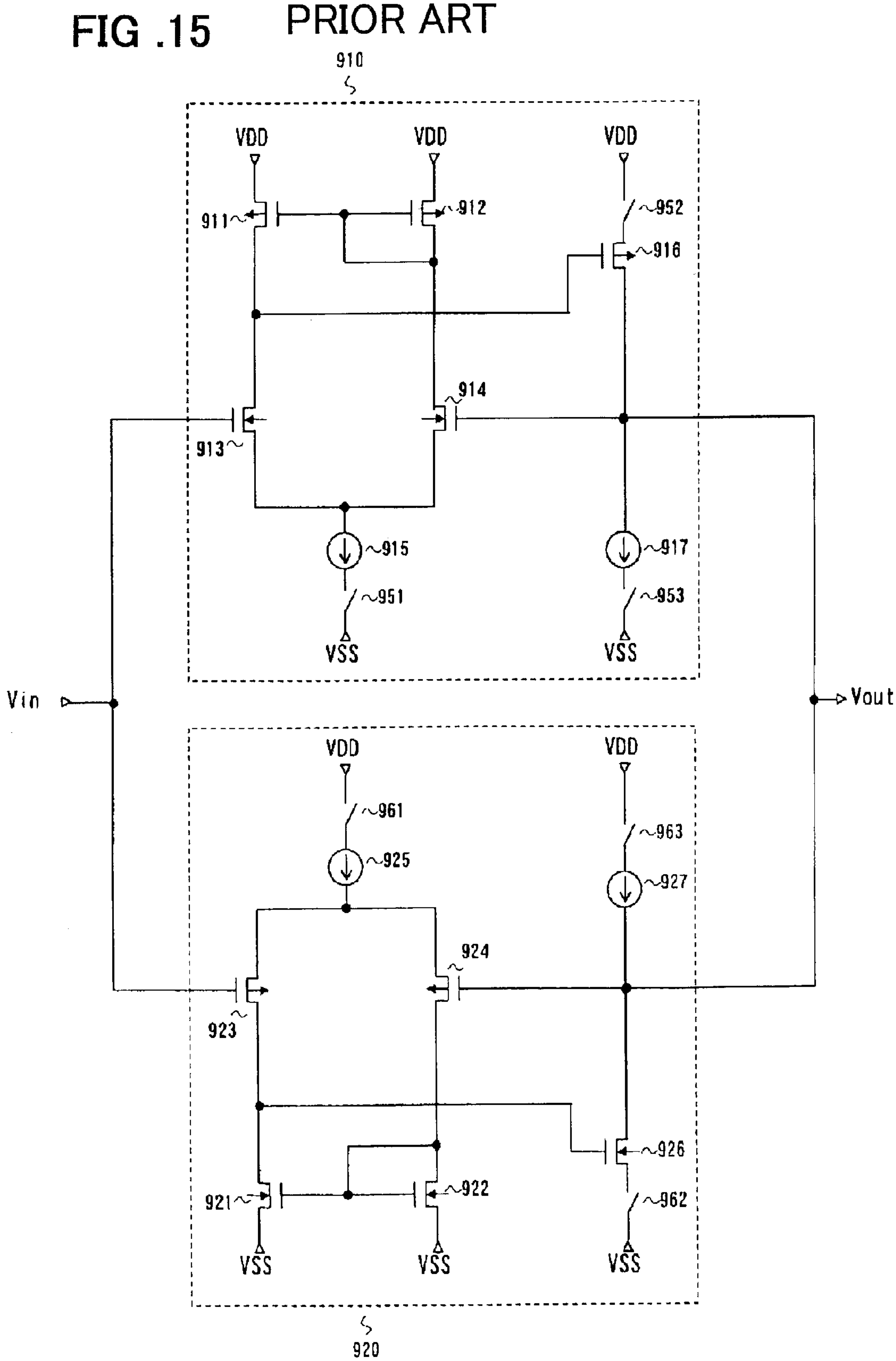
FIG. 15 is a diagram showing the configuration of a conventional differential circuit.

If, instead of the connection changeover described above, two differential circuits with the configuration similar to that of the circuit in FIG. 3A and FIG. 3B are provided separately and each is changed over, the differential pair and the current mirror circuit are composed of eight transistors (see the conventional circuit in FIG. 15). In such a configuration, for the direction of variations in the transistor characteristic, the direction of variations in (VinP−VinM) of two differential circuits sometimes differ and therefore the deviation of variations in (VinP−VinM) generated by the changeover of two differential circuits cannot be reduced.

FIG. 4 is a diagram showing the configuration of a second embodiment of the present invention. This figure shows an example of the configuration of the differential circuit shown in FIG. 1 in which the switches are configured by MOS transistors. In FIG. 4, switch control signals S1 and S2 are controlled by the low level (L) or high level (H).

The circuit enters the connection changeover 1 state by controlling the signals such that (S1, S2)=(H,L), and the circuit enters the connection changeover 2 state by controlling the signals such that (S1, S2)=(L,H). S1B and S2B are the inverted signals of S1 and S2.

Each switch may be any switch that may be connected and disconnected. FIG. 4 shows the configuration that requires less transistors (reduction in the number of devices) and less space. First, a switch 111 and a switch 120, one end of which is connected to the high-potential power supply VDD and the low-potential power supply VSS, may be configured respectively by a single p-channel transistor and an n-channel transistor, respectively.

Switches 112 and 113 may also be configured each by a single p-channel transistor. This is because the switches 112 and 113 are turned on in the connection changeover 1 state in which p-channel transistors 101 and 102 form a current mirror circuit. This is because the gate potential of the p-channel transistors 101 and 102 at that time becomes a constant voltage relatively close to the high-potential power voltage VDD. For example, the potential difference between the gate of the p-channel transistors 101 and 102 in the connection changeover 1 state when the current value of a current source 106 is set small and the high-potential power terminal VDD is very close to the threshold vantage of the p-channel transistors 101 and 102, and the gate potential of the p-channel transistors 101 and 102 is sufficiently close to the high-potential power voltage VDD in the power supply voltage range. Therefore, the transistors fully function as switches by configuring the switches 112 and 113 each by a single p-channel transistor, by supplying the low-potential power voltage VSS to the gates to turn on the transistor, and by supplying the high-potential power voltage VDD to turn off the transistor.

Similarly, switches 118 and 119 may be configured each by a single n-channel transistor. This is because the switches 118 and 119 are turned on when n-channel transistors 103 and 104 form the current mirror circuit in the connection changeover 2 state and because the gate potential of the n-channel transistors 103 and 104 at that time is a constant voltage relatively close to the low-potential side voltage VSS.

The switches 114, 115, 116, and 117 in FIG. 1 may well be configured by CMOS switches when one end is connected to the input terminal 1 or 2 and the input voltages VinP and VinM are given as an arbitrary voltage.

Referring to FIG. 4, a current source 105 is composed by a p-channel transistor whose source is connected to the high-potential power supply VDD, whose gate receives a bias voltage BIASP, and whose drain is connected to the common source of the transistors 101 and 102. A current source 106 is composed by an n-channel transistor whose source is connected to the low-potential power supply VSS, whose gate receives a bias voltage BIASN, and whose drain is connected to the common source of the transistors 103 and 104. The bias level of the bias voltages BIASP and BIASN may be changed as necessary. For example, when the differential circuit is stopped, transistors 111 and 120 are turned off by setting (S1, S2)=(L, L). At the same time, the bias voltage BIASP may be switched to the high-potential power supply VDD to deactivate the current source transistor 105, and the bias voltage BIASN to the low-potential power supply voltage VSS to deactivate the current source transistor 106. This completely disconnects the current within the differential circuit to save power consumption.

Next, another embodiment of the present invention will be described. FIG. 5 is a diagram showing the configuration of a third embodiment of the present invention. FIG. 5 shows the configuration of a driver circuit configured by using the differential circuit in FIG. 1. That is, a differential circuit in FIG. 5, which comprises transistors 101, 102, 103, and 104, switches 111–120, and current sources 105 and 106, is the same as the one shown in FIG. 1. FIG. 6 shows an example of how the driver circuit in FIG. 5 is controlled.

Referring to FIG. 5, this driver circuit is a feedback type amplifier circuit including two amplification stages 510 and 520 that operate in response to an output from the differential circuit shown in FIG. 1. Referring to FIG. 5, an input voltage Vin (input voltage VinP in FIG. 1) and an output voltage Vout (input voltage VinM in FIG. 1) are sent to the two input terminals (differential input terminals) of the differential circuit.

The amplification stage 510 is a charging amplification stage that quickly charges an output terminal 2, while the amplification stage 520 is a discharging amplification stage that quickly discharges the output terminal 2. The configuration of the charging amplification stage 510 and the discharging amplification stage 520 will be described later with reference to FIG. 8 and other figures. The operation of the driver circuit in FIG. 5 will be described with reference to FIG. 6.

As shown in FIG. 6, in the connection changeover 1 state, the switches 111, 112, 113, 116, and 117 of the differential circuit are turned on, the switches 114, 115, 118, 119, and 120 are turned off, the amplification stage 510 is activated (operable), and the amplification stage 520 is deactivated (stopped).

When the output terminal voltage Vout is lower than a desired voltage, the operation of the differential circuit based on the voltage difference between the input terminal voltage Vin and the output terminal voltage Vout as well as the charging operation of the amplification stage 510 increases the output terminal voltage Vout to the desired voltage.

On the other hand, in the connection changeover 2 state, the switches 111, 112, 113, 116, and 117 of the differential circuit are turned off, the switches 114, 115, 118, 119, and 120 are turned on, the amplification stage 510 is deactivated (stopped), and the amplification stage 520 is activated (operable).

When the output terminal voltage Vout is higher than a desired voltage, the operation of the differential circuit based on the voltage difference between the input terminal voltage Vin and the output terminal voltage Vout as well as the discharging operation of the amplification stage 520 decreases the output terminal voltage Vout to the desired voltage.

The output of the differential circuit is common to the amplification stages 510 and 520. Therefore, if the optimum output voltage of the differential circuit differs between the amplification stage 510 and the amplification stage 520 at operation start time, a reset circuit may be provided to reset the output voltage of the differential circuit to an optimum voltage when each of the connection changeover state 1 and the connection changeover state 2 starts.

FIG. 6 shows a case in which the voltage is driven in one of the connection changeover 1 state and the connection changeover state 2 during one output period during which a desired voltage is driven. This drive method is advantageously used in an application where the high-potential side voltage and the low-potential side voltage are driven alternately. In a case where any voltage is driven in any order, the connection changeover state 1 and the connection changeover state 2 may be changed over for driving in one output period. In this case, it is at least required to control the state that the connection changeover 1 state is used at the stabilized drive time of the high-potential side voltage and the connection changeover 2 state is used at the stabilized drive time of low-potential side voltage.

If the driver circuit, shown in FIG. 5, is configured such that the paired p-channel transistors 101 and 102 and the paired n-channel transistors 103 and 104 in the differential circuit have the same transistor characteristic between the same polarity and such that a voltage equal to the input voltage Vin is output to the output terminal 2 as Vout in the connection changeover states 1 and 2, the input terminal voltage Vin (input voltage VinP in FIG. 1) and the output terminal voltage Vout (input voltage VinM in FIG. 1) are supplied to the two input terminals of the differential circuit and the state Vin=Vout becomes stable.

Therefore, in this case, the description given with reference to FIG. 3 is applied to the driver circuit shown in FIG. 5. Even if the characteristic of the same-polarity transistor pair in the differential circuit vary because of a problem in the fabrication process, the direction of variations in (Vin−Vout) in the connection changeover states 1 and 2 is the same and, even if a connection changeover is made, the deviation of variations in (Vin−Vout) may be reduced.

The transistor characteristic may be varied even in the amplification stages 510 and 520. However, because this effect is little, only the variations in the characteristic of the transistors in the differential circuit should be taken into consideration for the description of the operation.

On the other hand, the driver circuit shown in FIG. 15 is also a voltage-follower circuit that can output a voltage equal to the input voltage Vin to the output terminal 2 as Vout. However, because voltage-follower circuits 910 and 920 each include a differential circuit, the direction of variations in (Vin−Vout) in relation to the variations in the transistor characteristic is not predictable and therefore the deviation cannot be reduced.

That is, as compared with the driver circuit in FIG. 15, the driver circuit in FIG. 5 can reduce the deviation of the variations in (Vin−Vout) for the variations in the transistor characteristic. In particular, for better grayscale display, it is important for an amplifier, which amplifies the grayscale level voltage of a liquid crystal display device, to maintain the interval of the grayscale level determined based on the liquid crystal characteristic. Therefore, it is required for this type of an amplifier (driver circuit) that a fluctuation in the output offset amount determined by the grayscale level be as small as possible, that is, the deviation among the grayscale levels of the output offset be sufficiently small.

In this respect, the driver circuit shown in FIG. 5 can reduce the deviation of variations in (Vin−Vout) in relation to the variations in the transistor characteristic. Therefore, this driver circuit is suitable for an amplifier that amplifies the grayscale level of a liquid crystal display device.

Figure 7:
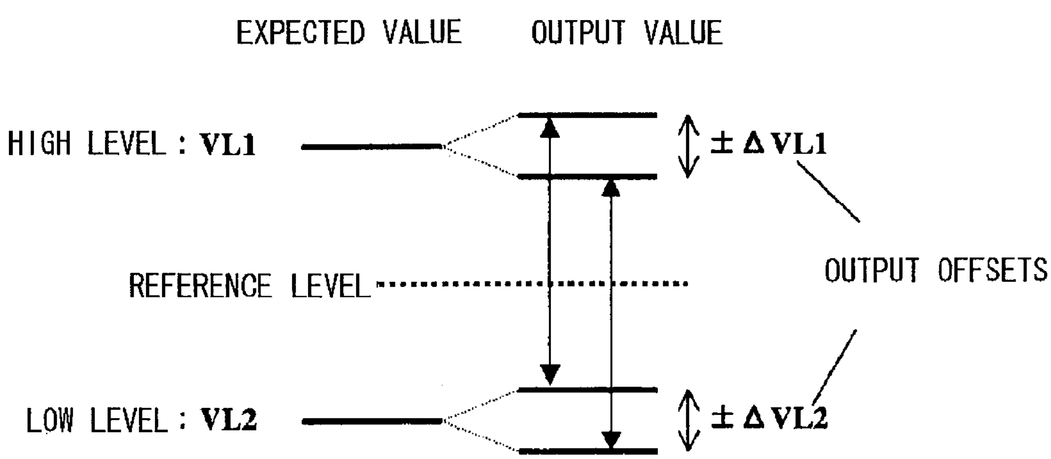
FIG. 7 is a diagram showing the operation of the third embodiment of the present invention.

FIG. 7 is a diagram showing the operation of the driver circuit shown in FIG. 5. The figure shows, with respect to the reference level, the expected values and the output values including the offset, of the high potential level VL1 of the high-potential side and the low potential level VL2 of the low-potential side when they are driven by the driver circuit in FIG. 5. The deviation of variations in (Vin−Vout) in relation to the variations in the transistor characteristic of the driver circuit in FIG. 5 will be described in detail with reference to FIG. 7.

In FIG. 7, the expected value is a value when there is no variations in the transistor characteristic, in which case, Vout=Vin. The output value including the offset is Vout when there are variations in the transistor characteristic.

To evaluate the deviation of variations caused by a changeover between connection changeover states 1 and 2, it is assumed that the high potential level VL1 is the level at which the driver circuit in FIG. 5 is driven in the connection changeover state 1 and that the low potential level VL2 is the level at which the driver circuit in FIG. 5 is driven in the connection changeover state 2 and that the offsets are ±ΔVL1 and ±ΔVL2 respectively.

Whether or not the voltage interval between grayscale levels is maintained is determined by whether or not the amplitude difference deviation in each two-grayscale levels is sufficiently small.

Because the direction of variations in (Vin−Vout) in the connection changeover states 1 and 2 in the driver circuit in FIG. 5 is the same, the amplitude difference deviation in two voltage levels VL1 and VL2 in FIG. 7 is $$\{(VL1+\Delta VL1)-(VL2+\Delta VL2)\} \quad (6)$$

or $$\{VL1-\Delta VL1)-(VL2-\Delta VL2)\} \quad (7)$$

Therefore, the maximum of the amplitude difference deviation is obtained as absolute value of the difference between the (6) and (7) and is given as the following expression:

$$|2\times(\Delta VL1-\Delta VL2)| \quad (8)$$

That is, this expression indicates that the amplitude difference deviation generated when the driver circuit shown in FIG. 5 is driven by changing over the state between the connection changeover state 1 and the connection changeover 2 state may take a deviation value that is as large as the twice the absolute value of the difference between the offsets generated in the connection changeover states 1 and 2.

Figure 16:
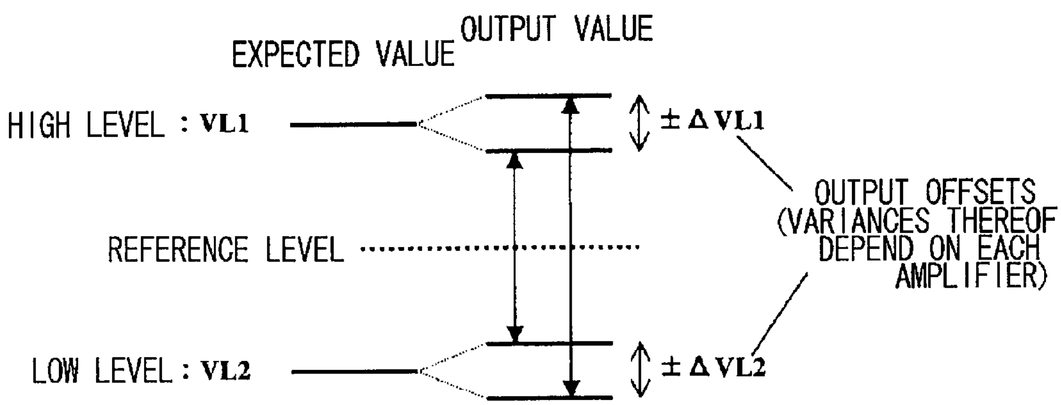
FIG. 16 is a diagram showing an amplitude difference deviation in the conventional differential circuit.

As compared with the maximum value {2×(ΔVL1+ΔVL2)} (see expression (3)) of the amplitude difference deviation of the driver circuit in FIG. 15 that is described with reference to FIG. 16, the following relation is apparent.

$$|2\times(\Delta VL1-\Delta VL2)|\leqq\{2\times(\Delta VL1+\Delta VL2)\}$$

Therefore, as compared with the driver circuit in FIG. 15, the driver circuit in FIG. 5 can reduce the deviation of variations in (Vin−Vout) in relation to the variations in the transistor characteristic.

To make the offsets ΔVL1 and ΔVL2 in each of connection changeover states 1 and 2 as equal as possible, the circuit should be designed in such a way that the Ids−Vgs (drain current and gate-source voltage) characteristic between the polarities of the PMOS transistors 101 and 102 and NMOS transistors 103 and 104 become almost asymmetrical. This makes the amplitude difference deviation of the driver circuit in FIG. 5 sufficiently small.

A still another embodiment of the present invention will be described. FIG. 8 is a diagram showing the configuration of a fourth embodiment of the present invention. FIG. 8 shows the configuration of a driver circuit configured by the differential circuit shown in FIG. 1. That is, the differential circuit shown in FIG. 8, which comprises transistors 101, 102, 103, and 104, switches 111–120, and current sources 105 and 106, is the same as that shown in FIG. 1.

A charging amplification stage 210A comprises a p-channel transistor 211A which receives, at its gate, an output signal 3 (voltage at the connection node connecting the transistor 101 and the transistor 103) of the differential circuit and whose drain is connected to an output terminal 2, a switch 213A inserted between the source of the transistor 211A and a high-potential power supply VDD, a switch 214A and a current source 212A connected in series between the drain of the transistor 211A and a low-potential power supply VSS. A capacitor C1 is feedback-connected between the output terminal 2 (drain output of the transistor 211A) and the gate of the transistor 211A to shape the waveform of the rising voltage of the output terminal 2. A reset circuit 530 is provided that has a switch 531 inserted between the high-potential power supply VDD and the gate of the transistor 211A.

A discharging amplification stage 220A comprises an n-channel transistor 221A which receives, at its gate, the output signal of the differential circuit and whose drain is connected to the output terminal 2, a switch 223A inserted between the source of the transistor 221A and a low-potential power supply VSS, a switch 224A and a current source 222A connected in series between the drain of the transistor 221A and a high-potential power supply VDD. A capacitor C2 is feedback-connected between the output terminal 2 (drain output of the transistor 221A) and the gate of the transistor 221A to shape the waveform of the falling voltage of the output terminal 2. A reset circuit 540 is provided that has a switch 541 inserted between the low-potential power supply VSS and the gate of the transistor 221A.

Referring to FIG. 8, the output terminal 3 of the differential circuit is connected to the amplification stages 210A and 220A to cause the amplification stages 210A and 220A to operate according to the output from the differential circuit. This allows the voltage equal to the input terminal voltage Vin to be output from the output terminal 2 as the output voltage (output terminal voltage) Vout. The two input terminals of the differential circuit receives the input terminal voltage Vin (input voltage VinP in FIG. 1) and the output terminal voltage Vout (input voltage VinM in FIG. 1) to configure a feedback-type amplifier circuit.

The output of the differential circuit (connection point between the drain of the transistor 101 and the drain of the transistor 103) is common to the amplification stages 210A and 220A. The reset circuits 530 and 540 are provided to reset the output signal 3 of the differential circuit before the amplification stages 210A and 220A are put into operation.

Figure 9:
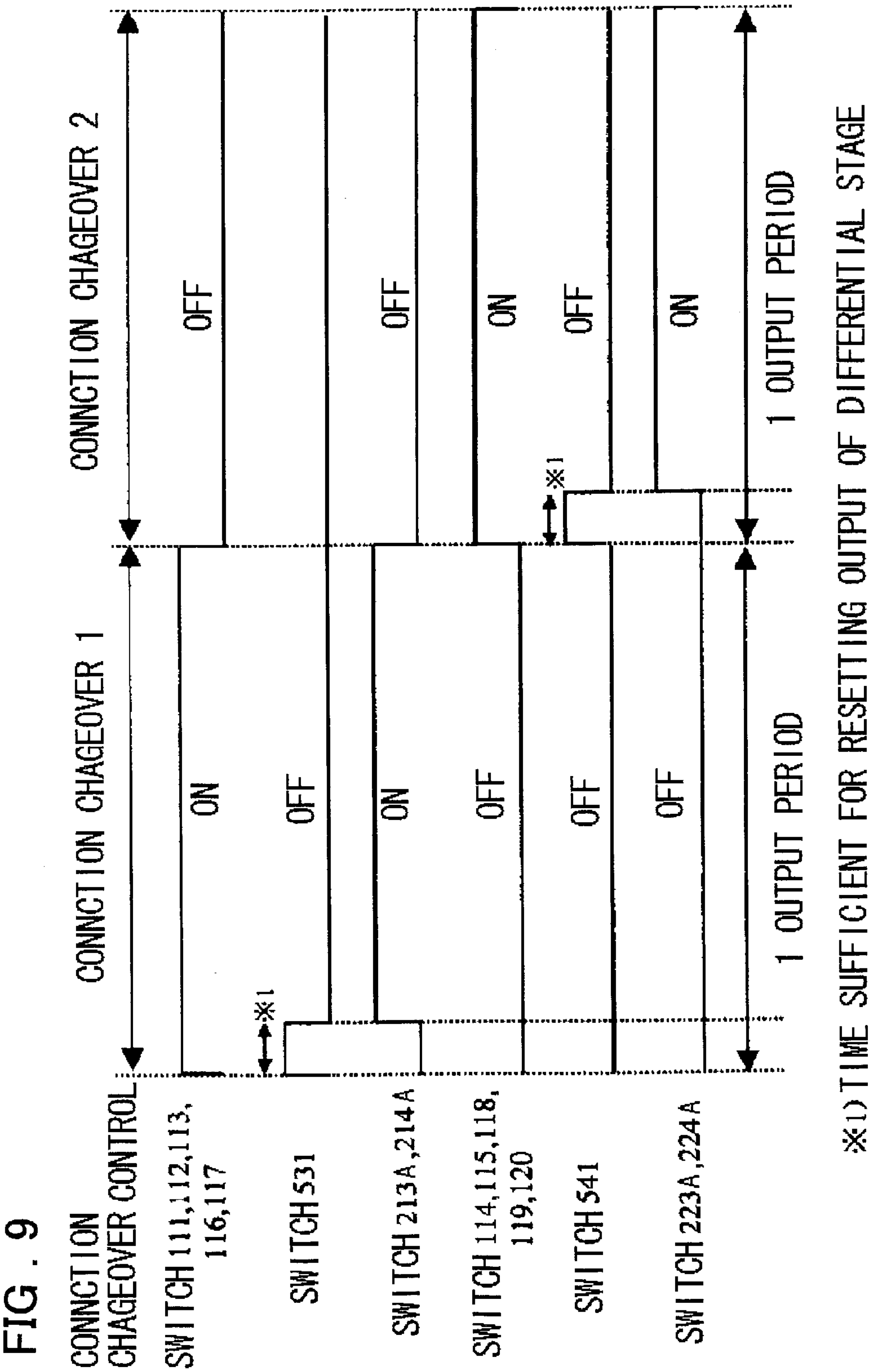
FIG. 9 is a timing diagram showing switch control in the fourth embodiment of the present invention.

FIG. 9 shows an example of switch control during the output period of the connection changeover state 1, and the output period of connection changeover state 2, of the driver circuit in the fourth embodiment shown in FIG. 8. The following describes the operation of the drive circuit in FIG. 8 with reference to FIG. 9.

During the output period of the connection changeover state 1, the switches 111, 112, 113, 116, and 117 of the differential circuit are turned on and the switches 114, 115, 118, 119, and 120 are turned off. At the start of the output period, the switch 531 of the reset circuit 530 is turned on to pre-charge the output 3 of the differential circuit to the high-potential power supply voltage VDD for a sufficiently short time (called "reset period"). As shown by *1 in FIG. 9, this reset period may be as short as is necessary to reset the output 3 of the differential circuit. During this period, the amplification stage 210A is deactivated.

The switch 531 is turned off to end the reset period and, after that, the switches 213A and 214A are turned on to activate (operate) the amplification stage 210A. At this time, the driver circuit in FIG. 8 becomes equivalent to the voltage follower circuit 910 in FIG. 16 (with the switches 951, 952, and 953 turned on). Therefore, when the input terminal voltage Vin becomes Vin>Vout in the driver circuit during the output period in the connection changeover state 1, the output signal voltage of the differential circuit decreases and the p-channel transistor 211A is turned on, making it possible to quickly increase the output terminal voltage Vout to Vin with the high charging power.

When the input terminal voltage Vin becomes Vin<Vout, the output signal voltage of the differential circuit increases, the p-channel transistor 211A is turned off, and the discharging operation of the current source 212A is started to decrease the output terminal voltage Vout to Vin.

The reset circuit 530 in this embodiment has the effect of preventing output noise generation before and after the changeover between the connection changeover state 1 and the connection changeover state 2. For example, when the output voltage of the differential circuit is low immediately before the connection changeover, the p-channel transistor 211A of the amplification stage 210A is instantaneously turned on regardless of the input terminal voltage Vin. Therefore, the output terminal voltage Vout changes and sometimes generates output noises.

However, in this embodiment, the reset circuit 530 is provided to reset the output 3 of the differential circuit so that the p-channel transistor 211A enters the off state, thus preventing such output noises. Although the switch 531 is used to reset the circuit in FIG. 8, it is easily understood that this may also be done in other configurations. The switches 111, 112, 113, 116, and 117 of the differential circuit may also be turned on synchronously with the switches 213A and 214A.

On the other hand, during the output period of the connection changeover state 2, the switches 111, 112, 113, 116, and 117 of the differential circuit are turned off and the switches 114, 115, 118, 119, and 120 are turned on. At the start of the output period, the switch 541 of the reset circuit 540 is turned on to discharge the output 3 of the differential circuit to the low-potential power supply voltage VSS for a sufficiently short reset time. As shown by *1 in FIG. 9, this reset period may be as short as is necessary to reset the output of the differential stage. During this period, the amplification stage 220A is deactivated.

The switch 541 is turned off to end the reset period and, after that, the switches 223A and 224A are turned on to activate (operate) the amplification stage 220A. At this time, the driver circuit in FIG. 8 becomes equivalent to the voltage follower circuit 920 in FIG. 15 (with the switches 951, 952, and 953 turned on).

Therefore, when the input terminal voltage Vin becomes Vin<Vout in the driver circuit in FIG. 8 during the output period in the connection changeover state 2, the output signal voltage of the differential circuit increases and the n-channel transistor 221A is turned on, making it possible to quickly decrease Vout to Vin with the high discharging power.

When the input terminal voltage Vin becomes Vin>Vout, the output signal voltage of the differential circuit decreases, the n-channel transistor 221A is turned off, and the charging operation of the current source 222A is started to increase the output terminal voltage Vout to the input terminal voltage Vin.

The reset circuit 540 in this embodiment has the effect of preventing output noises before and after the changeover. For example, when the output voltage of the differential circuit is high immediately before the connection changeover, the n-channel transistor 221A of the amplification stage 220A is instantaneously turned on immediately after the connection changeover regardless of the input terminal voltage Vin. Therefore, Vout changes and sometimes generates output noises.

However, in this embodiment, the reset circuit 540 is provided to reset the output 3 of the differential circuit so that the n-channel transistor 211A enters the off state, thus preventing such output noises. Although the switch 541 is used to reset the circuit in FIG. 8, it is easily understood that this may also be done in other configurations. The switches 114, 115, 118, 119, and 120 of the differential circuit may also be turned on synchronously with the switches 223A and 224A.

The driver circuit in FIG. 8 has the same output characteristic as those of the driver circuit in FIG. 5 and, even if the characteristic of the differential circuit vary from the standard characteristic because of a problem with the fabrication process, the direction of variations in (Vin−Vout) in the connection changeover states 1 and 2 is the same and therefore the deviation of variations in (Vin−Vout) may be reduced even if a connection changeover is made. This makes the driver circuit ideal for an amplifier that amplifies the grayscale level voltage of a liquid crystal display device.

Next, a fifth embodiment of the present invention will be described. FIG. 10 is a diagram showing the configuration of the fifth embodiment of the present invention, and this figure shows another circuit configuration of the driver circuit in FIG. 5. Referring to FIG. 10, an amplification stage 310 is configured by replacing the current source 212A and the switch 214A of the amplification stage 210A in FIG. 8 with a circuit 410, and an amplification stage 320 is configured by replacing the current source 222A and the switch 224A of the amplification stage 220A in FIG. 8 with a circuit 420. The rest of the configuration is the same as that of the circuit in FIG. 8.

Referring to FIG. 10, the differential circuit differentially receives the voltage Vin of an input terminal 1 (input terminal voltage) and the voltage Vout of an output terminal 2 (output terminal voltage).

The amplification stage 310 comprises a p-channel transistor 311 (charging circuit) and the follower-type discharging circuit 410. The p-channel transistor 311 is connected between the high-potential power supply VDD and the output terminal 2, and its gate receives the output signal of the differential circuit. The circuit 410 comprises a follower-structured p-channel transistor 412 which is connected between the output terminal 2 and the low-potential power supply VSS; and a p-channel transistor 411 which is inserted between the input terminal 1 and the low-potential power supply VSS, which is driven by a constant current source 414, and whose gate is diode-connected to the gate of a follower-structured transistor 412. The amplification stage 310 further comprises a switch 553 which is inserted between the transistor 412 and the low-potential power supply VSS; a switch 552 which is connected in series with the constant current source 414 between the transistor 411 and the low-potential power supply VSS; and a switch 551 and a constant current source 413 which are connected in series between the transistor 411 and the high-potential power supply VDD.

The amplification stage 320 comprises an n-channel transistor 321 (discharging circuit) and the follower-type charging circuit 420. The n-channel transistor 321 is connected between the low-potential power supply VSS and the output terminal 2 and whose gate receives the output signal of the differential circuit. The follower charging circuit 420 comprises a follower-structured n-channel transistor 422 which is connected between the output terminal 2 and the high-potential power supply VDD; and an n-channel transistor 421 which is inserted between the high-potential power supply VDD and an input terminal 1, which is driven by a constant current source 424, and whose gate is diode-connected to the gate of a follower-structured transistor 422. The amplification stage 320 further comprises a switch 563 which is inserted between the transistor 422 and the high-potential power supply VDD; a switch 562 which is connected in series with the constant current source 424 between the transistor 421 and the high-potential power supply VDD; and a switch 561 and a constant current source 423 which are connected in series between the transistor 421 and the low-potential power supply VSS. The configuration in FIG. 10 other than that of the differential circuit, that is, the transistor 311 that works with the differential circuit to form the feedback-type charging circuit, transistor 321 that works with the differential circuit to form the feedback-type discharging circuit, source follower discharging circuit 410, and source follower charging circuit 420 are described in detail in the publication (with the application number of priority 2001-373302 based on patent application number 2000-402079, unpublicized at the time of this application).

Also in FIG. 10, the output terminal 3 of the differential circuit is connected to the amplification stages 310 and 320 to cause the amplification stages 310 and 320 to operate according to the output from the differential circuit. This configuration allows the voltage equal to the input terminal voltage Vin to be output to the output terminal 2 as Vout.

The two input terminals of the differential circuit receives the input terminal voltage Vin (input voltage VinP in FIG. 1) and the output terminal voltage Vout (input voltage VinM in FIG. 1) to configure a feedback-type amplifier circuit. The output of the differential circuit is common to the amplification stages 310 and 320. The reset circuits 530 and 540 are provided to reset the output of the differential circuit before the amplification stages 310 and 320 are put into operation.

The source follower discharging circuit 410 comprises the p-channel transistor 411 which is diode-connected and whose source receives the input terminal voltage Vin; and the p-channel transistor 412 whose source is connected to the output terminal 2, whose gate is connected to the gate of the p-channel transistor 411, and whose drain is connected to the low-potential power supply VSS via the switch 553. The circuit further comprises the current source 413 and the switch 551 connected in series between the source of the p-channel transistor 411 and the high-potential power supply VDD; and the current source 414 and the switch 552 which are connected in series between the drain of the p-channel transistor 411 and the low-potential power supply VSS.

The following briefly describes the operation of the source follower discharging circuit 410. For details, refer to the publication described above (with the application number of priority 2001-373302 based on patent application number 2000-402079).

The operation of the source follower discharging circuit 410 is controlled by the switches 551, 552, and 553. When the switches are on, the circuit becomes operable; when the switches are off, the operation stops.

If the p-channel transistors 411 and 412 have the same transistor characteristic and the current sources 413 and 414 control the same amount of current when the source follower discharging circuit 410 is in the operable state, the gate voltage of the transistors 411 and 412 is the voltage varied from the input terminal voltage Vin by the gate-source voltage. At this time, if Vin<Vout, the gate-source voltage of the p-channel transistor 412 is higher than the threshold voltage and, so, the discharge operation of the p-channel transistor 412 is activated by the source follower operation to decrease the output terminal voltage Vout.

As the output terminal voltage Vout decreases, the gate-source voltage of the p-channel transistor 412 decreases and, when the voltage decreases to the vicinity of the threshold voltage, the discharge operation stops. In this case, if the amount of current controlled by the current sources 413 and 414 is sufficiently small, the gate-source voltage of the p-channel transistor 411 is also in the vicinity of the threshold voltage. Therefore, the output terminal voltage Vout is decreased to the vicinity of the input terminal voltage Vin by the source follower operation of the p-channel transistor 412.

If Vin>Vout, the gate-source voltage of the p-channel transistor 412 is at a level that turns off the transistor with no effect on the fluctuation in the output terminal voltage Vout.

On the other hand, the source follower charging circuit 420 comprises the n-channel transistor 421 which is diode-connected and whose source receives the input terminal voltage Vin; and the n-channel transistor 422 whose source is connected to the output terminal 2, whose gate is connected to the gate of the n-channel transistor 421, and whose drain is connected to the high-potential power supply VDD via the switch 563. The circuit further comprises the current source 423 and the switch 561 connected in series between the source of the n-channel transistor 421 and the low-potential power supply VSS; and the current source 424 and the switch 562 which are connected in series between the drain of the n-channel transistor 421 and the high-potential power supply VDD.

The following briefly describes the operation of the source follower charging circuit 420. The operation of the source follower charging circuit 420 is controlled by the switches 561, 562, and 563. When the switches are on, the circuit becomes operable; when the switches are off, the operation stops.

If the n-channel transistors 421 and 422 have the same transistor characteristic and the current sources 423 and 424 control the same amount of current when the source follower charging circuit 420 is in the operable state, the gate voltage of the transistors 421 and 422 is the voltage varied from the input terminal voltage Vin by the gate-source voltage. At this time, if Vin>Vout, the gate-source voltage of the n-channel transistor 422 is higher than the threshold voltage and, so, the charge operation of the n-channel transistor 422 is activated by the source follower operation to increase the output terminal voltage Vout.

As the output terminal voltage Vout increases, the gate-source voltage of the n-channel transistor 422 decreases and, when the voltage decreases to the vicinity of the threshold voltage, the charge operation stops. In this case, if the amount of current controlled by the current sources 423 and 424 is sufficiently small, the gate-source voltage of the n-channel transistor 421 is also in the vicinity of the threshold voltage. Therefore, the output terminal voltage Vout is increased to the vicinity of the input terminal voltage Vin by the source follower operation of the n-channel transistor 422.

If Vin<Vout, the gate-source voltage of the n-channel transistor 422 is at a level that turns off the transistor with no effect on the fluctuation in the output terminal voltage Vout.

Figure 11:
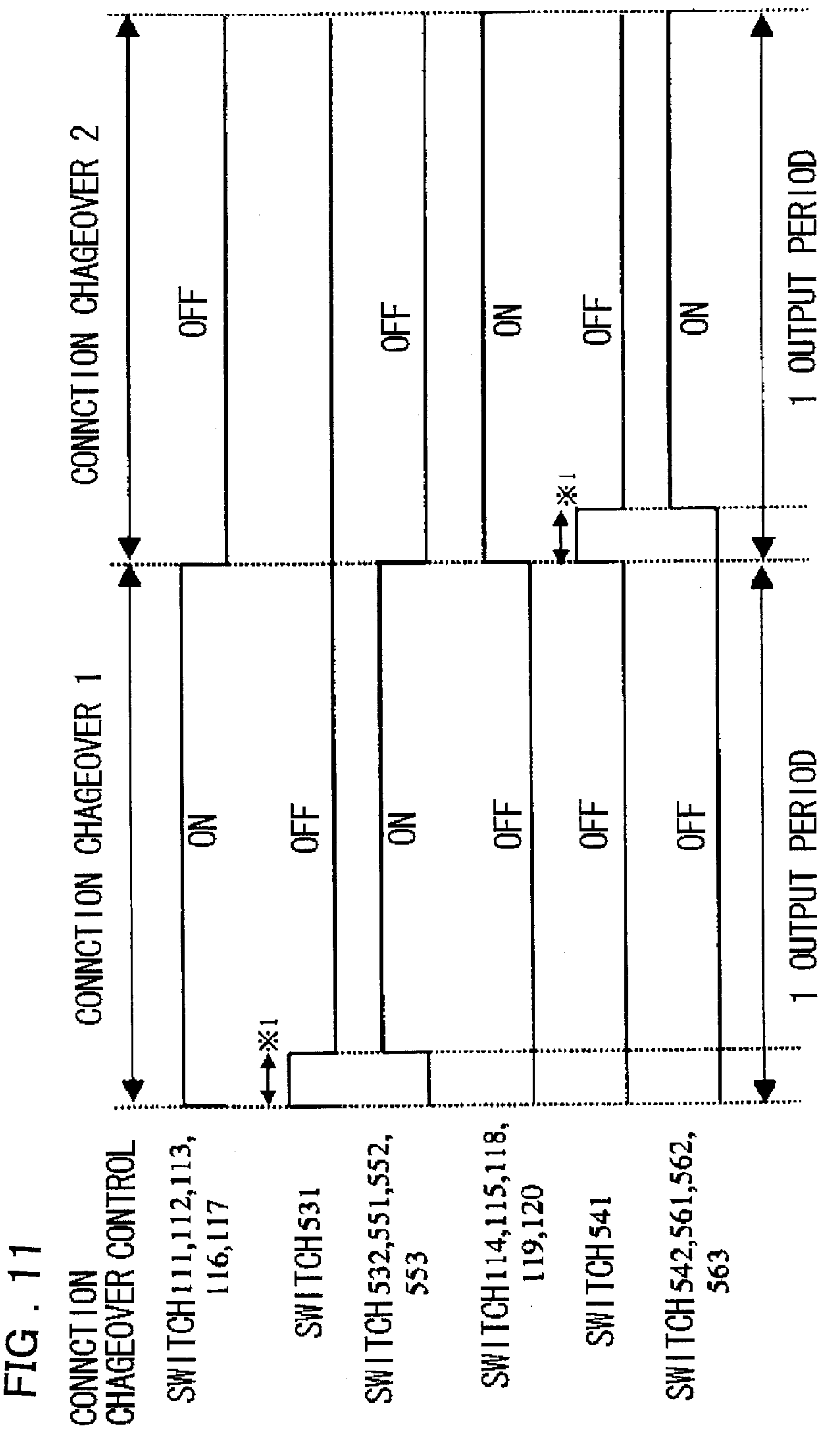
FIG. 11 is a timing diagram showing switch control in the fifth embodiment of the present invention.

FIG. 11 shows an example of switch control during the output period of the connection changeover state 1, and the output period of connection changeover state 2, of the driver circuit shown in FIG. 10. The following describes the operation of the driver circuit in FIG. 10 with reference to FIG. 11.

First, during the output period of the connection changeover state 1, the switches 111, 112, 113, 116, and 117 of the differential circuit are turned on and the switches 114, 115, 118, 119, and 120 are turned off.

At the start of the output period, the switch 531 of the reset circuit 530 is turned on to pre-charge the output 3 of the differential circuit to the high-potential power supply voltage VDD for a sufficiently short reset period.

Then, the switch 531 is turned off to end the reset period and, after that, the switches 532, 551, 552, and 553 are turned on to activate the amplification stage 310. At this time, when the input terminal voltage Vin is Vin>Vout, the output of the differential circuit decreases and the p-channel transistor 311 is turned on, making it possible to quickly increase the output terminal voltage Vout to the input terminal voltage Vin with the high charging power.

When the input terminal voltage Vin is Vin<Vout, the voltage of the output 3 of the differential circuit increases, the p-channel transistor 311 is turned off, and the discharging operation of the circuit 410 is started to decrease the output terminal voltage Vout to the input terminal voltage Vin.

The source follower discharging circuit 410 performs the source follower discharge operation. Therefore, as the voltage difference between the input terminal voltage Vin and the output terminal voltage Vout becomes larger, the discharge power increases and, as the output terminal voltage Vout approaches the input terminal voltage Vin, the discharge power decreases.

The source follower discharge operation of the source follower discharging circuit 410 is performed immediately and instantaneously according to the voltage difference between Vin and Vout. Therefore, even if the high-speed charge operation of the p-channel transistor 311 causes an overshoot because of the response delay of the feedback configuration, the source follower discharging circuit 410 quickly suppresses the overshoot to stabilize the output terminal voltage Vout at Vin.

Therefore, the driver circuit shown in FIG. 10 eliminates the need for a phase compensating capacitor for stabilizing the output. Alternatively, the output may be stabilized simply by providing a phase compensating capacitor with a sufficiently small capacity.

On the other hand, during the output period of the connection changeover state 2, the switches 111, 112, 113, 116, and 117 of the differential circuit are turned off and the switches 114, 115, 118, 119, and 120 are turned on. At the start of the output period, the switch 541 of the reset circuit 540 is turned on to discharge the output 3 of the differential circuit to the low-potential power supply voltage VSS for a sufficiently short reset period.

Then, the switch 541 is turned off to end the reset period and, after that, the switches 542, 561, 562, and 563 are turned on to activate the amplification stage 320.

At this time, when the input terminal voltage Vin is Vin<Vout, the output of the differential circuit increases and the n-channel transistor 321 is turned on, making it possible to quickly decrease the output terminal voltage Vout to the input terminal voltage Vin with the high discharging power.

When the input terminal voltage Vin is Vin>Vout, the output of the output of the differential circuit decreases, the n-channel transistor 321 is turned off, and the charging operation of the source follower charging circuit 420 is started to increase the output terminal voltage Vout to the input terminal voltage Vin.

The source follower charging circuit 420 performs the source follower charge operation. Therefore, as the voltage difference between Vin and Vout becomes larger, the charge power increases and, as Vout approaches Vin, the charge power decreases. The source follower charge operation of the source follower charging circuit 420 is performed immediately and instantaneously according to the voltage difference between Vin and Vout. Therefore, even if the high-speed discharge operation of the n-channel transistor 321 causes an undershoot because of the response delay of the feedback configuration, the source follower charging circuit 420 quickly suppresses the undershoot to stabilize the output terminal voltage Vout at the input terminal voltage Vin.

Therefore, the driver circuit shown in FIG. 10 eliminates the need for a phase compensating capacitor for stabilizing the output. Alternatively, the output may be stabilized simply by providing a phase compensating capacitor with a sufficiently small capacity.

One of the major characteristic of the present invention is that there is no need for a phase compensating capacitor for stabilizing the output in the voltage follower configuration as described above. A phase compensating capacitor with a sufficiently small capacity is used only for shaping waveforms.

The reset circuits 530 and 540 have the effect of preventing output noises, which are generated before and after a connection changeover is made, according to the same principle as that of the driver circuit in FIG. 8. The switches 111, 112, 113, 116, and 117 of the differential circuit may be turned on synchronously with the switches 532, 551, 552, and 553. Similarly, the switches 114, 115, 118, 119, and 120 of the differential circuit may be turned on synchronously with the switches 542, 561, 562, and 563.

The driver circuit shown in FIG. 10 has the same output characteristic as those of the driver circuit in FIG. 5. Thus, even if the characteristic of a transistor pair of the differential circuit vary from the standard characteristic because of a problem with the fabrication process, the direction of variations in (Vin−Vout) in the connection changeover states 1 and 2 is the same and, even if a connection changeover is made, the deviation of variations in (Vin−Vout) can be reduced. Therefore, the driver circuit shown in FIG. 10 is suitable for an amplifier that amplifies the grayscale level of a liquid crystal display device.

Figure 12:
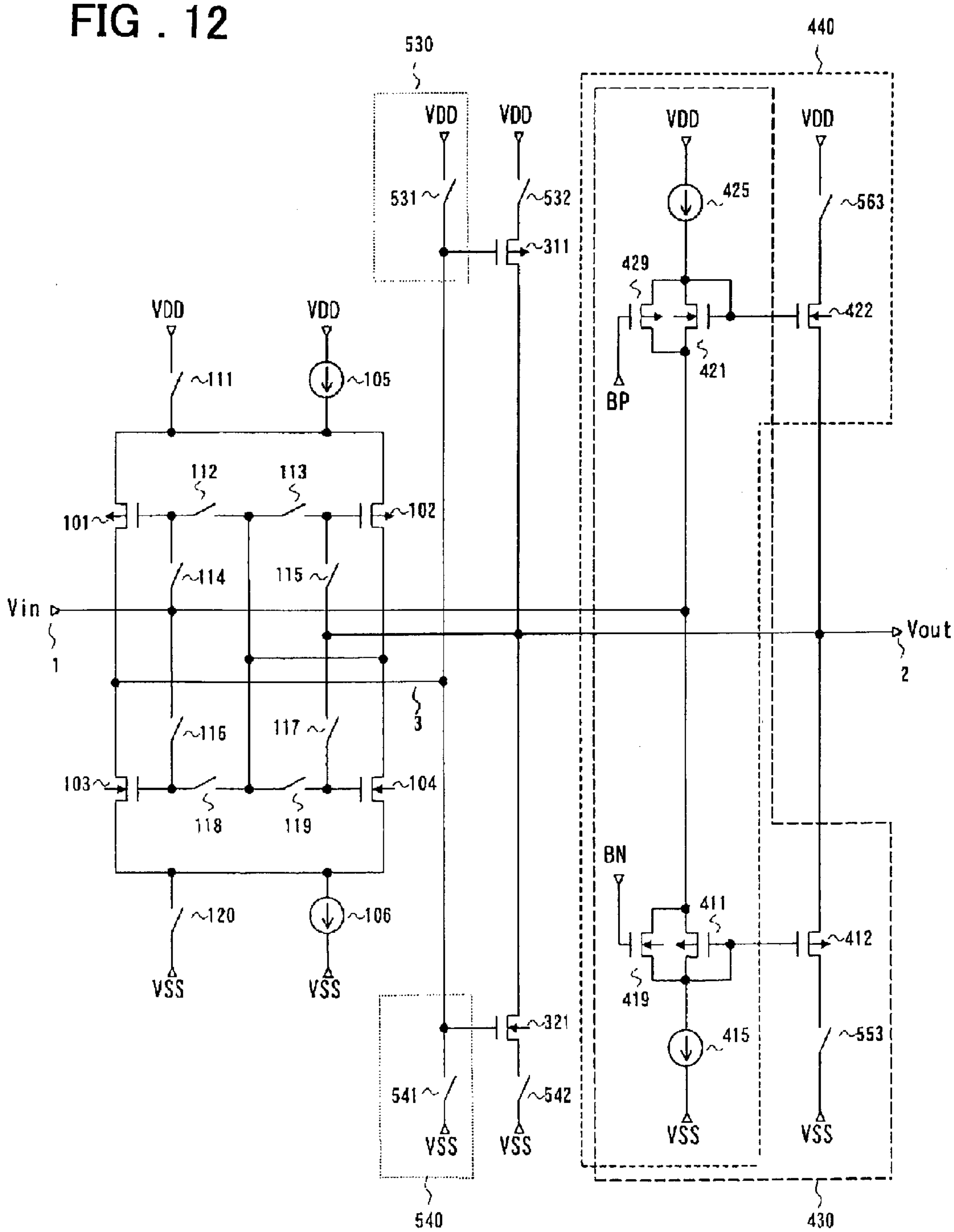
FIG. 12 is a diagram showing the configuration of a modification of the fifth embodiment of the present invention.

FIG. 12 is a diagram showing a modification of the driver circuit shown in FIG. 10. For the configuration in FIG. 12 other than that of the differential circuit, the details are described in the publication (with the application number of priority 2001-373302 based on patent application number 2000-402079). FIG. 12 shows the configuration including less devices than those in the configuration shown in FIG. 10, wherein the circuit 410 in FIG. 10 is replaced by a circuit 430 and wherein the circuit 420 in FIG. 10 is replaced by a circuit 440. The other configuration is similar to that in FIG. 10.

In FIG. 12, the same reference numerals of devices shown in FIG. 10 performing the same operation denote the same structural elements. In FIG. 12, a transistor 419, whose drain and source are connected respectively to the drain and source of the transistor 411, and a transistor 429, whose source and drain are connected respectively to the source and drain of the transistor 421, are added, and predetermined bias voltages BN and BP are applied to the gates of the transistors 419 and 429.

Figure 13:
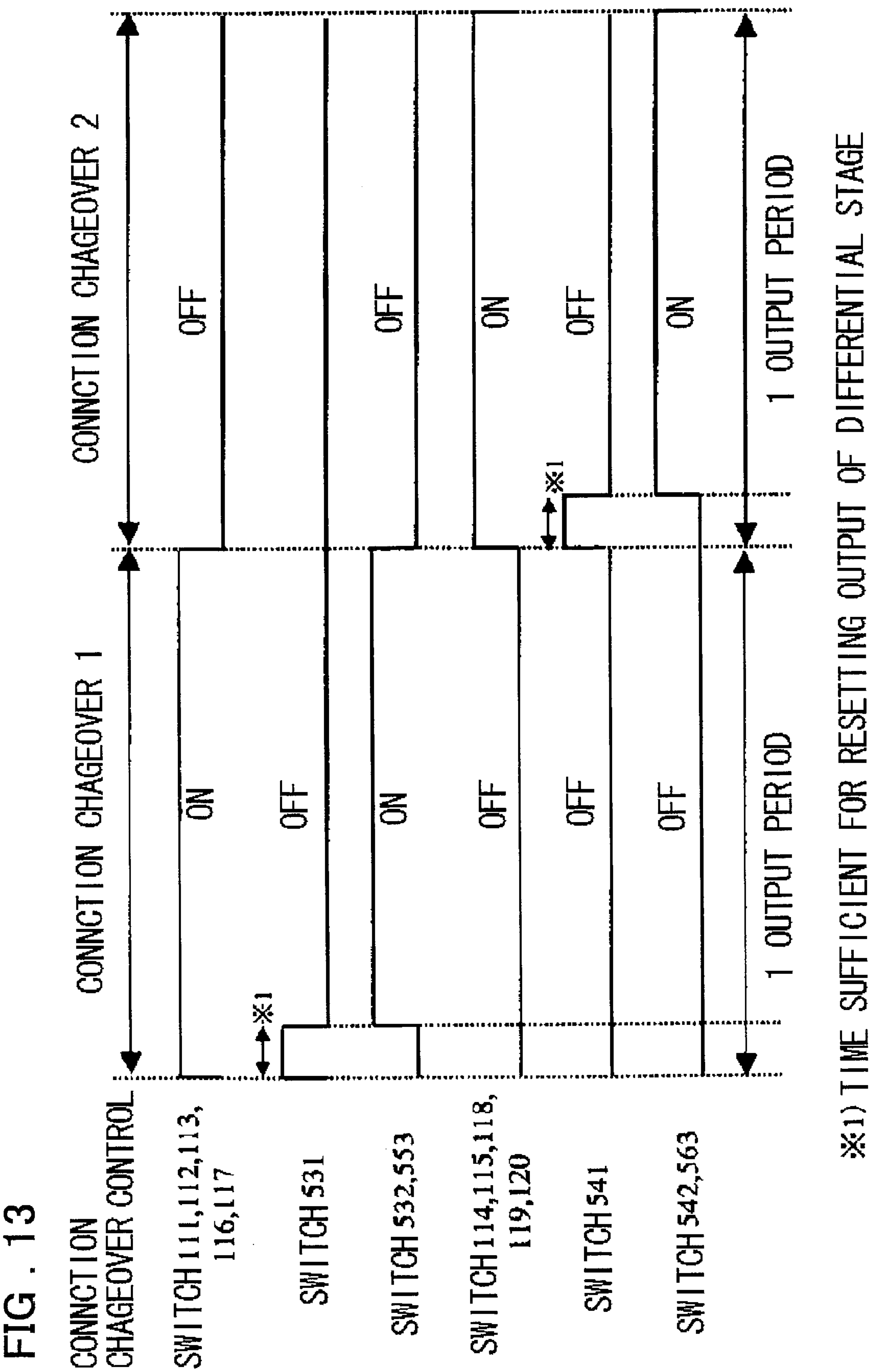
FIG. 13 is a timing diagram showing switch control in a sixth embodiment of the present invention.

FIG. 13 shows an example of switch control during the output period of the connection changeover state 1, and the output period of connection changeover state 2, of the driver circuit shown in FIG. 12. The description of the control and operation of the reset circuits 530 and 540 is omitted because those circuits are the same as those in FIGS. 10 and 11, and processing performed after the end of the reset period will be described below. During the output period of the connection changeover state 1, the switches 532 and 553 are turned on after the reset period to activate the p-channel transistor 311 and the circuit 430. At this time, the bias voltage BN is controlled so that the transistor 419 is turned off and the bias voltage BP is controlled so that the current controlled by a current source 425 flows between the high-potential power supply VDD and the input terminal 1. This makes the circuit 430 equivalent to the circuit 410 in FIG. 10. On the other hand, during the output period of the connection changeover state 2, the switches 542 and 563 are turned on after the reset period to activate the n-channel transistor 321 and the circuit 440. At this time, the bias voltage BP is controlled so that the transistor 429 is turned off and the bias voltage BN is controlled so that the current controlled by a current source 415 flows between the low-potential power supply VSS and the input terminal 1. This makes the circuit 440 equivalent to the circuit 420 in FIG. 10. Therefore, the driver circuit in FIG. 12 has the same performance as that of the driver circuit in FIG. 10.

Figure 17:
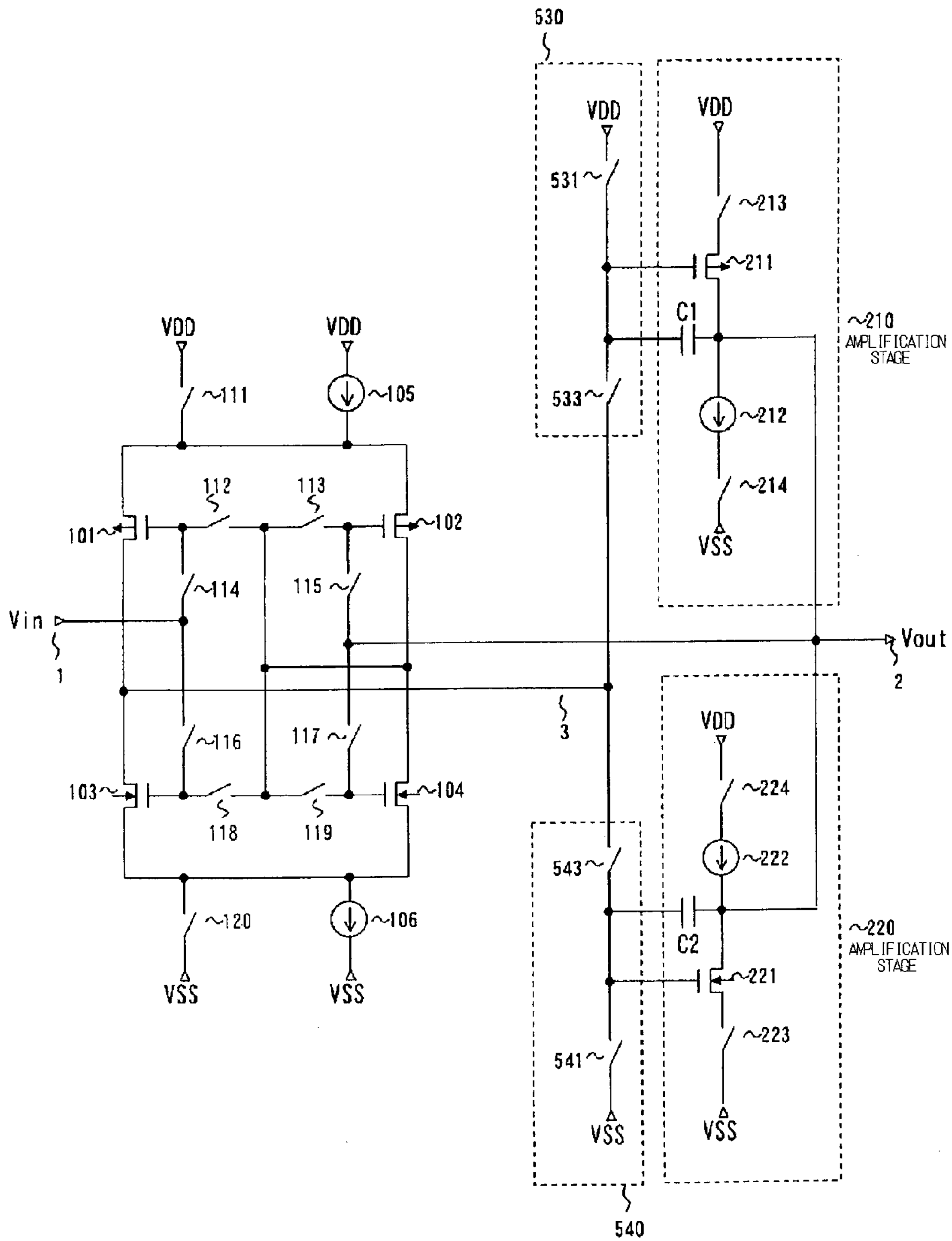
FIG. 17 is a diagram showing a modification of the fourth embodiment of the present invention.

The following gives an additional description of the reset circuits 530 and 540 shown in FIGS. 8, 10, and 12. The reset circuits 530 and 540 that reset the output 3 of the differential circuit may have a configuration other that that in which the switches 531 and 541 shown in FIGS. 8, 10, and 12 are provided. FIG. 17 is a diagram showing a modification of the amplifier circuit in the fourth embodiment shown in FIG. 8 wherein the reset circuits 530 and 540 have a different configuration. Except for the configuration of the reset circuits 530 and 540, the circuit configuration shown in FIG. 17 is the same as that shown in FIG. 8.

Referring to FIG. 17, the reset circuit 530 comprises a switch 531 inserted between the high-potential power supply VDD and the connection point between the gate of the transistor 211 and one end of the capacitor C1; and a switch 533 inserted between the connection point, which is between the gate of the transistor 211 and one end of the capacitor C1, and the output terminal 3 of the differential circuit. On the other hand, the reset circuit 540 comprises a switch 541 inserted between the low-potential power supply VSS and the connection point between the gate of the transistor 221 and one end of the capacitor C2; and a switch 543 inserted between the connection point, which is between the gate of the transistor 221 and one end of the capacitor C2, and the output terminal 3 of the differential circuit. The switches 533 and 543 reset the output 3 of the differential circuit at the time of charge/discharge changeover made by the on/off changeover of the switches 531 and 541 to prevent an unwanted voltage fluctuation in the output terminal voltage Vout at charge/discharge changeover time.

Figure 18:
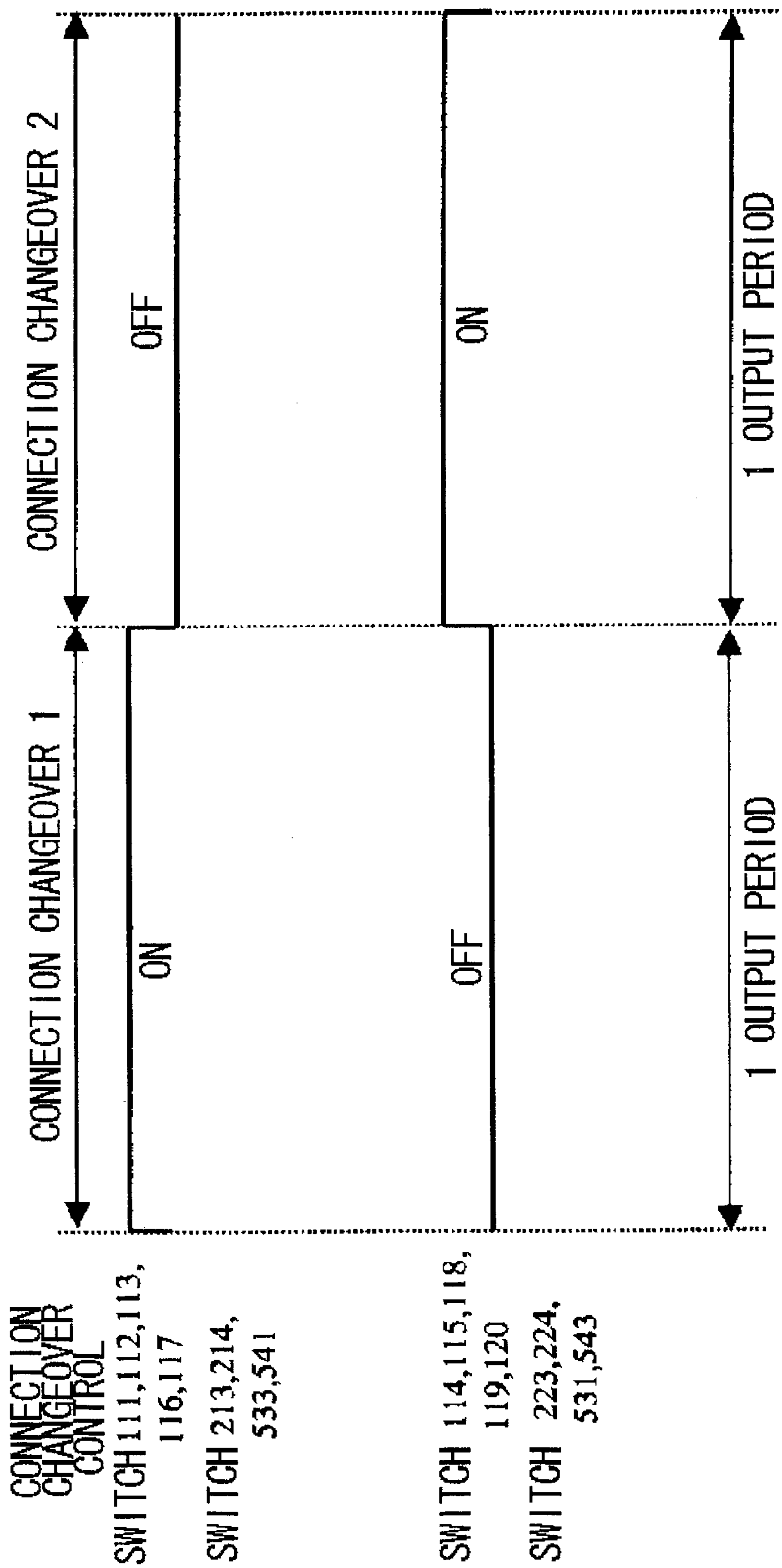
FIG. 18 is a timing diagram showing switch control in the modification of the fourth embodiment of the present invention.

FIG. 18 is a timing diagram describing the operation and function of the reset circuit and shows the on/off control operation times of the switches 111–120, 213–214, 531, 533, 541, and 543 in FIG. 17. For the switches 111–120 of the differential circuit, the description is omitted because they are controlled as described in FIG. 9.

Referring to FIG. 18, the switches 213, 214, 533, and 541 are turned on and the switches 223, 224, 531, and 543 are turned off in the connection changeover state 1. This enables the amplification stage 210 to perform the charge operation. At this time, the amplification stage 220 is deactivated, and the gate of the transistor 221 and the capacitor C2 are discharged to the low-potential power supply VSS.

On the other hand, the switches 213, 214, 533, and 541 are turned off and the switches 223, 224, 531, and 543 are turned on in the connection changeover state 2. This enables the amplification stage 220 to perform the discharge operation. At this time, the amplification stage 210 is deactivated, and the gate of the transistor 211 and the capacitor C1 are charged to the high-potential power supply VDD.

When the connection changeover state 1 is changed to the connection changeover state 2 (switch 543 is turned on and switch 541 is turned off), the voltage of the output terminal 3 of the differential circuit and the gate of the transistor 221 is once decreased to the vicinity of the low-potential power supply voltage VSS by the capacitor C2 that was discharged to the low-potential power supply VSS when the circuit was in the connection changeover state 1 and, after that, the discharge operation is started according to the input terminal voltage Vin. Therefore, the operation of the amplification stage 220 is not affected by the potential of the output terminal 3 of the differential circuit before the changeover to the connection changeover state 2 but is quickly started from the inactive state with no noise generated.

When the connection changeover state 2 is changed to the connection changeover state 1 (switch 533 is turned on and switch 531 is turned off), the voltage of the output terminal 3 of the differential circuit and the gate of the transistor 211 is once increased to the vicinity of the high-potential power supply voltage VDD by the capacitor C1 that was charged to the high-potential power supply VDD when the circuit was in the connection changeover state 2 and, after that, the charge operation is started according to the input terminal voltage Vin. Therefore, the operation of the amplification stage 210 is not affected by the potential of the output terminal 3 of the differential circuit before the changeover to the connection changeover state 1 but is quickly started from the inactive state with no noise generated.

In addition, the reset circuits 530 and 540 in FIG. 17 control the switches of the reset circuit synchronously with the switches of the differential circuit as shown in FIG. 18. This decreases the number of control signals.

Because both the switch 213 and the switch 531 deactivate the transistor 211, the switch 213 may be removed with the source of the transistor 211 connected directly to the high-potential power supply VDD. Similarly, both the switch 223 and the switch 541 deactivate the transistor 221, the switch 223 may be removed with the source of the transistor 221 connected directly to the low-potential power supply VSS.

As described above, the reset circuits 530 and 540 in FIG. 17 use the capacitors C1 and C2 respectively to prevent output noises from being generated before and after the connection state changeover. A reset circuit similar to the one shown in FIG. 17 may also be applied to a driver circuit shown in FIG. 10 and FIG. 12 when a capacitor with an appropriate capacity is connected to the gate of the transistors 311 and 321. Alternatively, even if a waveform-shaping capacitor is not provided, a reset circuit similar to the one shown in FIG. 17 may be used also when the size of the transistors 211 and 221 is large and the gate capacity is relatively large.

FIG. 14 is a diagram showing a sixth embodiment of the present invention and showing an example of a multiple-output driver circuit configured by the driver circuit according to the present invention. This embodiment may be used as the driver circuit of a liquid crystal display device. The driver circuits described in the embodiments shown in FIGS. 5, 8, 10, 12, and so on may be used as an output circuit 100. The control signal controls the switches of each driver circuit. This embodiment, in which an analog grayscale level voltage is output from a tap of the voltage dividing resistor provided between the reference voltages VH and VL, comprises decoders 300, output terminals 400, and output stages 100. The decoder 300 selects a grayscale level voltage from a plurality of grayscale level voltages, generated from the terminals (taps) of a resistor string 200, according to the video digital signal for each output, and the output circuit 100 amplifies the voltage to drive the data lines connected to the output terminals 400. Even if a changeover is made between the differential circuit composed of an n-channel differential circuit pair and the differential circuit composed of a p-channel differential circuit pair in the output circuit 100, the direction of an output offset caused by variations in the device characteristic may be set in the same direction to minimize the amplitude difference deviation, thus increasing the display image quality.

Although the differential circuit and the amplifier circuit (driver circuit) described in the above embodiments are composed of MOS transistors, the driver circuit of a liquid crystal display device may also be composed of poly-silicon MOS transistors (TFT). Of course, the differential circuit described in the above embodiments may be applied to bipolar transistors. In this case, the p-channel transistors 101 and 102 in the high-potential power supply side comprise pnp transistors, while the n-channel transistors 103 and 104 in the low-potential power supply side comprise npn transistors. Although the configuration in which two pairs of transistors are switched between the differential circuit pair and the current mirror in an integrated circuit is described in the above embodiments, it is to be easily understood that the configuration may also be applied to a discrete device configuration.

Still another embodiments of the present invention will be described with reference to the drawings to describe more in detail the embodiments of the present invention described above.

FIG. 19 is a diagram showing the configuration of a driver circuit in a fifth embodiment of the present invention. This driver circuit is configured by adding, in parallel to the input side transistor (transistor receiving the input signal voltage) of a differential pair of a voltage-follower circuit, a transistor which has the same conductive type as that of the input side transistor and whose gate receives a bias voltage BN.

Referring to FIG. 19, a feedback-type amplifier circuit in the fifth embodiment of the present invention comprises a differential circuit, which comprises a current mirror circuit composed of PMOS (p-channel MOS) transistors 211 and 212, a differential pair composed of a pair of NMOS (n-channel MOS) transistors 213 and 214, a current source 215, and an NMOS transistor 216 whose control terminal receives the bias voltage BN and which is connected in parallel to the transistor 213; and an amplification stage 310. That is, the amplifier circuit comprises the n-channel MOS transistors 213 and 214 whose sources are tied together to one end of the constant-current source 215 and whose gates receive the input terminal voltage Vin and the output terminal voltage Vout respectively to compose a differential pair; and p-channel MOS transistors 211 and 212 whose sources are connected to the high-potential power supply VDD, whose gates are connected, and whose drains are connected to the drains of the MOS transistors 213 and 214, wherein the MOS transistor 212 have its drain and gate connected and, in conjunction with the MOS transistor 211, composes a current mirror that functions as an active load of the differential pair. The embodiment of the present invention further comprises the NMOS transistor 216 wherein the drain and the source are connected to the drain and source of the NMOS transistor 213 whose gate receives the voltage Vin of an input terminal 1 and wherein the gate receives the bias voltage BN.

A connection node connecting the output side of the current mirror circuit (drain of the transistor 211) and the transistor 213 is connected to the amplification stage 310 as an output 3 of the differential circuit to cause the amplification stage 310 to vary the output terminal voltage Vout according to the output 3 of the differential circuit. That is, the common connection node connecting the drains of the transistors 213 and 216 which are connected in parallel and the drain of the transistor 211 that is the output node of the current mirror is connected to the gate of a transistor 311, the source of the transistor 311 is connected to the high-potential power supply VDD, the drain of the transistor 311 is connected to an output terminal 2 and is connected to the low-potential power supply VSS via a constant-current source 312.

The amplification stage 310 may be configured in various ways. FIG. 19 shows the simplest configuration of the amplification stage 310 that comprises the PMOS transistor 311 which has a control terminal for receiving the output from the differential circuit, has a source connected to the high-potential power supply VDD, and has a drain connected to the output terminal; and the constant-current source 312 provided between the output terminal and low-potential power supply VSS.

The operation of the differential amplifier circuit (driver circuit) shown in FIG. 19 will be described below. For simplicity, it is assumed that the differential pair transistors 213 and 214 and the transistor 216 have the identical characteristic and that the bias voltage BN is a constant voltage higher than the threshold voltage of the transistor 213.

In FIG. 19, as the voltage Vin of the input terminal 1 rises in the operation region of the differential pair, the drain current of the NMOS transistor 213 increases and the output voltage 3 falls. This increases the drain current (charging current) from the PMOS transistor 311 of the amplification stage 310, and the output terminal voltage Vout of the output terminal 2 rises in phase with the input terminal voltage Vin. Conversely, as the input terminal voltage Vin falls, the output terminal voltage Vout falls. That is, the gate terminal of the NMOS transistor 213 of the differential pair is connected to the non-inverting input terminal (+) of the differential circuit. The gate terminal of the NMOS transistor 214 of the differential pair is connected to the inverting input terminal (−), and the differential amplifier circuit shown in FIG. 19 is configured as a voltage follower.

Figure 20:
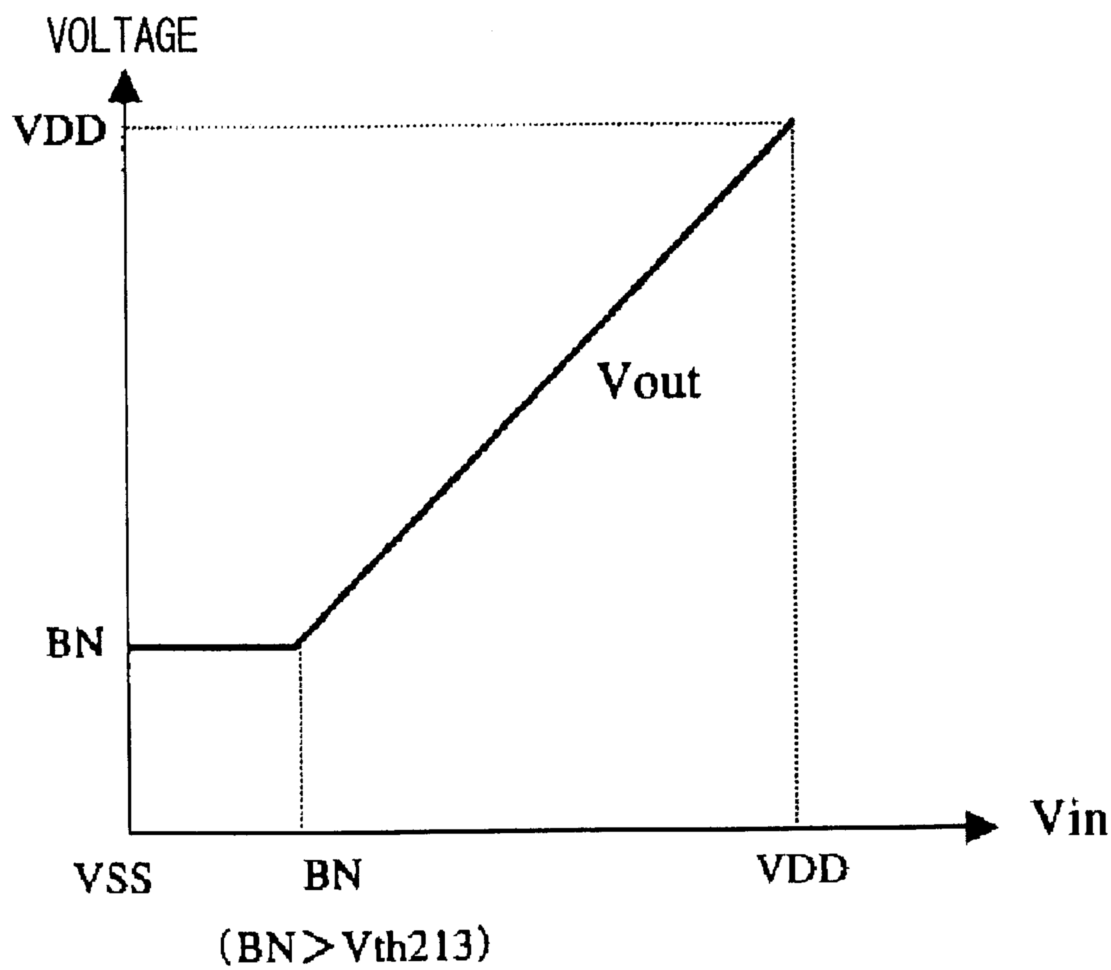
FIG. 20 is a diagram showing the operation of the fifth embodiment of the present invention.

FIG. 20 is a diagram showing the output characteristic of the differential amplifier circuit (driver circuit) shown in FIG. 19 in relation to the input terminal voltage Vin. Referring to FIG. 19 and FIG. 20, when the voltage level of the input terminal voltage Vin is lower than a threshold voltage of the transistor 213, the output terminal voltage Vout becomes the bias voltage BN because the transistor 213 is off while the transistor 216 is on (the bias voltage BN is higher than the threshold voltage Vt).

As the input terminal voltage Vin becomes higher than the threshold voltage of the transistor 213, the transistor 213 is turned on but, while the input terminal voltage Vin is equal to or lower than the bias voltage BN, a larger amount of current flows through the transistor 216, allowing the drain current of the transistor 216 to primarily control the change in the output of the differential circuit. This causes the output terminal voltage Vout to be maintained near the bias voltage BN.

As the input terminal voltage Vin becomes equal to or higher than the bias voltage BN, a larger amount of current flows through the transistor 213, allowing the drain current of the transistor 213 to primarily control the change in the output of the differential circuit and thus making the output terminal voltage Vout equal to the input terminal voltage Vin.

As the input terminal voltage Vin further increases when the input terminal voltage Vin is equal to or higher than the bias voltage BN, the potential of the sources of the differential pair transistors 213 and 214, which are coupled together, also increases. As a result, at a voltage at which the input terminal voltage Vin is higher than the bias voltage BN, the gate-source voltage VGS 216 of the transistor 216 becomes equal to lower than the threshold voltage Vt of the transistor 216 and the transistor 216 is turned off (the drain current of the transistor 216 does not flow). As described above, the driver circuit in FIG. 19 operates as shown in FIG. 20, that is, when the input terminal voltage Vin is equal to or lower than the bias voltage BN Vout=BN and when the input terminal voltage Vin is equal to or higher than the bias voltage BN, Vout=Vin.

When the output terminal voltage Vout>Vin at the drive start time, the driver circuit in FIG. 19 drives the voltage by the constant discharge power of the current source 312 as follows:

Vout=BN or Vin

When the output terminal voltage Vout<Vin at the drive start time, the driver circuit speedily drives the voltage by the charge operation of the transistor 311 as follows:

Vout=BN or Vin

Figure 21:
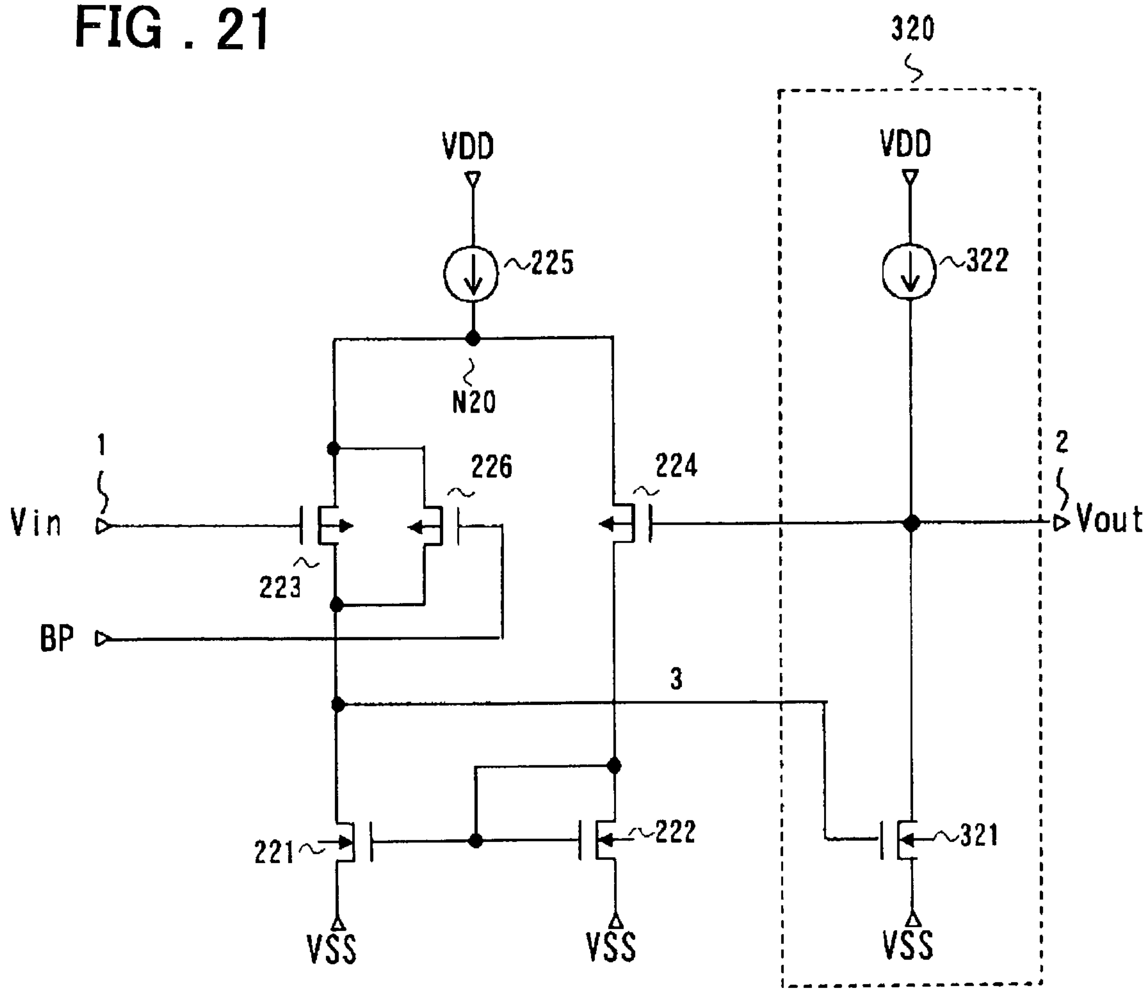
FIG. 21 is a diagram showing the configuration of a sixth embodiment of the present invention.

Next, another embodiment of the present invention will be described. FIG. 21 is a diagram showing the configuration of a sixth embodiment of the present invention. This circuit also has a transistor 226 which is in parallel to the input side transistor of a differential pair, which has the same type of conductivity as that of the input side transistor, and whose gate receives a bias voltage BP. More specifically, this feedback-type amplifier circuit, shown in FIG. 21, comprises a differential circuit, which comprises a current mirror circuit composed of NMOS transistors 221 and 222, a differential pair composed of a pair of PMOS transistors 223 and 224, a current source 225, and an NMOS transistor 226 whose control terminal (gate terminal) receives the bias voltage BP and which is connected in parallel to the transistor 223; and an amplification stage 320.

The configuration of the circuit shown in FIG. 21 is similar to the one shown in FIG. 19 except that the polarity of the differential pair is exchanged. That is, the circuit comprises the p-channel MOS transistors 223 and 224 whose sources are tied together to one end of the constant-current source 225 and whose gates receive the input terminal voltage Vin and the output terminal voltage Vout respectively to form a differential pair; and n-channel MOS transistors 221 and 222 whose sources are connected to the low-potential power supply VSS, whose gates are connected, and whose drains are connected to the drains of the MOS transistors 223 and 224, wherein the MOS transistor 222 have its drain and the gate connected and, in conjunction with the MOS transistor 221, forms a current mirror to function as the active load of the differential pair. This embodiment of the present invention further comprises the PMOS transistor 226 wherein the drain and the source are connected to the drain and source of the PMOS transistor 223 whose gate receives the voltage Vin of the input terminal 1 and wherein the gate receives the bias voltage BP.

The connection node connecting the output side of the current mirror circuit (drain of the transistor 221) and the transistor 223 is connected to the amplification stage 320 as an output 3 of the differential circuit to cause the amplification stage 320 to vary the output terminal voltage Vout according to the output 3 of the differential circuit. That is, the common connection node connecting the drains of the transistors 223 and 226 connected in parallel and the drain of the transistor 221 that is the output node of the current mirror is connected to the gate of a transistor 321, the source of the transistor 321 is connected to the low-potential power supply VSS, the drain of the transistor 321 is connected to the output terminal 2 and is connected to the high-potential power supply VDD via a constant-current source 322.

Figure 22:
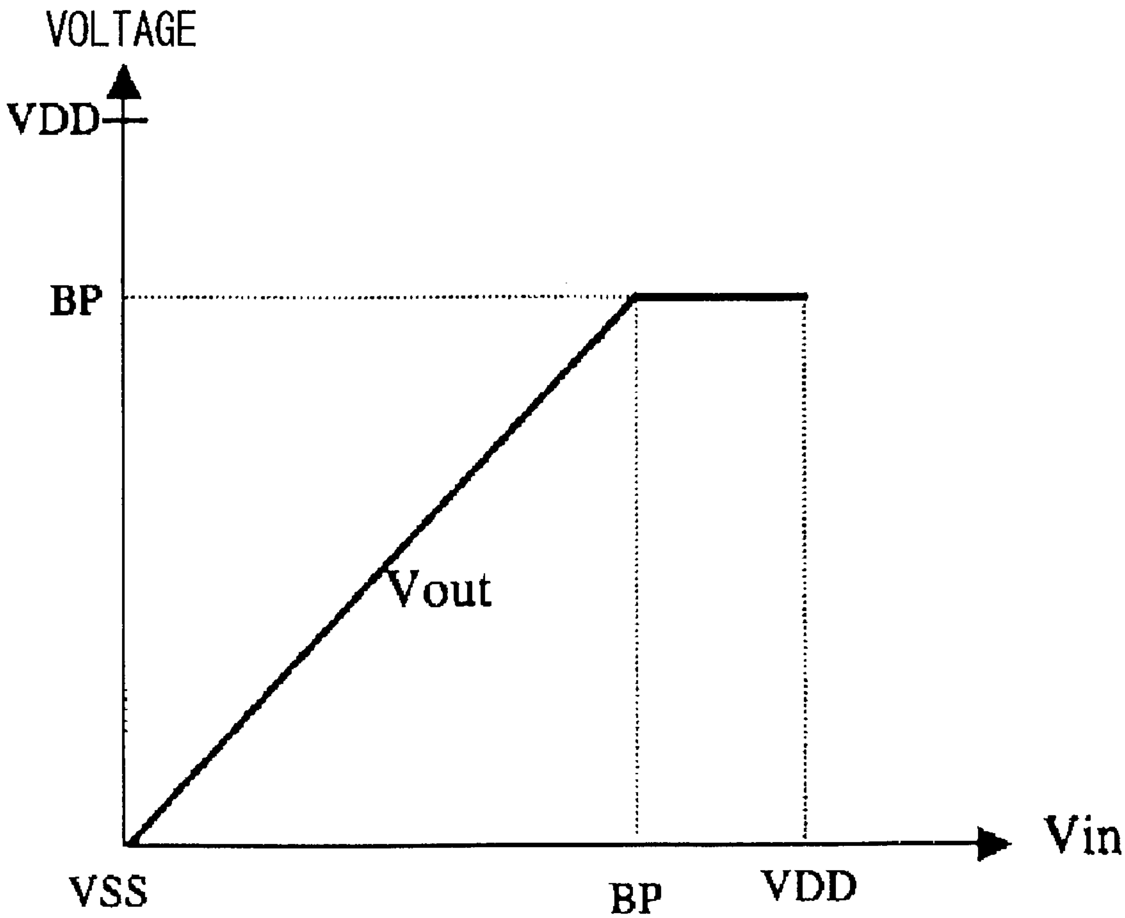
FIG. 22 is a diagram showing the operation of the sixth embodiment of the present invention.

FIG. 22 is a diagram showing the operation of the embodiment. In the description below, it is assumed that the differential transistors pair 223 and 224 and the transistor 226 have the same characteristic and that the bias voltage BP is a constant voltage wherein the potential difference between the bias voltage BP and the high-potential power supply VDD (VDD−BP) is larger than the absolute value of the threshold voltage of the transistor 223. Referring to FIGS. 21 and 22, when the voltage level of the input terminal voltage Vin is within the range of the value calculated by subtracting the absolute value of the threshold voltage Vth 233 of the transistor 223 from the high-potential power supply VDD, the output terminal voltage Vout becomes the bias voltage BP because the transistor 223 is turned off but the transistor 226 is turned on (the bias voltage BP is lower than VDD−|Vth233|; VDD−BP>|Vth233|).

As the input terminal voltage Vin becomes lower than VDD−|Vth233|, the transistor 223 is turned on, but while the input terminal voltage Vin is equal to or higher than the bias voltage BP, a larger amount of current flows through the transistor 226, allowing the drain current of the transistor 226 to primarily control the change in the output of the differential circuit. This causes the output terminal voltage Vout to be maintained near the bias voltage BP.

As the input terminal voltage Vin becomes equal to or lower than the bias voltage BP, a larger amount of current flows through the transistor 223, allowing the drain current of the transistor 223 to primarily control the change in the output of the differential circuit and thus making the output terminal voltage Vout equal to the input terminal voltage Vin.

As the input terminal voltage Vin further falls while the input terminal voltage Vin is equal to or lower than the bias voltage BP, the potential of the sources of the differential pair transistors 223 and 224, which are coupled together, also falls. As a result, at a voltage at which the input terminal voltage Vin is lower than the bias voltage BP, the gate-source voltage of the transistor 226 becomes equal to lower than the absolute value of the threshold voltage |Vth226|and the transistor 226 is turned off. As described above, the driver circuit in FIG. 21 operates as shown in FIG. 22, that is, when the input terminal voltage Vin is equal to or higher than the bias voltage BP Vout=BP and when the input terminal voltage Vin is equal to or lower than the bias voltage BP, Vout=Vin.

When the output terminal voltage Vout<Vin at the drive start time, the driver circuit in FIG. 21 drives the voltage by the constant charge power of the current source 322 as follows:

Vout=BP or Vin

When the output terminal voltage Vout>Vin at the drive start time, the driver circuit speedily drives the voltage by the discharge operation of the transistor 321 as follows:

Vout=BP or Vin

Next, a seventh embodiment of the present invention will be described. FIG. 23 is a diagram showing the configuration of the seventh embodiment of the present invention. Referring to FIG. 23, there is shown a driver circuit with a configuration in which the input terminal and the output terminal of the driver circuit shown in FIG. 19 are connected to the input terminal and the output terminal of the driver circuit shown in FIG. 21 and in which a voltage equal to the input terminal voltage Vin is output as Vout. Referring to FIG. 23, a differential circuit 210 and an amplification stage 310 correspond to the differential circuit 210 and the amplification stage 310 shown in FIG. 19, and a differential circuit 220 and an amplification stage 320 correspond to the differential circuit 220 and the amplification stage 320 shown in FIG. 21. A switch 511 is provided between a constant-current source 215 of the differential circuit 210 and the low-potential power supply VSS, the source of a transistor 311 of the amplification stage 310 is connected to the high-potential power supply VDD via a switch 531, and a constant-current source 312 is connected to the low-potential power supply VSS via a switch 532. A switch 521 is provided between a constant-current source 225 of the differential circuit 220 and the high-potential power supply VDD, the source of a transistor 321 of the amplification stage 320 is connected to the low-potential power supply VSS via a switch 541, and a constant-current source 322 is connected to the high-potential power supply VDD via a switch 542.

FIG. 24 is a diagram showing an example of on/off control of the switches 511, 531, 532, 521, 541, and 542 in the driver circuit shown in FIG. 23 and showing an example of control of switches for speedily driving any voltage in any order. That is, FIG. 24 shows one data drive period in which a voltage is driven to a high-potential voltage, and one data drive period in which a voltage is driven to a low-potential voltage level, when the voltage is driven within the power supply voltage range.

One data drive period is composed of two stages of drive period: first drive period and second drive period. FIG. 24 shows only the first drive period and the second drive period. The boundary Vm between the low voltage level and the high voltage level within the power supply voltage range is set in a range equal to or higher than the voltage BN and equal to or lower than the voltage BP. It is assumed that the voltages BN and BP are the voltages that are applied under the same condition as that in FIGS. 19 and 21.

Referring to FIGS. 23 and 24, the operation of the driver circuit in the third embodiment of the present invention will be described.

As shown in FIG. 24, when the input terminal voltage Vin is at a high voltage level (Vin is equal to or higher than Vm), the switches 511, 531, and 532 are turned off and the switches 521, 541, and 542 are turned on first in the first drive period to activate the differential circuit 220 and the amplification stage 320 and, in the second drive period, the switches 511, 531, and 532 are turned on and the switches 521, 541, and 542 are turned off to activate the differential circuit 210 and the amplification stage 310. That is, the operation is equivalent to the operation in which the driver circuit in FIG. 21 is activated in the first drive period and the driver circuit in FIG. 19 is activated in the second drive period.

Therefore, referring to FIG. 20 and FIG. 22 showing the output characteristic of the driver circuit in FIG. 19 and FIG. 21, if the output terminal voltage Vout>Vin at the drive start time in the first drive period, the NMOS transistor 321 of the amplification stage 320 starts operation to speedily drive the output terminal voltage Vout to the input terminal voltage Vin or lower (Vout=Vin when Vm≦Vin≦Bp, and Vout=BP when BP≦Vin<VDD). If the output terminal voltage Vout<Vin at the drive start time, the NMOS transistor 321 of the amplification stage 320 is turned off and the charge operation of the constant-current source 322 is performed. However, regardless of the extent of the charge operation, the output terminal voltage Vout remains equal to or lower than the input terminal voltage Vin. That is, in the first drive period, the output terminal voltage Vout is speedily driven to the voltage equal to or lower than the input terminal voltage Vin regardless of the voltage level of the output terminal voltage Vout at the drive start time.

Because the output terminal voltage Vout is equal to or lower than the input terminal voltage Vin at the end of the first drive period, the PMOS transistor 311 of the amplification stage 310 is activated in the second drive period to speedily drive the output terminal voltage Vout to Vout=Vin for the input terminal voltage Vin (Vm≦Vin<VDD) at the high voltage level.

As shown in FIG. 24, when the input terminal voltage Vin is at a low voltage level (Vin is equal to or lower than Vm), the switches 511, 531, and 532 are turned on and the switches 521, 541, and 542 are turned off first in the first drive period to activate the differential circuit 210 and the amplification stage 310 and, in the second drive period, the switches 511, 531, and 532 are turned off and the switches 521, 541, and 542 are turned on to activate the differential circuit 220 and the amplification stage 320. That is, the operation is equivalent to the operation in which the driver circuit in FIG. 19 is activated in the first drive period and the driver circuit in FIG. 21 is activated in the second drive period.

Therefore, referring to FIG. 20 and FIG. 22 showing the output characteristic of the driver circuit in FIG. 19 and FIG. 21, if the Vout<Vin at the drive start time in the first drive period, the PMOS transistor 311 of the amplification stage 310 starts operation to speedily drive the output terminal voltage Vout to Vin or higher (Vout=BN when VSS<Vin≦BN, and Vout=Vin when BN≦Vin≦Vm). If the output terminal voltage Vout>Vin at the drive start time, the PMOS transistor 311 of the amplification stage 310 is turned off and the discharge operation of the constant-current source 312 is performed. However, regardless of the extent of the discharge operation, the output terminal voltage Vout remains equal to or higher than the input terminal voltage Vin. That is, in the first drive period, the output terminal voltage Vout is speedily driven to the voltage equal to or higher than the input terminal voltage Vin regardless of the voltage level of the output terminal voltage Vout at the drive start time.

Because the output terminal voltage Vout is equal to or higher than the input terminal voltage Vin at the end of the first drive period, the NMOS transistor 321 of the amplification stage 320 is activated in the second drive period to speedily drive the output terminal voltage Vout to Vout=Vin for the input terminal voltage Vin (VSS<Vin≦Vm) at the low voltage level.

As described above, in one data drive period at the high voltage level and at the low voltage level, the output terminal voltage Vout can be speedily driven to a voltage equal to Vin regardless of the potential of the output terminal voltage Vout at the drive start point.

In addition, because the high-speed drive described above is executed by the operation of the PMOS transistor 311 or the NMOS transistor 321, the drive speed is not affected even if the current controlled by the current sources 312 and 322 is reduced to a sufficiently small amount. Therefore, the low-power, high-speed drive is possible. This is another advantage of the present invention.

By appropriately changing over the control of the high-voltage level and the low-voltage level shown in FIG. 24 according to the level of the input terminal voltage Vin, any voltage within the power supply voltage range may be driven speedily in any order.

More specifically, in case where the grayscale voltage level is specified by the digital video input signals and so on, switch control corresponding to the high-voltage level or the low-voltage level may be easily controlled by the digital signals.

In the example shown in FIG. 24, only one of two pairs, that is, a pair of differential circuit 210 and the amplification stage 310 and a pair of the differential circuit 220 and the amplification stage 320, is activated is shown to reduce power consumption. However, if there is no problem with power consumption, both the pair of the differential circuit 210 and the amplification stage 310 and the pair of the differential circuit 220 and the amplification stage 320 may be activated in the second drive period. In this case, however, the gate bias voltage must be appropriately controlled to prevent the operation of the transistors 216 and 226 from affecting the operation in which the Vout is driven to Vin (Vout=Vin).

FIG. 25 is a diagram showing an example of on/off control of the switches 511, 531, 532, 521, 541, and 542 of the driver circuit shown in FIG. 23. This example improves the embodiment shown in FIG. 24 to reduce power consumption.

As described above with reference to FIG. 24, when the input terminal voltage Vin is at a high-voltage level (Vin is Vm or higher), the output terminal voltage Vout need only be driven to Vin or lower in the first drive period and, when the input terminal voltage Vin is at a lower-voltage level (Vin is Vm or lower), the output terminal voltage Vout need only be driven to Vin or higher in the first drive period.

Therefore, in the example shown in FIG. 25, when the input terminal voltage Vin is at a high-voltage level, the switch 542 remains off in the first drive period. When the input terminal voltage Vin is at a low-voltage level, the switch 532 remains off in the first drive period. The state of other switches is the same as that shown in the example show in FIG. 24.

This switch on/off control cuts off the current of the current sources 322 and 312 respectively in the first drive periods to reduce power consumption.

Turning off the switches 542 and 532 results in a slight undershoot or overshoot because of a feedback response delay in the first drive period at a low-voltage level and at a high-voltage level. However, this condition does not generate any problem because the voltage is speedily driven to Vout=Vin in the second period.

For easy understanding of the examples shown in FIG. 24 and FIG. 25, the four typical waveform patterns of output voltage signal Vout are shown in FIG. 26 to FIG. 29. Assume that one output period is composed of the first drive period and the second drive period in FIG. 26 to FIG. 29. Also assume that the first drive period starts immediately after the preceding output period in which the voltage is driven to Vout=Vin. Vin shows only the level that changes from the preceding output period.

Figure 26:
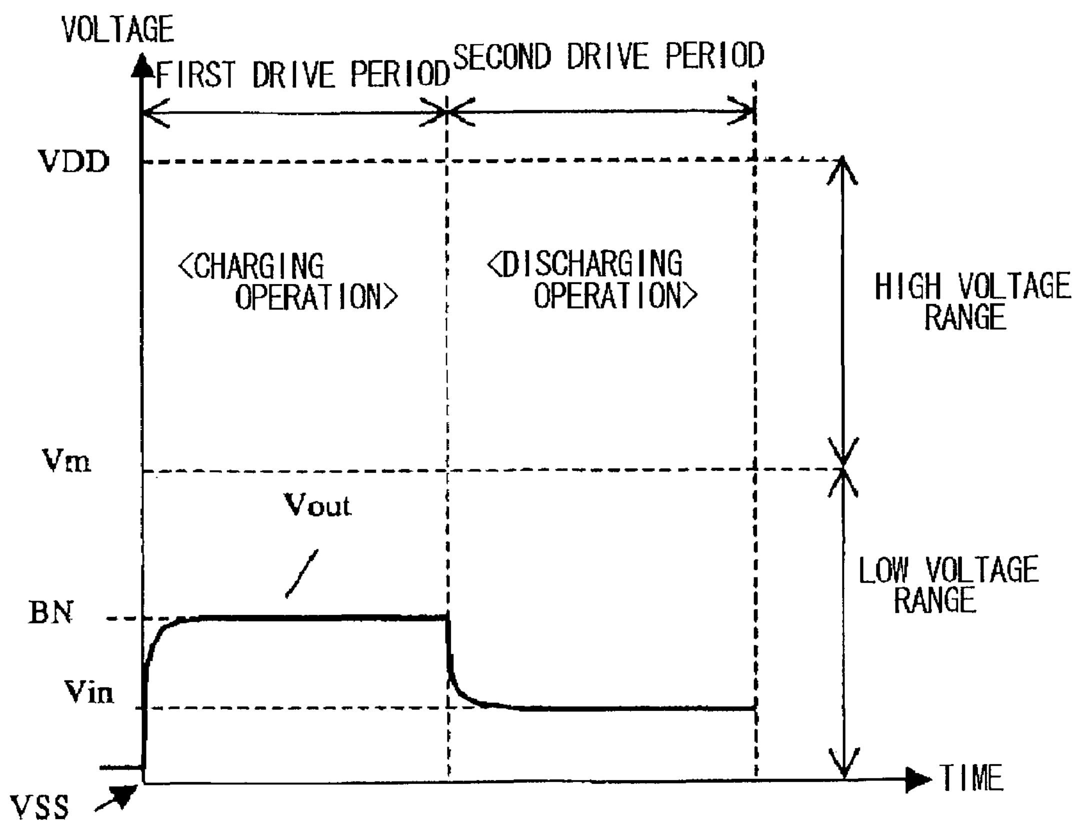
FIG. 26 is a diagram showing an example of the waveform of an output terminal voltage in the seventh embodiment of the present invention.

FIG. 26 shows a drive waveform pattern generated when the input terminal voltage Vin is at a low-voltage level lower than the bias voltage BN but higher than the voltage in the preceding output period.

In the first drive period, though the differential circuit 210 and amplification stage 310 are activated, Vout is once increased to the voltage BN by the operation of the transistor 216 even if Vin is lower than the threshold voltage of the transistor 213.

In this case, Vout=BN under the control shown in FIG. 24. Under the control shown in FIG. 25, Vout is at a voltage slightly overshooting the voltage BN.

In the second drive period, the differential circuit 220 and the amplification stage 320 are activated to do the discharge operation to speedily drive Vout to Vin (Vout=Vin).

Figure 27:
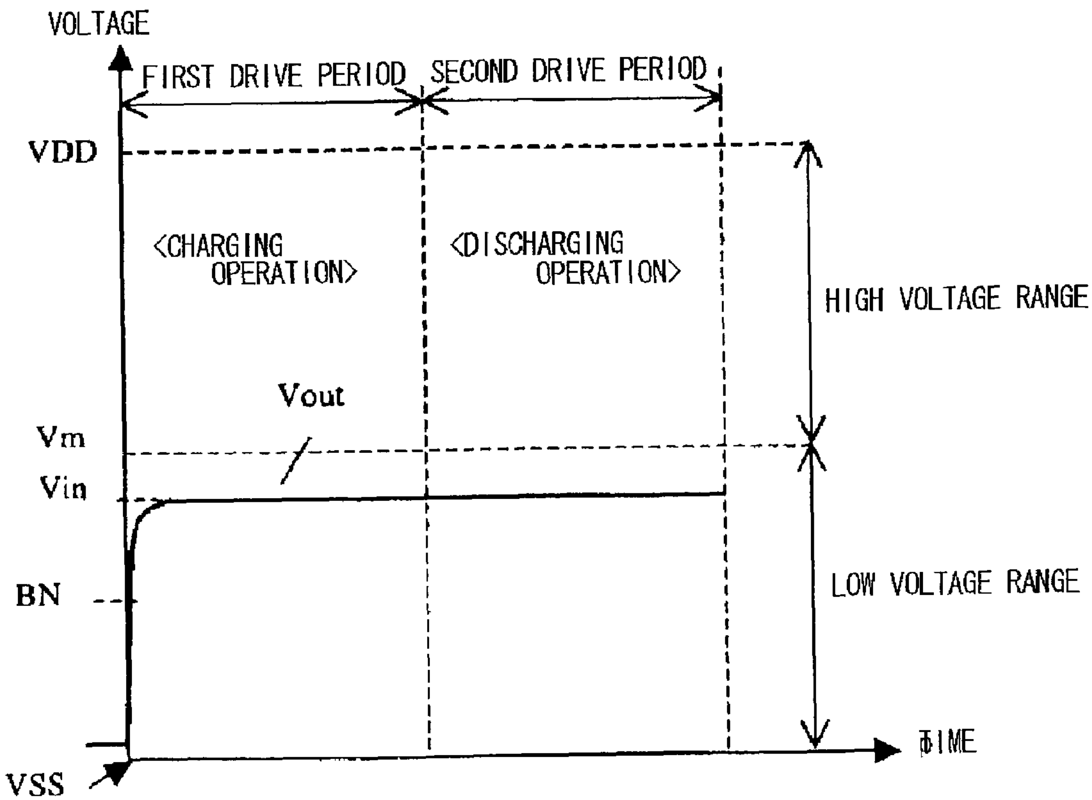
FIG. 27 is a diagram showing an example of the waveform of an output terminal voltage in the seventh embodiment of the present invention.

FIG. 27 shows a drive waveform pattern generated when the input terminal voltage Vin is at a low-voltage level higher than the bias voltage BN and higher than the voltage in the preceding output period. In the first drive period, the differential circuit 210 and the amplification stage 310 are activated to perform the charging operation to speedily raise Vout to a voltage near Vin.

In this case, under the control shown in FIG. 24, Vout=Vin. Under the control shown in FIG. 25, the output terminal voltage Vout is at a voltage slightly overshooting the input terminal voltage Vin.

In the second drive period, the differential circuit 220 and the amplification stage 320 are activated to perform the discharging operation to speedily drive Vout to Vin (Vout=Vin).

Figure 28:
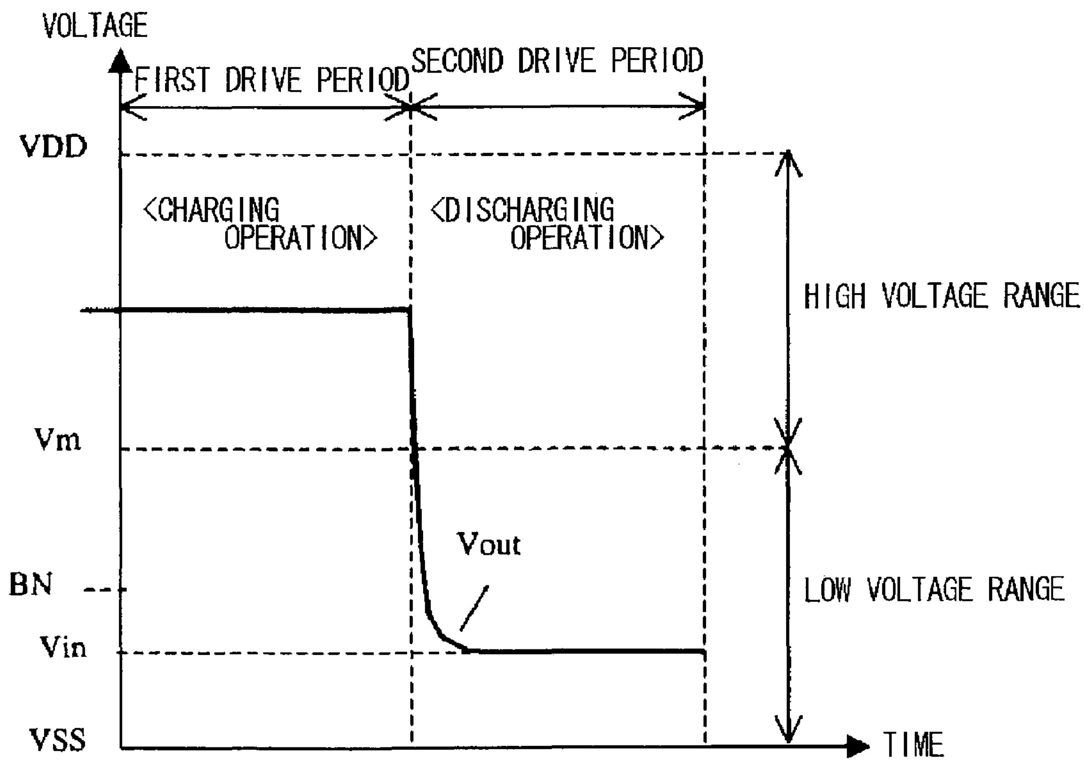
FIG. 28 is a diagram showing an example of the waveform of an output terminal voltage in the seventh embodiment of the present invention.

FIG. 28 shows a drive waveform pattern generated when the input terminal voltage Vin changes from the high-voltage level in the preceding output period to a low-voltage level lower than the bias voltage BN.

In the first drive period, the differential circuit 210 and the amplification stage 310 are activated but the output terminal voltage Vout does not change significantly from the voltage in the preceding output period. In this case, under the control shown in FIG. 24, the current source 312 is activated and the output terminal voltage Vout is slightly decreased by the constant discharge power.

Under the control shown in FIG. 25, the current source 312 is not activated and the output terminal voltage Vout remains at a voltage in the preceding output period.

In the second drive period, the differential circuit 220 and the amplification stage 320 are activated, and the discharging operation speedily drives Vout to Vin (Vout=Vin).

Figure 29:
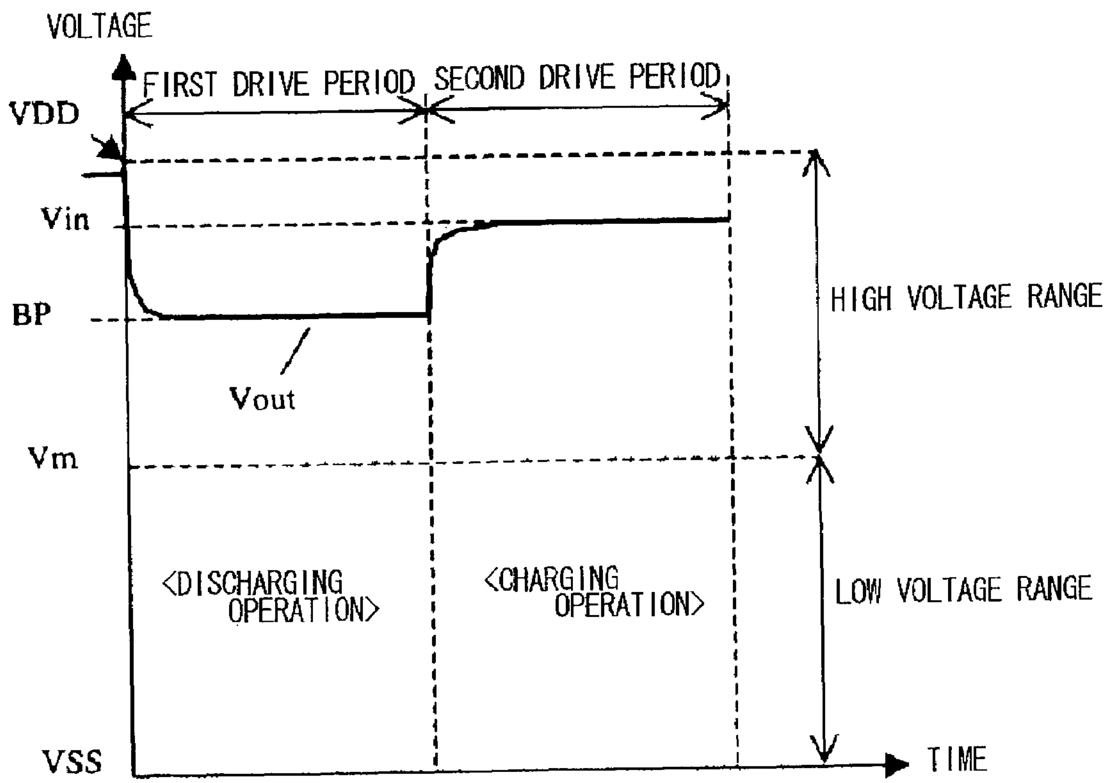
FIG. 29 is a diagram showing an example of the waveform of an output terminal voltage in the seventh embodiment of the present invention.

FIG. 29 shows a drive waveform pattern generated when Vin is at a high-voltage level higher than the bias voltage BP but lower than the voltage in the preceding output period.

In the first drive period, the differential circuit 220 and the amplification stage 320 are activated. Even at a Vin level at which the transistor 223 is turned off, the output terminal voltage Vout is once decreased to the voltage BP by the operation of the transistor 226.

In this case, under the control shown in FIG. 24, Vout=BP. Under the control shown in FIG. 25, the output terminal voltage Vout is at a voltage slightly undershooting the voltage BP.

In the second drive period, the differential circuit 210 and the amplification stage 310 are activated, and Vout is speedily driven to Vout=Vin by the charging operation.

As described above, through the on/off control of the switches shown in FIG. 24 or FIG. 25, the driver circuit shown in FIG. 23 can speedily drive any voltage within the power supply voltage in any order. A circuit for generating control signals for controlling the changeover of the switches shown in FIG. 24 and FIG. 25 may be provided on a chip other than that of the driver circuit shown in FIG. 23 or may be provided on the same chip or substrate.

FIG. 30 is a diagram showing the configuration of a eighth embodiment of the present invention and showing a modification of the driver circuit in FIG. 23. Referring to FIG. 30, the driver circuit in this embodiment is configured by replacing the current source 312 and the switch 532 of the amplification stage 310 in FIG. 23 with a circuit 41 and by replacing the current source 322 and the switch 542 of the amplification stage 320 in FIG. 23 with a circuit 42. The other configuration is the same as that shown in FIG. 23. The same device number as that used in FIG. 23 is used for the same component in FIG. 23. A circuit 11 is a circuit created by removing the current source 312 and the switch 532 from the differential stage 210 and the amplification stage 310 in FIG. 23, while a circuit 12 is a circuit created by removing the current source 322 and the switch 542 from the differential stage 220 and the amplification stage 320 in FIG. 23.

As with the configuration shown in FIG. 23, each of the two differential circuits shown in FIG. 30 also has a transistor, 216 and 226, which is in parallel to the transistor, 213 and 223, in the input side (Vin side) of the differential pair, whose gate bias voltage is controlled, and which has the same polarity with that of the input side transistor, respectively.

The circuit 41 comprises a diode-connected PMOS transistor 411 which receives the input terminal voltage Vin at the source; and a PMOS transistor 412 whose source is connected to the output terminal 2, whose gate is connected to the gate of the PMOS transistor 411, and whose drain is connected to the low-potential power supply VSS via a switch 553. The circuit 41 further comprises a current source 413 and a switch 551 connected in series between the source of the PMOS transistor 411 and the high-potential power supply VDD; and a current source 414 and a switch 552 connected in series between the drain of the PMOS transistor 411 and the low-potential power supply VSS.

The following briefly describes the operation of the circuit 41. The operation of the circuit 41 is controlled by the switches 551, 552, and 553. When the switches are on, the circuit is operable; when the switches are off, the circuit stops.

In the operable state of the circuit 41, when the PMOS transistors 411 and 412 have the same transistor characteristic and when the current sources 413 and 414 control the same amount of current, the gate voltage of the transistors 411 and 412 is shifted from the input terminal voltage Vin by the gate-source voltage. When Vin<Vout at this time, the gate-source voltage of the PMOS transistor 412 is higher than the threshold voltage and the discharging operation of the PMOS transistor 412 caused by the source follower operation brings down the output terminal voltage Vout.

As the output terminal voltage Vout decreases, the gate-source voltage of the PMOS transistor 412 decreases until it reaches a point where the discharging current of the PMOS transistor 412 balances with the charging current of the PMOS transistor 311 in the circuit 11 and then stabilizes at that point. In this case, if the circuit 11 and the circuit 41 are designed so that the current sources 413 and 414 control a sufficiently small amount of current equal to the charging current of the PMOS transistor 311 when Vout=Vin, the discharging current by the PMOS transistor 412 balances with the charging current by the PMOS transistor 311 when Vout=Vin and the output terminal voltage Vout stabilizes.

Conversely, when Vin>Vout, the gate-source voltage of the PMOS transistor 412 becomes lower than that when Vout=Vin and therefore the discharging operation becomes inactive. When the gate-source voltage of the PMOS transistor 412 becomes equal to or lower than the threshold voltage, the discharging operation completely stops. Therefore, the charging operation of the PMOS transistor 311 in the circuit 11 becomes dominant, and the output terminal voltage Vout is increased by the circuit 11 to the input terminal voltage Vin.

As described above, when Vout>Vin, the circuit 41 actively performs the discharging operation and, as Vout approaches Vin, the circuit inactivates the discharging operation to stabilize the output terminal voltage Vout to the input terminal voltage Vin. Therefore, when an overshoot is generated by a feedback response delay due to the circuit parasitic capacitance during the charging operation of the circuit 11 that is in the feedback configuration, the circuit 41 speedily decreases the output terminal voltage Vout to the input terminal voltage Vin. Therefore, as compared with the driver circuit in FIG. 23 that uses the constant-current source 312 that has constant discharge ability, the circuit described above quickly performs drive and quickly stabilizes the operation.

On the other hand, the circuit 42 comprises a diode-connected NMOS transistor 421 that receives the input terminal voltage Vin at the source; and an NMOS transistor 422 whose source is connected to the output terminal 2, whose gate is connected to the gate of the NMOS transistor 421, and whose drain is connected to the high-potential power supply VDD via a switch 563. The circuit 42 further comprises a current source 423 and a switch 561 connected in series between the source of the NMOS transistor 421 and the low-potential power supply VSS; and a current source 424 and a switch 562 connected in series between the drain of the NMOS transistor 421 and the high-potential power supply VDD.

The following briefly describes the operation of the circuit 42. The operation of the circuit 42 is controlled by the switches 561, 562, and 563. When the switches are on, the circuit is operable; when the switches are off, the circuit stops.

In the operable state of the circuit 42, when the NMOS transistors 421 and 422 have the same transistor characteristic and when the current sources 423 and 424 control the same amount of current, the gate voltage of the transistors 421 and 422 is shifted from the input terminal voltage Vin by the gate-source voltage. When Vin>Vout at this time, the gate-source voltage of the NMOS transistor 422 is higher than the threshold voltage and the charging operation of the NMOS transistor 422 caused by the source follower operation thereof raises the output terminal voltage Vout.

As the output terminal voltage Vout rises, the gate-source voltage of the NMOS transistor 422 decreases until it reaches a point where the charging current by the NMOS transistor 422 balances with the discharging current by the NMOS transistor 321 in the circuit 12 and then stabilizes at that point. In this case, if the circuit 12 and the circuit 42 are designed so that the current sources 423 and 424 control a sufficiently small amount of current equal to the discharging current by the NMOS transistor 321 when Vout=Vin, the charging current by the NMOS transistor 422 balances with the discharging current by the NMOS transistor 321 when Vout=Vin and the output terminal voltage Vout stabilizes.

Conversely, when Vin<Vout, the gate-source voltage of the NMOS transistor 422 becomes lower than that when Vout=Vin and therefore the charging operation becomes inactive. When the gate-source voltage of the NMOS transistor 422 becomes equal to or lower than the threshold voltage, the charging operation completely stops. Therefore, the discharging operation of the NMOS transistor 321 in the circuit 12 becomes dominant, and the output terminal voltage Vout is decreased by the circuit 12 to the input terminal voltage Vin.

As described above, when Vout<Vin, the circuit 42 actively performs the charging operation and, as Vout approaches Vin, the circuit inactivates the charging operation to stabilize the output terminal voltage Vout to the input terminal voltage Vin. Therefore, when an undershoot is generated by a feedback response delay due to the circuit parasitic capacitance during the discharging operation of the circuit 12 that is in the feedback configuration, the circuit 42 speedily increases the output terminal voltage Vout to the input terminal voltage Vin. Accordingly, as compared with the driver circuit in FIG. 23 that uses the constant-current source 322 that has constant charge ability, the circuit described above quickly performs drive and quickly stabilizes the operation.

FIG. 31 is a diagram showing an example of switch control method by which the driver circuit shown in FIG. 30 speedily drives any voltage in any order. In FIG. 31, the switches 551, 552, and 553 and the switches 561, 562, and 563, which control the operation of the circuits 41 and 42, are controlled in the same way the switches 532 and 542 shown in FIG. 24 are controlled. Other switches are also controlled in the same way they are controlled as shown in FIG. 24. Therefore, the operation performed according to the control in FIG. 13 is the same as the operation performed according to the control in FIG. 24.

That is, as in the switch control method in FIG. 24, the switch control method in FIG. 31 speedily drives the output terminal voltage Vout to a voltage equal to Vin in one data drive period at the high-potential voltage level and at the low-potential voltage level, respectively, regardless of the potential of Vout at drive start time. Other effects may also be achieved as in the example shown in FIG. 24.

FIG. 32 shows an example of switch control improved from that shown in FIG. 31 to save power consumption. In FIG. 32, the switches 551, 552, and 553 and the switches 561, 562, and 563, which control the operation of the circuits 41 and 42, are controlled in the same way the switches 532 and 542 in FIG. 25 are controlled. Other switches are also controlled as in the example shown in FIG. 25.

When the input terminal voltage Vin is at a high-potential voltage level, the switches 561, 562, and 563 remain off and the circuit 42 is deactivated in the first drive period. When Vin is at a low-potential voltage level, the switches 551, 552, and 553 remain off and the circuit 41 is deactivated in the first drive period. The control of other switches is the same as that shown in the example in FIG. 31.

The switch on/off control described above cuts off the internal current in the circuit 42 or the circuit 41 in the first drive period when the input terminal voltage Vin is at a high-potential level or at a low-potential level, respectively. This control requires power less than that required in the switch control shown in FIG. 31.

Turning off the switches 561, 562, and 563 and switches 551, 552, and 553 results in a slight undershoot or overshoot because of a feedback response delay in the first drive period at a low-voltage level and at a high-voltage level. However, this condition does not generate any problem because the voltage is speedily driven to Vout=Vin in the second period.

Therefore, the operation in the example shown in FIG. 32 is the same operation under control of the switches shown in FIG. 25. That is, the example of the switch control shown in FIG. 32 requires less power than that required by the switch control shown in FIG. 31. A circuit for generating control signals for controlling the switches shown in FIG. 31 and FIG. 32 may be provided separately from the driver circuit shown in FIG. 30 or may be provided on the same chip.

Next, a display device in an embodiment of the present invention will be described. FIG. 14 is a diagram showing the configuration of buffer circuits 100 of the data driver of a liquid crystal display device implemented by the circuits shown in FIGS. 19, 21, 23, and 30. Referring to FIG. 14, the driver comprises a resistor string 200 connected between a power supply VH and a power supply VL, decoders 300 (selection circuits), output terminals 400, and buffer circuits 100 (output circuits). The decoder 300 selects a grayscale level voltage from a plurality of grayscale level voltages, generated by the terminals (taps) of the resistor string 200, according to the video digital signal for each output, and the buffer circuit 100 amplifies the voltage to drive the data line connected to the output terminal 400. The circuits in the embodiments described with reference to FIGS. 19, 21, 23, and 30 may be applied to the buffer circuit 100. The operation control signal controls the on/off control of the switches in the buffer circuit 100.

Figure 33:
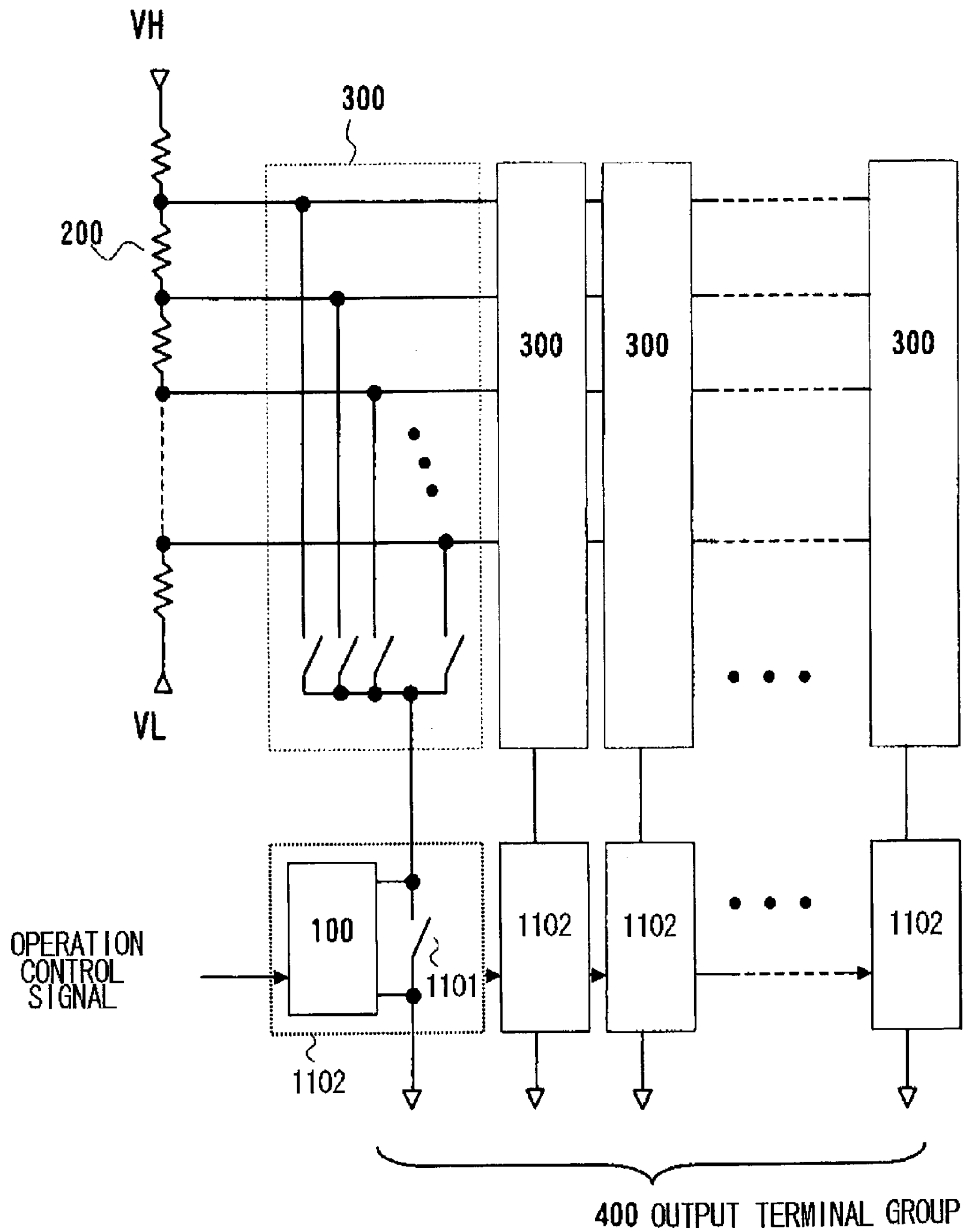
FIG. 33 is a diagram showing a modification of the ninth embodiment of the present invention.

FIG. 33 is a diagram showing a modification of the embodiment shown in FIG. 14. Referring to FIG. 33, in the configuration shown in FIG. 14 further are provided a switch 1101 that controls the connection between the input and the output of the buffer circuit 100. When the devices in the buffer circuit 100 greatly vary in the characteristic, the voltage is speedily increased by the buffer circuit 100 to a desired voltage level and then the buffer circuit 100 is stopped to turn on the switch 101 to allow the electric charge to be supplied directly from the resistor string 200 to drive the data line.

Although the examples are shown in FIGS. 19, 21, 23, and 30 in which the current mirror circuit is provided as the load of the differential transistor pair driven by the current source, the load of the differential transistor pair may also be a resistor device. Although the differential circuit and the amplifier circuit (driver circuit) described in the above embodiments are composed of MOS transistors, the driver circuit of a liquid crystal display device may also be composed, for example, of poly-silicon MOS transistors (TFT). Of course, the differential circuit described in the above embodiments may be applied to bipolar transistors. In this case, the p-channel transistors in the high-potential power supply side, such as the current mirror circuit in FIG. 19 and the differential pair in FIG. 21, comprise pnp transistors, and the n-channel transistors in the low-potential power supply side, such as the differential pair in FIG. 19 and the current mirror circuit in FIG. 21, comprise npn transistors. Although applied to an integrated circuit in the above embodiments, the configuration may also be applied to a discrete device.

Although the present invention has been described above in connection with various preferred embodiments thereof, the embodiments are in no way to be considered as limiting the invention. Instead, various modifications and changes of equivalent techniques readily apparent to those skilled in the art upon reading the claims of the invention are also included.

The meritorious effects of the present invention are summarized as follows.

According to the present invention, even if the differential circuits with different polarities are changed over, the variations in the differential input voltages VinP and VinM (positive side, negative side) generated by variations in the device characteristic may be set in the same direction in the stable state as described above. This allows the direction of output offsets caused by variations in the device characteristic to be set in the same direction to suppress the amplitude difference deviation.

According to the present invention, a full range output is possible by controlling the changeover in such a way that, at high-potential voltage drive time, the n-channel transistor pair acts as a differential pair and the p-channel transistor pair acts as a current mirror circuit and, at low-potential voltage drive time, the p-channel transistor pair acts as a differential pair and the n-channel transistor pair acts as a current mirror circuit.

In addition, according to the present invention, the circuit is configured in such a way that one of two pairs of transistors is changed over to one of a differential pair and a current mirror and in such a way that the other pair to the other of the differential pair and the current mirror. This configuration reduces the circuit size and power consumption.

Furthermore, according to the present invention, the maximum of the amplitude difference deviation of an amplifier circuit is at least twice as large as the absolute value of the difference between the output offset at high-potential drive time and the output offset at low-potential drive time. Such an amplifier circuit, if used in the driver circuit of the data lines of a display device, could increase the display image quality.

According to the present invention, a transistor to which a predetermined bias voltage is applied, if arranged in parallel to a transistor receiving an input voltage of the differential stage of a differential circuit in the voltage-follower configuration, increases the input voltage range as described above.

According to the present invention, any level of voltage within the power supply voltage range may be speedily driven in any order in a driver circuit that outputs multiple levels of voltage.

According to the present invention, the switches are inserted into current paths of the circuit to control the activation and deactivation of the circuit. This simple circuit configuration reduces power consumption.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential circuit comprising:

a first pair of transistors, conductivity thereof being a first-type;

a second pair of transistors, conductivity thereof being a second-type, outputs of said first pair of transistors connected respectively to outputs of said second pair of transistors;

a first current source and a first switch, connected in parallel between commonly connected tails of said first pair of transistors and a first power supply;

a second current source and a second switch, connected in parallel between commonly connected tails of said second pair of transistors and a second power supply; and connection changeover means for changing over the first and second pairs of transistors between a differential pair driven by a current source and having a pair of inputs for receiving differential input voltages and a current mirror circuit having a pair of inputs coupled together, one transistor of said current mirror circuit being diode-connected, said current mirror circuit functioning as a load of said differential pair, wherein, when one pair of said first and second pairs of transistors is the differential pair, the other pair is the current mirror circuit.

2. A differential circuit comprising:

a first pair of transistors, conductivity thereof being a first-type;

a second pair of transistors, conductivity thereof being a second-type, drains of said first pair of transistors connected to drains of said second type of transistors respectively;

a first current source and a first switch, connected in parallel between commonly coupled sources of said first pair of transistors, and a first power supply; and a second current source and a second switch, connected in parallel between commonly coupled sources of said second pair of transistors, and a second power supply;

wherein said differential circuit takes either a first connection configuration in which said first pair of transistors compose a differential pair, having commonly coupled sources connected to said first power supply via said first current source and gates for receiving differential input voltages and in which said second pair of transistors compose a current mirror circuit, wherein said second pair of transistors have gates connected each other, and commonly coupled sources connected to said second power supply via said second switch, and a gate and a drain of one of said second pair of transistors are coupled together, or a second connection configuration in which said second pair of transistors compose a differential pair, having commonly coupled sources connected to said second power supply via said second current source and gates for receiving differential input voltages and in which said first pair of transistors compose a current mirror circuit, wherein said first pair of transistors have gates connected each other, and commonly coupled sources connected to said first power supply via said first switch, and a gate and a drain of one of said first pair of transistors are coupled together;

said differential circuit further comprising connection changeover means for controlling changeover from said first connection configuration to said second connection configuration and from said second connection configuration to said first connection configuration.

3. The differential circuit according to claim 1, wherein said first pair of transistors are composed by a pair of p-channel transistors, said second pair of transistors are composed by a pair of n-channel transistors, said first power supply is a high potential power supply, and said second power supply is a low potential power supply, and wherein said connection changeover means controls changeover so that said pair of n-channel transistors compose the differential pair and said pair of p-channel transistors compose the current mirror circuit at high-potential voltage drive time and so that said pair of p-channel transistors compose the differential pair and said pair of n-channel transistors compose the current mirror circuit at low-potential voltage drive time.

4. A differential circuit comprising:

first and second transistors, conductivity thereof being a first type, having sources coupled together;

third and fourth transistors, conductivity thereof being a second type, said third and fourth transistors having drains connected to drains of said first and second transistors and having sources coupled together;

a first switch and a first current source connected in parallel between a common connection node connecting the sources of said first and second transistors, and a first power supply;

a second switch and a second current source connected in parallel between a common connection node connecting the sources of said third and fourth transistors, and a second power supply;

third and fourth switches connected in series between gates of said first and second transistors;

fifth and sixth switches connected in series between gates of said third and fourth transistors;

a seventh switch inserted between a connection node connecting the gate of said first transistor and said third switch, and a first input terminal;

an eighth switch inserted between a connection node connecting the gate of said second transistor and said fourth switch, and a second input terminal;

a ninth switch inserted between a connection node connecting the gate of said third transistor and said fifth switch, and said first input terminal; and a tenth switch inserted between a connection node connecting the gate of said fourth transistor and said sixth switch, and said second input terminal, wherein a connection node connecting said third and fourth switches is connected to a connection node connecting said fifth and sixth switches and the common connection node thereof is connected to a connection node connecting the drains of said second and fourth transistors, and wherein a connection node connecting the drains of said first and third transistors is connected to an output terminal.

5. The differential circuit according to claim 4, wherein either said first, third, fourth, ninth, and tenth switches are conductive and said second, fifth, sixth, seventh, and eighth switches are nonconductive, or said first, third, fourth, ninth, and tenth switches are nonconductive state and said second, fifth, sixth, seventh, and eighth switches are conductive.

6. The differential circuit according to claim 4, wherein said first, third, and fourth switches are composed by transistors of first type conductivity, having gates for receiving an inverted signal of a first control signal and being turned on when said first control signal is a first logic value, wherein said second, fifth, and sixth switches are composed by transistors of second type conductivity, having gates for receiving a second control signal and being turned on when said second control signal is the first logic value, wherein said seventh and eighth switches are composed by CMOS (Complementary Metal-Oxide Semiconductor) transfer gates having gates for receiving said second control signal and an inverted signal thereof and being turned on when said second control signal is the first logic value, and wherein said ninth and tenth switches are composed by CMOS transfer gates having gates for receiving said first control signal and an inverted signal thereof and being turned on when said first control signal is the first logic value.

7. The differential circuit according to claim 4, wherein said first and second transistors are composed by p-channel transistors, said third and fourth transistors are composed by n-channel transistors, said first power supply is a high potential power supply, and said second power supply is a low potential power supply, and wherein a conductive state changeover of said first, third, fourth, ninth, and tenth switches and said second, fifth, sixth, seventh, and eighth switches is controlled so that said n-channel transistor pair is a differential pair and said p-channel transistor pair is a current mirror circuit at high-potential voltage stabilized drive time and so that said p-channel transistor pair is the differential pair and said n-channel transistor pair is the current mirror circuit at low-potential voltage stabilized drive time.

8. An amplifier circuit comprising:

a differential circuit as defined in claim 1;

a charging amplification stage for charging an output terminal in response to an output signal from said differential circuit; and a discharging amplification stage for discharging said output terminal in response to the output signal from said differential circuit, wherein said output terminal is fed back to an inverting input terminal of differential input terminals of said differential circuit.

9. The amplifier circuit according to claim 8, further comprising a first reset circuit for controlling the output signal of said differential circuit to control said charging amplification stage in such a way that said charging amplification stage is deactivated for a predetermined period.

10. The amplifier circuit according to claim 8, further comprising a second reset circuit for controlling the output of said differential circuit to control said discharging amplification stage in such a way that said discharging amplification stage is deactivated for a predetermined period.

11. The amplifier circuit according to claim 8, wherein said charging amplification stage comprises:

a fifth transistor, conductivity thereof being a first type, having a gate for receiving an output signal of said differential circuit and a drain connected to said output terminal;

an eleventh switch inserted between the source of said fifth transistor and a first power supply composing a high potential power supply; and a twelfth switch and a third current source connected in series between the drain of said fifth transistor and a second power supply that is a low potential power supply.

12. The amplifier circuit according to claim 8, wherein said discharging amplification stage comprises:

a sixth transistor, conductivity thereof being a second type, having a gate for receiving an output signal of said differential circuit and a drain connected to said output terminal;

a thirteenth switch inserted between the source of said sixth transistor and a second power supply composing a low potential power supply; and a fourteenth switch and a fourth current source connected in series between the drain of said sixth transistor and a first power supply that is a high potential power supply.

13. The amplifier circuit according to claim 11, further comprising a first reset circuit including a fifteenth switch inserted between said first power supply and the gate of said fifth transistor.

14. The amplifier circuit according to claim 12, further comprising a second reset circuit including a sixteenth switch inserted between said second power supply and the gate of said sixth transistor.

15. An amplifier circuit comprising:

the differential circuit as defined in claim 1, wherein said differential circuit differentially receives an input terminal voltage and an output terminal voltage;

a charging circuit for charging said output terminal based on an output signal of said differential circuit;

a follower-type discharging circuit comprising:

first bias control means for controlling an output bias voltage in response to the input terminal voltage; and a follower transistor connected between said output terminal and a second power supply composing a low-potential power supply, said follower transistor receiving a bias voltage output from said first bias control means, wherein said follower-type discharging circuit discharges said output terminal by a follower operation of an active device according to a voltage difference between said input terminal voltage and said output terminal voltage;

a discharging circuit for discharging said output terminal based on the output signal of said differential circuit; and a follower-type charging circuit comprising:

second bias control means for controlling an output bias voltage in response to the input terminal voltage; and a follower transistor connected between a first power supply composing a high-potential power supply, and said output terminal, said follower transistor receiving a bias voltage of said second bias control means, wherein said follower-type charging circuit charges said output terminal by a follower operation of an active device according to a voltage difference between said input terminal voltage and said output terminal voltage.

16. An amplifier circuit comprising:

the differential circuit as defined in claim 4, wherein said differential circuit differentially receives an input terminal voltage and an output terminal voltage;

a charging circuit connected between a first power supply, composing a high potential power supply, and said output terminal and that includes a seventh transistor, conductivity thereof being a first type, having a gate for receiving an output signal of said differential circuit;

a follower-type discharging circuit comprising:

a follower-structured eighth transistor, conductivity thereof being a first type, connected between said output terminal and a second power supply composing a low-potential power supply; and a diode-connected ninth transistor, inserted between said input terminal and said low-potential power supply, driven by a fifth constant-current source, and having a gate connected to a gate of said follower-structured eighth transistor, conductivity of said ninth transistor being a first type;

a discharging circuit connected between said low-potential power supply and said output terminal and including a tenth transistor, conductivity thereof being a second type, having a gate for receiving the output signal of said differential circuit; and a follower-type charging circuit comprising:

a follower-structured eleventh transistor connected between said output terminal and a high-potential power supply, conductivity of said eleventh transistor being a second type; and a diode-connected twelfth transistor, inserted between said high-potential power supply and said input terminal, driven by a sixth constant-current source, and having a gate connected to a gate of said follower-structured eleventh transistor, conductivity of said twelfth transistor being a second type.

17. The amplifier circuit according to claim 16, further comprising:

a seventeenth switch inserted between said follower-structured eighth transistor and said low-potential power supply;

an eighteenth switch connected in series with said fifth constant-current source between said ninth transistor and said low-potential power supply;

a nineteenth switch and a seventh constant-current source connected in series between said ninth transistor and said high-potential power supply;

a twentieth switch inserted between said follower-structured eleventh transistor and said high-potential power supply;

a twenty-first switch connected in series with said sixth constant-current source between said twelfth transistor and said high-potential power supply; and a twenty-second switch and an eighth constant-current source connected in series between said twelfth transistor and said low-potential power supply.

18. The amplifier circuit according to claim 16, further comprising:

a thirteenth transistor having a source and a drain connected respectively to a source and a drain of said ninth transistor and having a gate for receiving a predetermined bias voltage, conductivity of said thirteenth transistor being a first type; and a fourteenth transistor having a source and a drain connected respectively to a source and a drain of said twelfth transistor and having a gate receives a predetermined bias voltage.

19. The amplifier circuit according to claim 16, further comprising a first reset circuit including a twenty-third switch inserted between said high-potential power supply and a gate of said seventh transistor.

20. The amplifier circuit according to claim 16, further comprising a second reset circuit including a twenty-fourth switch inserted between said low-potential power supply and a gate of said tenth transistor.

21. The amplifier circuit according to claim 13, wherein said first reset circuit has a twenty-fifth switch inserted between a connection node connecting a gate of said fifth transistor and said fifteenth switch, and the output terminal of said differential circuit.

22. The amplifier circuit according to claim 14, wherein said second reset circuit includes a twenty-sixth switch inserted between a connection node connecting a gate of said sixth transistor and said sixteenth switch, and the output terminal of said differential circuit.

23. The amplifier circuit according to claim 13, wherein said first reset circuit has a capacitor connected between a drain and a gate of said fifth transistor.

24. The amplifier circuit according to claim 14, wherein said second reset circuit has a capacitor connected between a drain and a gate of said sixth transistor.

25. The amplifier circuit according to claim 13 wherein said fifteenth switch is turned on for a predetermined reset period at a start of a first connection state and, after that, said fifteenth switch is turned off and said eleventh and twelfth switches are turned on to activate said charging amplification stage, said first connection state being a state in which said first, third, fourth, ninth, and tenth switches are turned on and said second, fifth, sixth, seventh, and eighth switches are turned off.

26. The amplifier circuit according to claim 14, wherein said sixteenth switch is turned on for a predetermined reset period at a start of a second connection state and, after that, said sixteenth switch is turned off and said thirteenth and fourteenth switches are turned on to activate said discharging amplification stage, said second connection state being a state in which said first, third, fourth, ninth, and tenth switches are turned off and said second, fifth, sixth, seventh, and eighth switches are turned on.

27. The amplifier circuit according to claim 21, wherein said eleventh and twelfth switches are turned on, said fifteenth switch is turned off, and said twenty-fifth switch is turned on in a first connection state and wherein said eleventh and twelfth switches are turned off, said fifteenth switch is turned on, and said twenty-fifth switch is turned off in a second connection state, said first connection state being a state in which said first, third, fourth, ninth, and tenth switches are turned on and said second, fifth, sixth, seventh, and eighth switches are turned off, said second connection state being a state in which said first, third, fourth, ninth, and tenth switches are turned off and said second, fifth, sixth, seventh, and eighth switches are turned on.

28. The amplifier circuit according to claim 22, wherein said thirteenth and fourteenth switches are turned off, said sixteenth switch is turned on, and said twenty-sixth switch is turned off in a first connection state and wherein said thirteenth and fourteenth switches are turned on, said sixteenth switch is turned off, and said twenty-sixth switch is turned on in a second connection state, said first connection state being a state in which said first, third, fourth, ninth, and tenth switches are conductive and said second, fifth, sixth, seventh, and eighth switches are nonconductive, said second connection state being a state in which said first, third, fourth, ninth, and tenth switches are nonconductive and said second, fifth, sixth, seventh, and eighth switches are conductive.

29. The amplifier circuit according to claim 27, wherein said eleventh switch is removed and a source of said fifth transistor is connected directly to said first power supply that is a high-potential power supply.

30. The amplifier circuit according to claim 28, wherein said sixteenth switch is removed and a source of said sixth transistor is connected directly to said second power supply that is a low-potential power supply.

31. A display device having a driver circuit that drives data lines of the differential circuit as defined in claim 8.

32. The differential circuit according to claim 2, wherein said first pair of transistors are composed by a pair of p-channel transistors, said second pair of transistors are composed by a pair of n-channel transistors, said first power supply is a high potential power supply, and said second power supply is a low potential power supply, and wherein said connection changeover means controls changeover so that said pair of n-channel transistors compose the differential pair and said pair of p-channel transistors compose the current mirror circuit at high-potential voltage drive time and so that said pair of p-channel transistors compose the differential pair and said pair of n-channel transistors compose the current mirror circuit at low-potential voltage drive time.

33. An amplifier circuit comprising:

a differential circuit as defined in claim 2;

a charging amplification stage for charging an output terminal in response to an output signal from said differential circuit; and a discharging amplification stage for discharging said output terminal in response to the output signal from said differential circuit, wherein said output terminal is fed back to an inverting input terminal of differential input terminals of said differential circuit.

34. An amplifier circuit comprising:

a differential circuit as defined in claim 4;

a charging amplification stage for charging an output terminal in response to an output signal from said differential circuit; and a discharging amplification stage for discharging said output terminal in response to the output signal from said differential circuit, wherein said output terminal is fed back to an inverting input terminal of differential input terminals of said differential circuit.

35. An amplifier circuit comprising:

the differential circuit as defined in claim 2, wherein said differential circuit differentially receives an input terminal voltage and an output terminal voltage;

a charging circuit for charging said output terminal based on an output signal of said differential circuit;

a follower-type discharging circuit comprising:

first bias control means for controlling an output bias voltage in response to the input terminal voltage; and a follower transistor connected between said output terminal and a second power supply composing a low-potential power supply, said follower transistor receiving a bias voltage output from said first bias control means, wherein said follower-type discharging circuit discharges said output terminal by a follower operation of an active device according to a voltage difference between said input terminal voltage and said output terminal voltage;

a discharging circuit for discharging said output terminal based on the output signal of said differential circuit; and a follower-type charging circuit comprising:

second bias control means for controlling an output bias voltage in response to the input terminal voltage; and a follower transistor connected between a first power supply composing a high-potential power supply, and said output terminal, said follower transistor receiving a bias voltage of said second bias control means, wherein said follower-type charging circuit charges said output terminal by a follower operation of an active device according to a voltage difference between said input terminal voltage and said output terminal voltage.

36. An amplifier circuit comprising:

the differential circuit as defined in claim 4, wherein said differential circuit differentially receives an input terminal voltage and an output terminal voltage;

a charging circuit for charging said output terminal based on an output signal of said differential circuit;

a follower-type discharging circuit comprising:

first bias control means for controlling an output bias voltage in response to the input terminal voltage; and a follower transistor connected between said output terminal and a second power supply composing a low-potential power supply, said follower transistor receiving a bias voltage output from said first bias control means, wherein said follower-type discharging circuit discharges said output terminal by a follower operation of an active device according to a voltage difference between said input terminal voltage and said output terminal voltage;

a discharging circuit for discharging said output terminal based on the output signal of said differential circuit; and a follower-type charging circuit comprising:

second bias control means for controlling an output bias voltage in response to the input terminal voltage; and a follower transistor connected between a first power supply composing a high-potential power supply, and said output terminal, said follower transistor receiving a bias voltage of said second bias control means, wherein said follower-type charging circuit charges said output terminal by a follower operation of an active device according to a voltage difference between said input terminal voltage and said output terminal voltage.

* * * * *